United States Patent
Inoue et al.

(10) Patent No.: US 11,937,007 B2
(45) Date of Patent: Mar. 19, 2024

(54) IMAGING DEVICE, OPERATION METHOD THEREOF, AND ELECTRONIC DEVICE

(71) Applicant: Semiconductor Energy Laboratory Co., Ltd., Atsugi (JP)

(72) Inventors: Hiroki Inoue, Atsugi (JP); Seiichi Yoneda, Isehara (JP); Yusuke Negoro, Kaizuka (JP); Takahiko Ishizu, Sagamihara (JP); Hidetomo Kobayashi, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 235 days.

(21) Appl. No.: 17/628,293

(22) PCT Filed: Jul. 13, 2020

(86) PCT No.: PCT/IB2020/056539
§ 371 (c)(1),
(2) Date: Jan. 19, 2022

(87) PCT Pub. No.: WO2021/019333
PCT Pub. Date: Feb. 4, 2021

(65) Prior Publication Data
US 2022/0264046 A1 Aug. 18, 2022

(30) Foreign Application Priority Data
Jul. 26, 2019 (JP) .................. 2019-137635

(51) Int. Cl.
*H04N 25/77* (2023.01)
*H01L 27/146* (2006.01)
(Continued)

(52) U.S. Cl.
CPC ............ *H04N 25/77* (2023.01); *H04N 25/50* (2023.01); *H01L 27/14645* (2013.01);
(Continued)

(58) Field of Classification Search
CPC ........ H04N 25/77; H04N 25/50; H04N 25/75; H04N 25/79; H04N 25/46;
(Continued)

(56) References Cited

U.S. PATENT DOCUMENTS 8,378,391 B2   2/2013 Koyama et al.
9,131,171 B2   9/2015 Aoki et al.
(Continued)

FOREIGN PATENT DOCUMENTS

CN    110651468 A    1/2020
JP    2003-009131 A   1/2003
(Continued)

OTHER PUBLICATIONS

International Search Report (Application No. PCT/IB2020/056539) dated Oct. 13, 2020.
(Continued)

*Primary Examiner* — Gevell V Selby
(74) *Attorney, Agent, or Firm* — Eric J. Robinson; Robinson Intellectual Property Law Office, P.C.

(57) ABSTRACT

An imaging device having a motion detecting function and an image processing function is provided. The imaging device can detect a difference between a reference frame image and a comparative frame image, and can switch from a motion detecting mode to a normal image capturing mode when a significant difference is detected. A low-frame-rate operation in the motion detecting mode can reduce power consumption. Moreover, the imaging device has an image recognition function in combination with the motion detecting function, so that switching from the motion detecting mode to the normal image capturing mode can be performed when a particular image is recognized.

8 Claims, 35 Drawing Sheets

(51) Int. Cl.
*H04N 25/50* (2023.01)
*H04N 25/75* (2023.01)
*H10B 12/00* (2023.01)
*H10K 39/32* (2023.01)

(52) U.S. Cl.
CPC .............. *H04N 25/75* (2023.01); *H10B 12/00* (2023.02); *H10K 39/32* (2023.02)

(58) Field of Classification Search
CPC ........... H01L 27/14645; H01L 27/1207; H01L 27/14621; H01L 27/14634; H01L 27/14636; H01L 27/14612; H01L 21/3205; H01L 21/768; H01L 23/522; H01L 27/146; H01L 29/786; H01L 27/14609; H01L 27/14665; H10B 12/00; H10K 39/32; G06N 3/048; G06N 3/065
See application file for complete search history.

(56) References Cited

U.S. PATENT DOCUMENTS

| | | | |
|---|---|---|---|
| 9,773,832 | B2 | 9/2017 | Kurokawa |
| 10,027,896 | B2 | 7/2018 | Ikeda |
| 11,101,302 | B2 | 8/2021 | Ikeda et al. |
| 2007/0206238 | A1* | 9/2007 | Kawai .................. H04N 25/713 |
| | | | 348/E3.021 |
| 2010/0142811 | A1* | 6/2010 | Okamoto ............. H04N 19/182 |
| | | | 382/166 |
| 2019/0049371 | A1* | 2/2019 | Asano .................... G01M 3/04 |
| 2021/0384239 | A1 | 12/2021 | Ikeda et al. |

FOREIGN PATENT DOCUMENTS

| | | |
|---|---|---|
| JP | 2007-318262 A | 12/2007 |
| JP | 2011-119711 A | 6/2011 |
| JP | 2016-123087 A | 7/2016 |
| KR | 2020-0012917 A | 2/2020 |
| WO | WO-2018/215882 | 11/2018 |

OTHER PUBLICATIONS

Written Opinion (Application No. PCT/IB2020/056539) dated Oct. 13, 2020.

Kumagai.O et al., "A 1/4-inch 3.9Mpixel Low-Power Event-Driven Back-Illuminated Stacked CMOS Image Sensor", ISSCC 2018 (Digest of Technical Papers. IEEE International Solid-State Circuits Conference), Feb. 11, 2018, pp. 86-87.

Yoneda.S et al., "Image Sensor Capable of Analog Convolution for Real-time Image Recognition System Using Crystalline Oxide Semiconductor FET", IISW 2019 (International Image Sensor Workshop), Jun. 23, 2019, p. 4pages.

Ohmaru.T et al., "25.3 µW at 60fps 240x160-Pixel Vision Sensor for Motion Capturing with In-Pixel Non-Volatile Analog Memory Using Crystalline Oxide Semiconductor FET", ISSCC 2015 (Digest of Technical Papers. IEEE International Solid-State Circuits Conference), Feb. 23, 2015, pp. 118-120.

* cited by examiner $a = x_1 w_1 + x_2 w_2 + b$

FIG. 24A1
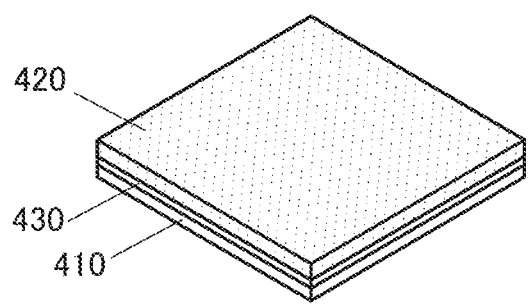
FIG. 24B1
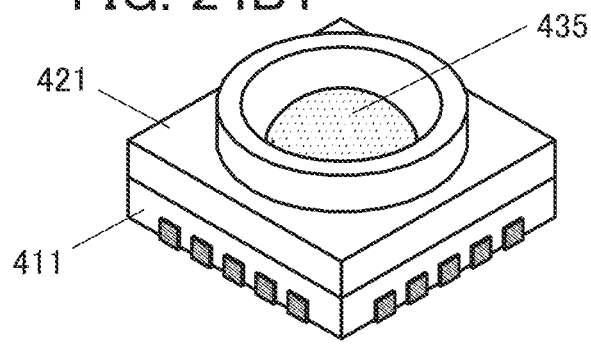
FIG. 24A2
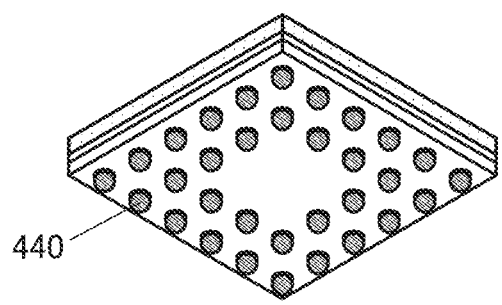
FIG. 24B2
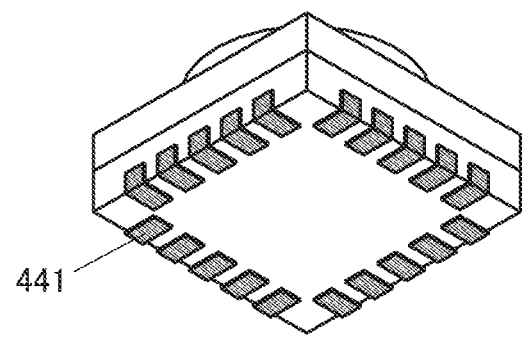
FIG. 24A3
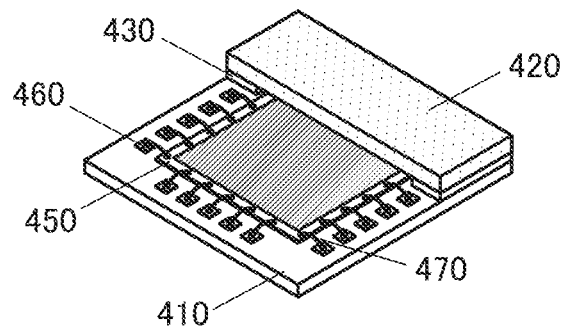
FIG. 24B3
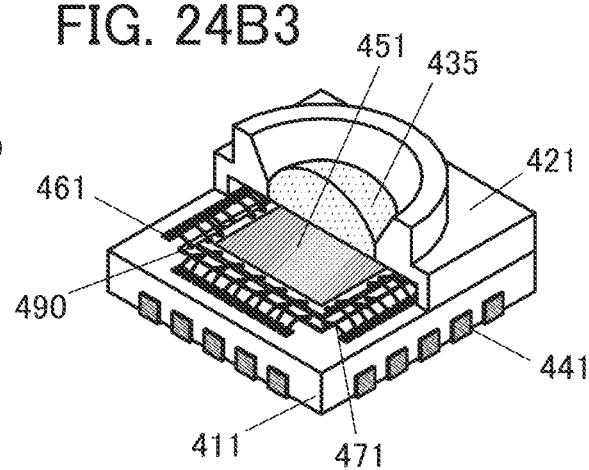

FIG. 25A
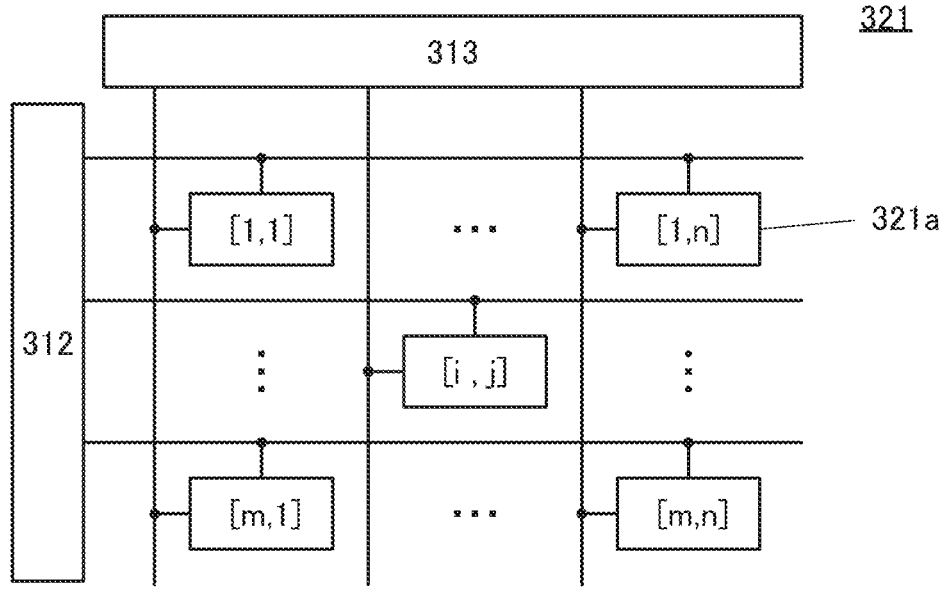
FIG. 25B 321aA
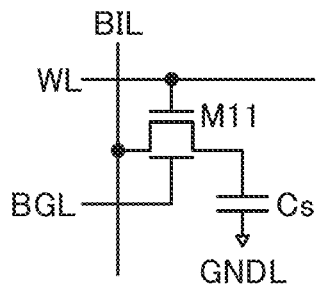
FIG. 25C 321aB
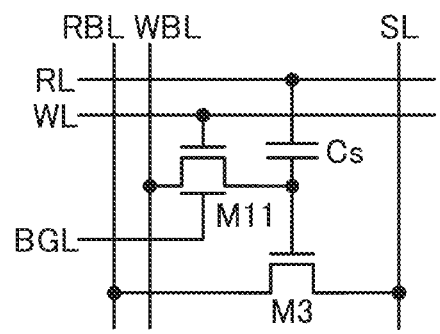
FIG. 25D 321aC
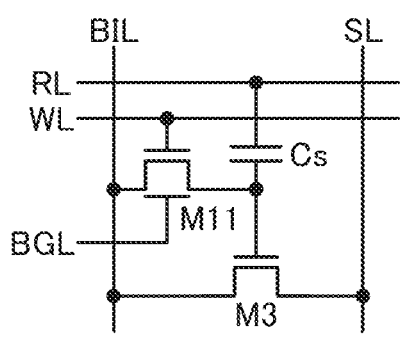
FIG. 25E 321aD
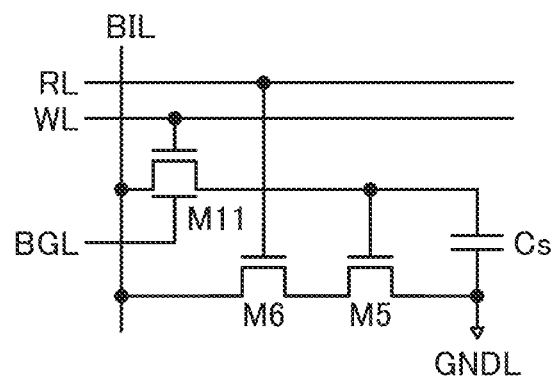

1

IMAGING DEVICE, OPERATION METHOD THEREOF, AND ELECTRONIC DEVICE

TECHNICAL FIELD

One embodiment of the present invention relates to an imaging device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, an operation method thereof, and a manufacturing method thereof.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

BACKGROUND ART

A technique for forming a transistor using an oxide semiconductor thin film formed over a substrate has attracted attention. For example, an imaging device with a structure in which a transistor including an oxide semiconductor and having an extremely low off-state current is used in a pixel circuit is disclosed in Patent Document 1.

A technique which adds an arithmetic function to an imaging device is disclosed in Patent Document 2.

REFERENCES

Patent Documents

[Patent Document 1] Japanese Published Patent Application No. 2011-119711
[Patent Document 2] Japanese Published Patent Application No. 2016-123087

SUMMARY OF THE INVENTION

Problems to be Solved by the Invention

With the technological development, a high-quality image can be easily captured by an imaging device provided with a solid-state imaging element such as a CMOS image sensor. In the next generation, an imaging device is required to be equipped with more intelligent functions.

In the present image data compression, image recognition, or the like, image data (analog data) is converted into digital data, taken out, and then subjected to processing. If the processing can be carried out in the imaging device, higher-speed communication with an external device is achieved, improving user's convenience. Furthermore, load and power consumption of a peripheral device or the like can be reduced. Moreover, if complicated data processing is performed in an analog data state, time required for data conversion can be shortened.

A surveillance camera and the like are always in operation and thus consume high power. The power consumption can be significantly reduced by, for example, simplifying the operation when an event does not occur and transferring the operation to a normal image capturing operation when an event occurs. When an event does not occur, the power consumption is preferably reduced also by power gating.

Thus, an object of one embodiment of the present invention is to provide an imaging device capable of image processing. Another object is to provide an imaging device capable of detecting a change in an object. Another object is to provide an imaging device with low power consumption. Another object is to provide a small imaging device. Another object is to provide an imaging device with high reliability. Another object is to provide a novel imaging device or the like. Another object is to provide a method for operating the above imaging device. Another object is to provide a novel semiconductor device or the like.

Note that the description of these objects does not preclude the existence of other objects. One embodiment of the present invention does not have to achieve all these objects. Other objects are apparent from the description of the specification, the drawings, the claims, and the like, and other objects can be derived from the description of the specification, the drawings, the claims, and the like.

Means for Solving the Problems

One embodiment of the present invention relates to an imaging device that operates with low power consumption and has a motion detecting function and an image processing function. Another embodiment of the present invention relates to an operation method thereof.

One embodiment of the present invention is an imaging device including a pixel, a first circuit, and a second circuit, the first circuit has a function of supplying a first potential to the pixel, the pixel has a function of obtaining first data and second data, the pixel has a function of generating third data that is a difference between the first data and the second data, the pixel has a function of generating fourth data by adding a potential based on the first potential to the third data, and the second circuit has a function of generating fifth data corresponding to a difference between the third data and the fourth data each of which is output from the pixel.

Another embodiment of the present invention is an imaging device including a pixel block, a first circuit, and a second circuit, the pixel block includes a plurality of pixels arranged in a matrix, the first circuit has a function of supplying a first potential to the pixels, the pixels each have a function of obtaining first data and second data, the pixels each have a function of generating third data that is a difference between the first data and the second data, the pixels each have a function of generating fourth data by adding a potential based on the first potential to the third data, and the second circuit has a function of generating fifth data corresponding to a difference between a sum of the third data output from the plurality of pixels in the pixel block and a sum of the fourth data output from the plurality of pixels in the pixel block.

The pixel includes a photoelectric conversion device, a first transistor, a second transistor, a third transistor, a fourth transistor, a fifth transistor, a sixth transistor, a first capacitor, and a second capacitor, one electrode of the photoelectric conversion device is electrically connected to one of a source and a drain of the first transistor, the other of the source and the drain of the first transistor is electrically connected to one of a source and a drain of the second transistor and one electrode of the first capacitor, the other electrode of the first capacitor is electrically connected to one of a source and a drain of the third transistor, one electrode of the second capacitor, and a gate of the fourth transistor, one of a source and a drain of the fourth transistor is electrically connected to one of a source and a drain of the fifth transistor, the other electrode of the second capacitor is electrically connected to one of a source and a drain of the sixth transistor, the other of the source and the drain of the fifth transistor is electrically connected to the second circuit, and the other of the source and the drain of the sixth transistor can be electrically connected to the first circuit.

As the second circuit, a correlated double sampling circuit can be used.

It is preferable that the transistors included in the pixel each include a metal oxide in a channel formation region, and the metal oxide contain In, Zn, and M (M is one or more of Al, Ti, Ga, Ge, Sn, Y, Zr, La, Ce, Nd, and Hf).

Another embodiment of the present invention is a method for operating an imaging device, in which a first step of starting an image capturing operation at a first frame rate, a second step of capturing and storing a reference image, a third step of capturing a comparative image, a fourth step of obtaining data on a difference between the reference image and the comparative image, a fifth step of extracting a second feature value from the difference data, and a sixth step of comparing a first feature value set in advance with the second feature value are performed in this order. The image capturing operation is performed at a second frame rate switched from the first frame rate when the first feature value is detected from the second feature value, and a process returns to the third step when the first feature value is not detected from the second feature value.

The second frame rate is preferably higher than the first frame rate. For example, it is preferable that the first frame rate be higher than or equal to 0.1 fps and lower than or equal to 10 fps, and the second frame rate be higher than or equal to 15 fps and lower than or equal to 240 fps.

Power gating may be performed while the image capturing operation is performed at the first frame rate.

Effect of the Invention

With one embodiment of the present invention, an imaging device capable of image processing can be provided. An imaging device capable of detecting a change in an object can be provided. An imaging device with low power consumption can be provided. A small imaging device can be provided. An imaging device with high reliability can be provided. A novel imaging device or the like can be provided. A method for operating the above imaging device can be provided. A novel semiconductor device or the like can be provided.

BRIEF DESCRIPTION OF THE DRAWINGS

FIG. 24A1 to FIG. 24A3 and FIG. 24B1 to FIG. 24B3 are perspective views of a package and a module in each of which an imaging device is placed.
FIG. 25A is a block diagram illustrating a memory circuit.
FIG. 25B to FIG. 25E are circuit diagrams illustrating memory cells.

MODE FOR CARRYING OUT THE INVENTION

Figure 1:
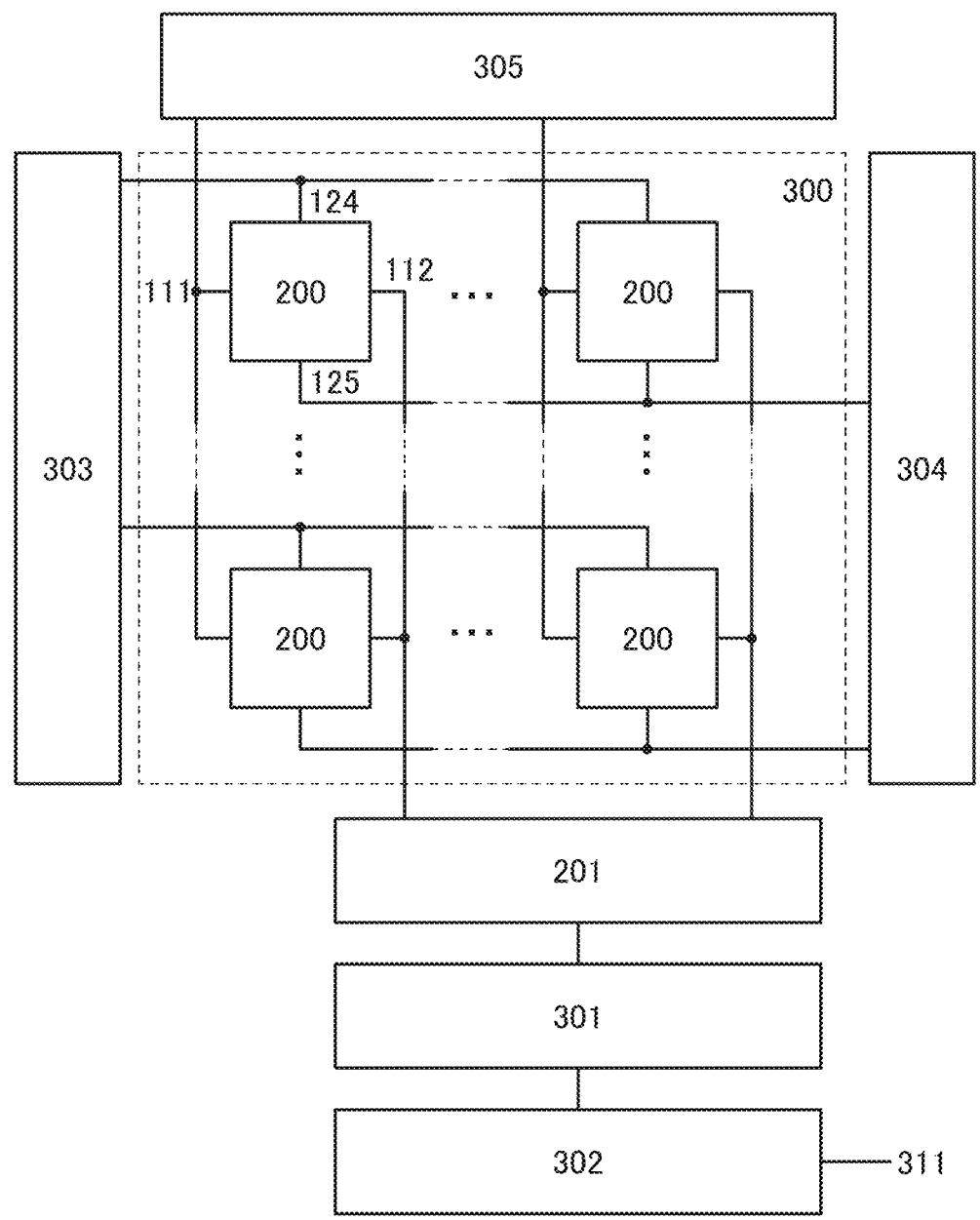
FIG. 1 is a block diagram illustrating an imaging device.

Embodiments are described in detail with reference to the drawings. However, the present invention is not limited to the following description, and it is readily appreciated by those skilled in the art that modes and details can be modified in various ways without departing from the spirit and the scope of the present invention. Therefore, the present invention should not be interpreted as being limited to the description of embodiments below. Note that in structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

Even in the case where a single component is illustrated in a circuit diagram, the component may be composed of a plurality of parts as long as there is no functional inconvenience. For example, in some cases, a plurality of transistors that operate as a switch are connected in series or in parallel. In some cases, capacitors are divided and arranged in a plurality of positions.

One conductor has a plurality of functions such as a wiring, an electrode, and a terminal in some cases. In this specification, a plurality of names are used for the same component in some cases. Even in the case where elements are illustrated in a circuit diagram as if they were directly connected to each other, the elements may actually be connected to each other through one conductor or a plurality of conductors. In this specification, even such a structure is included in direct connection.

Embodiment 1

In this embodiment, an imaging device of one embodiment of the present invention will be described with reference to drawings.

One embodiment of the present invention is an imaging device having an additional function such as image recognition. The imaging device can retain analog data (image data) obtained by an image capturing operation in a pixel and extract data obtained by multiplying the analog data by a predetermined weight coefficient.

When the data is taken in a neural network or the like, processing such as image recognition can be performed. Since enormous volumes of image data can be retained in pixels in the state of analog data, processing can be performed efficiently.

The imaging device of one embodiment of the present invention has a motion detecting function. The imaging device can detect a difference between a reference frame image and a comparative frame image, and can switch from a motion detecting mode to a normal image capturing mode when a significant difference is detected. In the motion detecting mode, power consumption can be reduced by a low-frame-rate operation. In the normal image capturing mode, a high-frame-rate operation enables high-quality image data to be obtained.

The imaging device of one embodiment of the present invention has the above-mentioned image recognition function and the motion detecting function in combination and thus can switch from the motion detecting mode to the normal image capturing mode when a particular image is recognized. Hence, for example, the imaging device can differentiate a human, an animal, a plant, and the like and can deal with defective products, aging variation, and an accident such as a natural disaster.

<Imaging Device>

FIG. 1 is a block diagram illustrating the imaging device of one embodiment of the present invention. The imaging device includes a pixel array 300, a circuit 201, a circuit 301, a circuit 302, a circuit 303, a circuit 304, and a circuit 305. Note that the structures of the circuit 201 and the circuit 301 to the circuit 305 are not limited to single circuits and may each consist of a plurality of circuits. Furthermore, any of two or more of the circuits described above may be combined. Moreover, a circuit other than the above circuits may be connected.

The pixel array 300 has an image capturing function and an arithmetic function. The circuits 201 and 301 each have an arithmetic function. The circuit 302 has an arithmetic function or a data conversion function. The circuits 303 and 304 each have a selection function. The circuit 305 has a function of supplying a potential for a product-sum operation to a pixel. As a circuit having a selection function, a shift register, a decoder, or the like can be used. Note that the circuits 301 and 302 may be provided outside.

Figure 2:
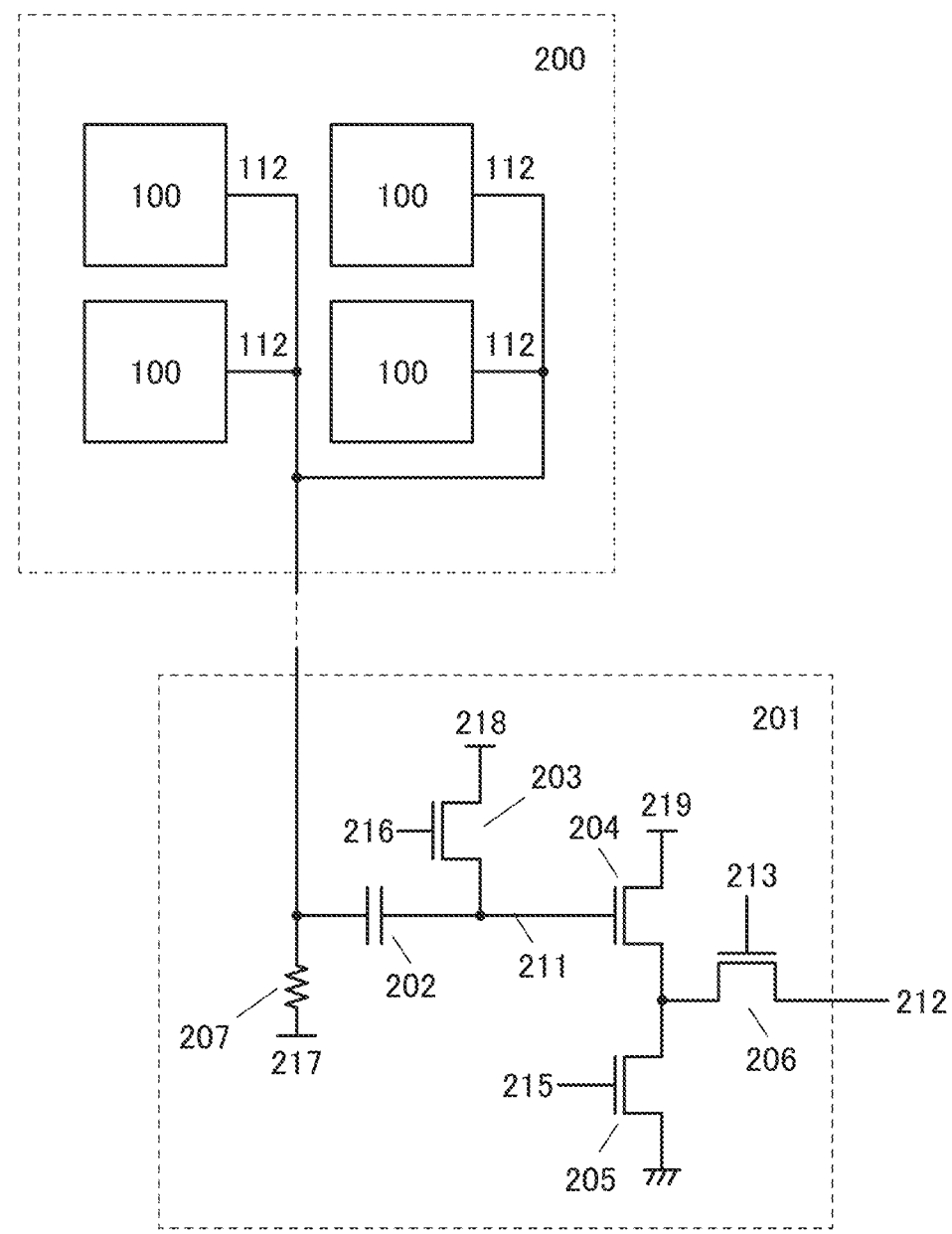
FIG. 2 is a diagram illustrating a pixel block 200 and a circuit 201.

The pixel array 300 includes a plurality of pixel blocks 200. As illustrated in FIG. 2, the pixel block 200 includes a plurality of pixels 100 arranged in a matrix, and each of the pixels 100 is electrically connected to the circuit 201. Note that the circuit 201 can also be provided in the pixel block 200.

The pixels 100 can generate image data and data obtained by adding a weight coefficient to the image data. Note that the number of pixels included in the pixel block 200 is 2×2 in an example illustrated in FIG. 2 but is not limited to this. For example, the number of pixels can be 3×3, 4×4, or the like. Alternatively, the number of pixels in the horizontal direction and the number of pixels in the vertical direction may differ from each other. Furthermore, some pixels may be shared by adjacent pixel blocks.

The pixel block 200 operates as a product-sum operation circuit. The circuit 201 electrically connected to the pixel block 200 has a function of extracting the products of image data and weight coefficients from the pixels 100.

<Pixel Circuit>

Figure 3A:
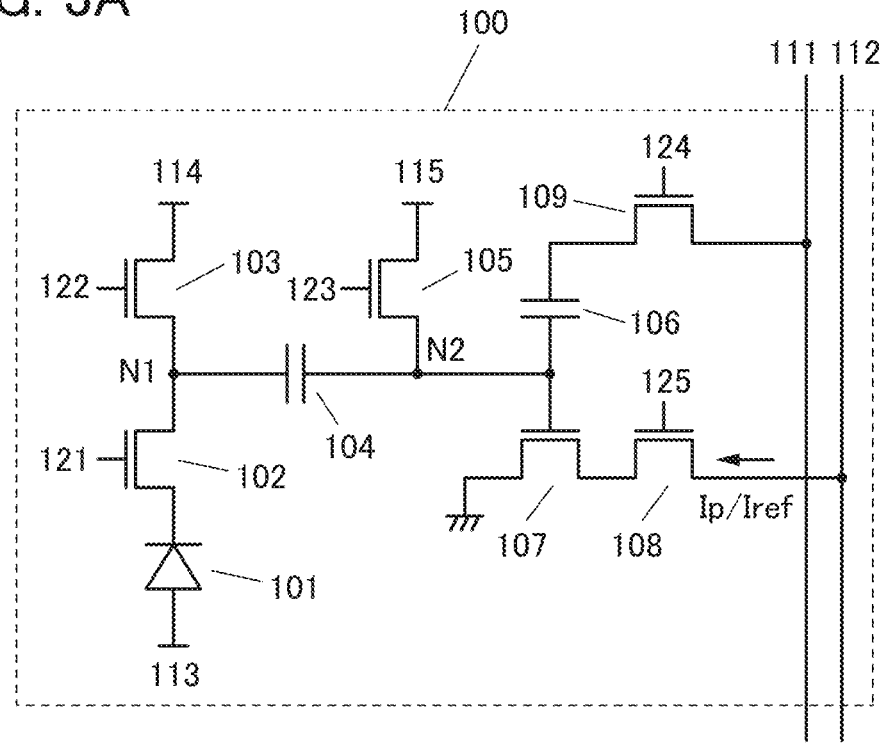
FIG. 3A and FIG. 3B are diagrams illustrating a pixel 100.

As illustrated in FIG. 3A, the pixel 100 can include a photoelectric conversion device 101, a transistor 102, a transistor 103, a capacitor 104, a transistor 105, a capacitor 106, a transistor 107, a transistor 108, and a transistor 109.

One electrode of the photoelectric conversion device 101 is electrically connected to one of a source and a drain of the transistor 102. The other of the source and the drain of the transistor 102 is electrically connected to one of a source and a drain of the transistor 103 and one electrode of the capacitor 104. The other electrode of the capacitor 104 is electrically connected to one of a source and a drain of the transistor 105, one electrode of the capacitor 106, and a gate of the transistor 107. One of a source and a drain of the transistor 107 is electrically connected to one of a source and a drain of the transistor 108. The other electrode of the capacitor 106 is electrically connected to one of a source and a drain of the transistor 109.

The other electrode of the photoelectric conversion device 101 is electrically connected to a wiring 113. The other of the source and the drain of the transistor 103 is electrically connected to a wiring 114. The other of the source and the drain of the transistor 105 is electrically connected to a wiring 115. The other of the source and the drain of the transistor 107 is electrically connected to a GND wiring or the like. The other of the source and the drain of the transistor 108 is electrically connected to a wiring 112. The other of the source and the drain of the transistor 109 is electrically connected to a wiring 111.

A gate of the transistor 102 is electrically connected to a wiring 121. A gate of the transistor 103 is electrically connected to a wiring 122. A gate of the transistor 105 is electrically connected to a wiring 123. A gate of the transistor 108 is electrically connected to a wiring 125. A gate of the transistor 109 is electrically connected to a wiring 124.

Here, a point (wiring) where the other of the source and the drain of the transistor 102, the other of the source and the drain of the transistor 103, and the one electrode of the capacitor 104 are electrically connected is referred to as a node N1. Furthermore, a point (wiring) where the other electrode of the capacitor 104, the one of the source and the drain of the transistor 105, the one electrode of the capacitor 106, and the gate of the transistor 107 are electrically connected is referred to as a node N2.

The wirings 113, 114, and 115 can each have a function of a power supply line. For example, the wirings 114 and 115 can each function as a high potential power supply line, and the wiring 113 can function as a low potential power supply line. The wirings 121, 122, 123, 124, and 125 can function as signal lines that control the conduction of the respective transistors. The wiring 111 can function as a wiring for supplying a potential corresponding to a weight coefficient to the pixel 100. The wiring 112 can function as a wiring that electrically connects the pixel 100 and the circuit 201.

Note that an amplifier circuit or a gain control circuit may be electrically connected to the wiring 112.

As the photoelectric conversion device 101, a photodiode can be used. There is no limitation on the kind of photodiode, and a Si photodiode containing silicon in a photoelectric conversion layer, an organic photodiode including an organic photoconductive film in a photoelectric conversion layer, or the like can be used. In order to increase the light detection sensitivity under low illuminance conditions, an avalanche photodiode is preferably used.

The transistor 102 can have a function of controlling the potential of the node N1. The transistor 103 can have a function of initializing the potential of the node N1. The transistor 105 can have a function of initializing the potential of the node N2. The transistor 107 can have a function of controlling current fed by the circuit 201 in accordance with the potential of the node N2. The transistor 108 can have a function of selecting a pixel. The transistor 109 can have a function of supplying the potential corresponding to the weight coefficient to the node N2.

Figure 3B:
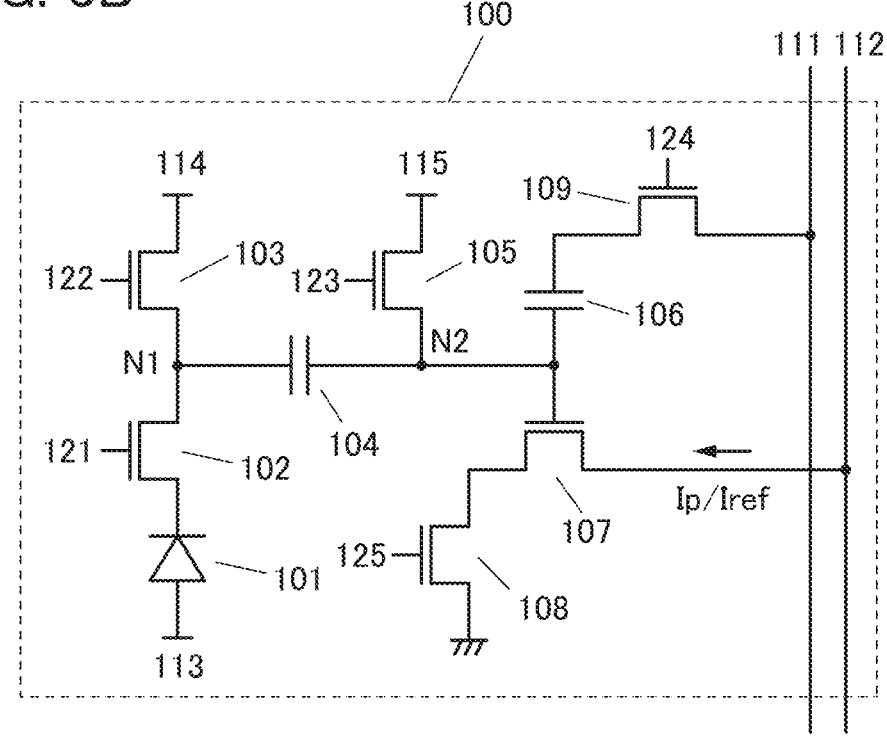

Note that as illustrated in FIG. 3B, the transistor 107 and the transistor 108 may be arranged such that the one of the source and the drain of the transistor 107 is electrically connected to the one of the source and the drain of the transistor 108, the other of the source and the drain of the transistor 107 is connected to the wiring 112, and the other of the source and the drain of the transistor 108 is electrically connected to a GND wiring or the like.

Figure 4A:
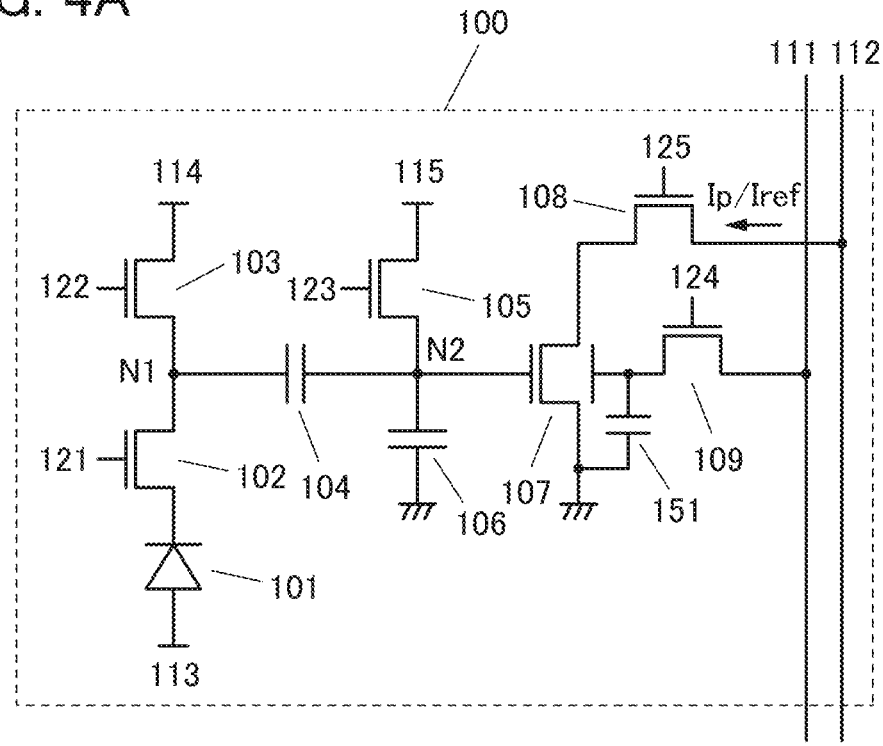
FIG. 4A and FIG. 4B are diagrams illustrating the pixel 100.

As illustrated in FIG. 4A, the transistor 107 may include a second gate, and the one of the source and the drain of the transistor 109 may be electrically connected to the second gate. Furthermore, a capacitor 151 whose one electrode is connected to the second gate may be provided. The capacitor 151 functions as a storage capacitor. Note that the capacitor 151 does not necessarily have to be provided.

Figure 4B:
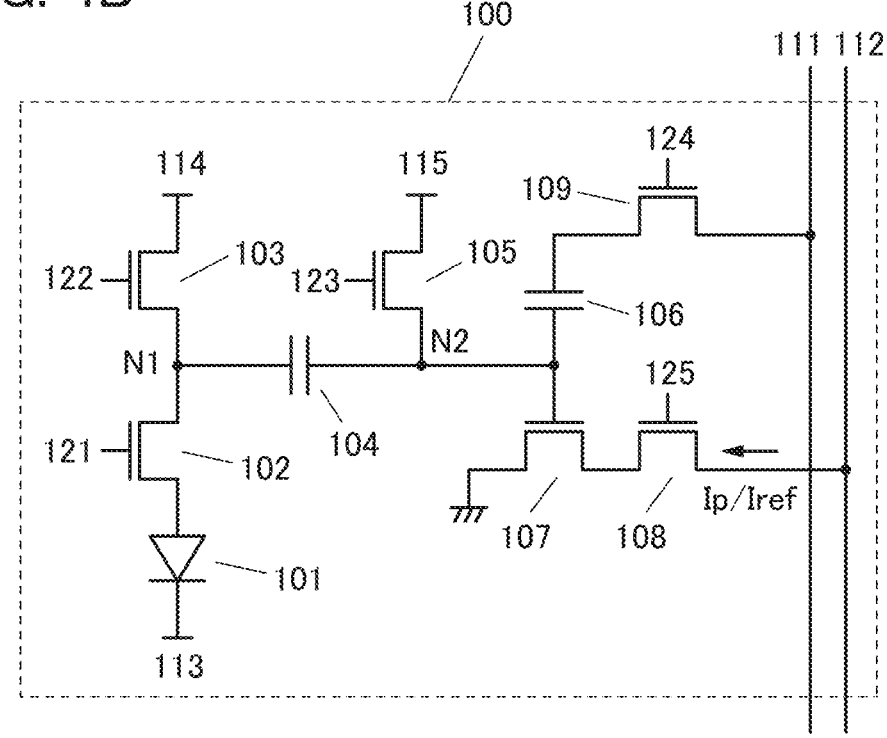

As illustrated in FIG. 4B, the connection direction of the photoelectric conversion device 101 may be reversed. In that case, the wirings 114 and 115 each function as a low potential power supply line and the wiring 113 functions as a high potential power supply line. Note that as in the structure illustrated in FIG. 3B, the one of the source and the drain of the transistor 107 may be electrically connected to the one of the source and the drain of the transistor 108, the other of the source and the drain of the transistor 107 may be connected to the wiring 112, and the other of the source and the drain of the transistor 108 may be electrically connected to a GND wiring or the like.

In the case where an avalanche photodiode is used as the photoelectric conversion device 101, a high voltage is sometimes applied and thus a transistor with a high withstand voltage is preferably used as a transistor connected to the photoelectric conversion device 101. As the transistor with a high withstand voltage, a transistor using a metal oxide in its channel formation region (hereinafter, an OS transistor) or the like can be used, for example. Specifically, an OS transistor is preferably used as the transistor 102.

The OS transistor also has a feature of an extremely low off-state current. When OS transistors are used as the transistors 102, 103, 105, and 109, the charge retention period of the node N1 and the node N2 can be lengthened greatly. Therefore, a global shutter mode in which a charge accumulation operation is performed in all the pixels at the same time can be used without complicating the circuit structure and operation method. Furthermore, while image data is retained at the node N2, an arithmetic operation using the image data can be performed a plurality of times.

Meanwhile, it is sometimes desired that the transistor 107 have excellent amplifying characteristics. A transistor having a high mobility capable of high-speed operation is sometimes preferably used as the transistor 108 because the transistor 108 is repeatedly turned on and off at frequent intervals. Accordingly, transistors using silicon in their channel formation regions (hereinafter, Si transistors) may be used as the transistors 107 and 108.

Note that without limitation to the above, an OS transistor and a Si transistor may be freely used in combination. Alternatively, all the transistors may be OS transistors. Alternatively, all the transistors may be Si transistors. Examples of the Si transistor include a transistor including amorphous silicon and a transistor including crystalline silicon (microcrystalline silicon, low-temperature polysilicon, or single crystal silicon).

The potential of the node N2 in the pixel 100 is determined by capacitive coupling between a potential obtained by capacitive coupling of the amount of change in the potential of the node N1 (image data) to a reset potential supplied from the wiring 115 and a potential corresponding to a weight coefficient supplied from the wiring 111. That is, the gate of the transistor 107 has a potential obtained by adding a given weight coefficient to image data, and current including a product term of the image data and the given weight coefficient flows through the transistor 107.

<Circuit 201>

As illustrated in FIG. 2, the pixels 100 are electrically connected to each other through the wiring 112. The circuit 201 can perform an arithmetic operation using the sum of the currents flowing through the transistors 107 of the pixels 100.

The circuit 201 includes a capacitor 202, a transistor 203, a transistor 204, a transistor 205, a transistor 206, and a resistor 207.

One electrode of the capacitor 202 is electrically connected to one of a source and a drain of the transistor 203. The one of the source and the drain of the transistor 203 is electrically connected to a gate of the transistor 204. One of a source and a drain of the transistor 204 is electrically connected to one of a source and a drain of the transistor 205. The one of the source and the drain of the transistor 205 is electrically connected to one of a source and a drain of the transistor 206. One electrode of the resistor 207 is electrically connected to the other electrode of the capacitor 202.

The other electrode of the capacitor 202 is electrically connected to the wiring 112. The other of the source and the drain of the transistor 203 is electrically connected to a wiring 218. The other of the source and the drain of the transistor 204 is electrically connected to a wiring 219. The other of the source and the drain of the transistor 205 is electrically connected to a reference power supply line such as a GND wiring. The other of the source and the drain of the transistor 206 is electrically connected to a wiring 212. The other electrode of the resistor 207 is electrically connected to a wiring 217.

The wirings 217, 218, and 219 can each have a function of a power supply line. For example, the wiring 218 can have a function of a wiring for supplying a reset potential for a reading operation. The wirings 217 and 219 can function as high potential power supply lines. The wirings 213, 215, and 216 can function as signal lines that control the conduction of the respective transistors. The wiring 212 is an output line and can be electrically connected to the circuit 301 illustrated in FIG. 1, for example.

The transistor 203 can have a function of resetting the potential of the wiring 211 to the potential of the wiring 218. The transistors 204 and 205 can function as source follower circuits. The transistor 206 can have a function of controlling a reading operation. Note that the circuit 201 has a function of a correlated double sampling circuit (CDS circuit), and can be replaced with a circuit with another structure that has the function.

In one embodiment of the present invention, offset components other than the product of image data (X) and the weight coefficient (W) are eliminated and an objective WX is extracted. WX can be calculated using data obtained when image capturing is performed, data obtained when image capturing is not performed, and data obtained by adding weights to the respective data.

The total amount of currents ($I_p$) flowing through the pixels 100 when image capturing is performed is $k\Sigma(X-V_{th})^2$, and the total amount of currents ($I_p$) flowing through the pixels 100 when weights are added is $k\Sigma(W+X-V_{th})^2$. The total amount of currents ($I_{ref}$) flowing through the pixels 100 when image capturing is not performed is $k\Sigma(0-V_{th})^2$, and the total amount of currents ($I_{ref}$) flowing through the pixels 100 when weights are added is $k\Sigma(W-V_{th})^2$. Here, k is a constant and $V_{th}$ is the threshold voltage of the transistor 107.

First, a difference (data A) between the data obtained when image capturing is performed and the data obtained by adding a weight to the data is calculated. The difference is $k\Sigma((X-V_{th})^2-(W+X-V_{th})^2)=k\Sigma(-W^2-2W\cdot X+2W\cdot V_{th})$.

Next, a difference (data B) between the data obtained when image capturing is not performed and the data obtained by adding a weight to the data is calculated. The difference is $k\Sigma((0-V_{th})^2-(W-V_{th})^2)=k\Sigma(-W^2+2W\cdot V_{th})$.

Then, a difference between the data A and the data B is calculated. The difference is $k\Sigma(-W^2-2W\cdot X+2W\cdot V_{th}-(-W^2+2W\cdot V_{th}))=k\Sigma(-2W\cdot X)$. That is, offset components other than the product of the image data (X) and the weight coefficient (W) can be eliminated.

The circuit 201 can read out the data A and the data B. Note that the calculation of the difference between the data A and the data B can be performed by the circuit 301, for example.

The pixel 100 illustrated in each of FIG. 3A, FIG. 3B, FIG. 4A, and FIG. 4B has a normal image capturing function and a motion detecting function. The pixel 100 also has part of a product-sum operation function.

<Normal Image Capturing Mode>

Figure 5:
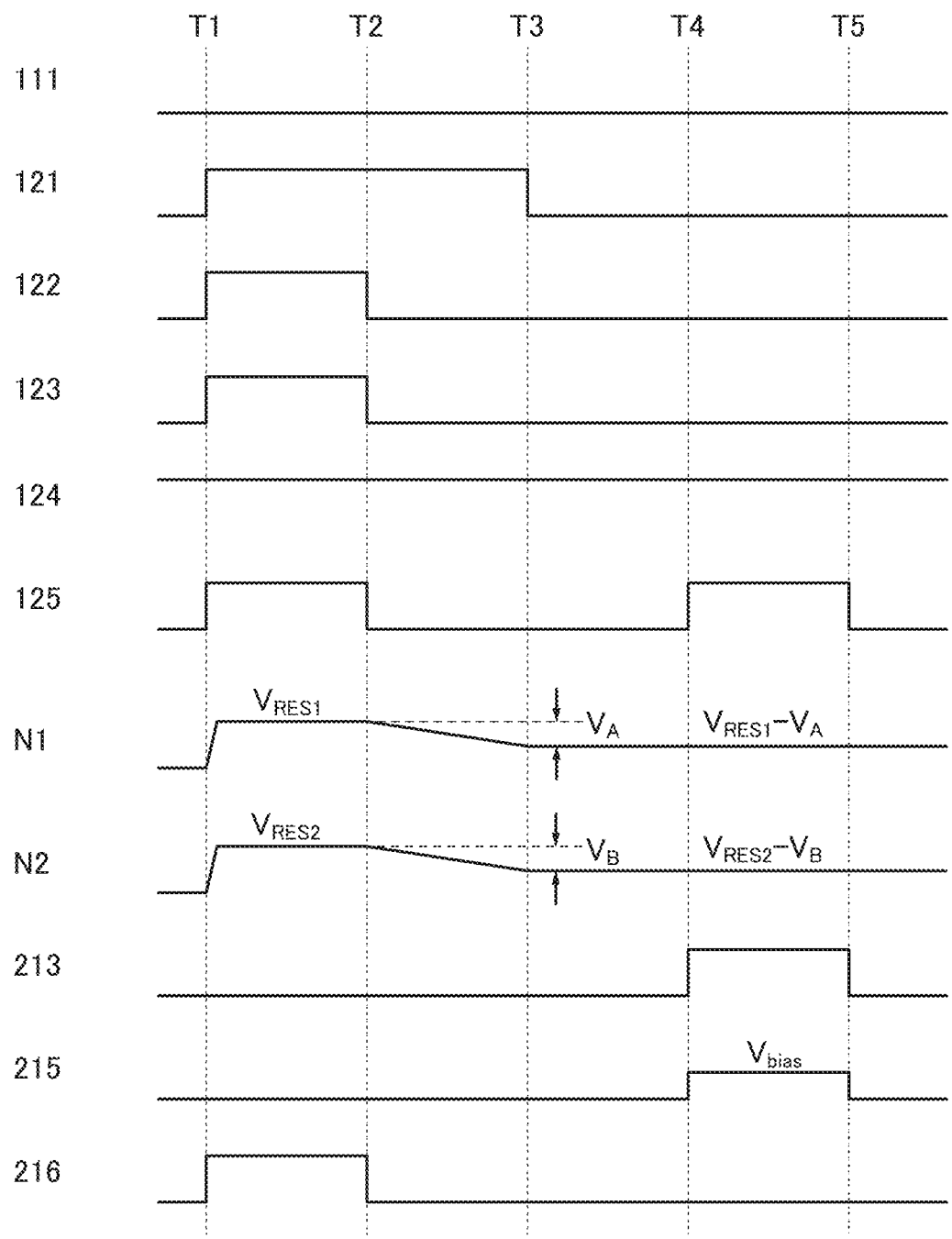
FIG. 5 is a timing chart showing a normal image capturing operation.

First, a normal image capturing mode will be described with reference to a timing chart shown in FIG. 5. Since a product-sum operation is not performed in the normal image capturing mode, it is preferable that the potential of the wiring 111 be always at "L", the potential of the wiring 124 be always at "H", and the potential of the other electrode of the capacitor 106 be fixed. Here, the operation of the pixel 100 with the structure in FIG. 3A or FIG. 3B will be described.

First, at Time T1, the potential of the wiring 121 is set to "H", the potential of the wiring 122 is set to "H", and the potential of the wiring 123 is set to "H", whereby the transistors 102 and 103 are turned on, and the potential of the node Ni becomes a reset potential "$V_{RES1}$" (the potential of the wiring 114). In addition, the transistor 105 is turned on, so that the potential of the node N2 becomes a reset potential "$V_{RES2}$" (the potential of the wiring 115). Note that "$V_{RES1}$" and "$V_{RES2}$" may be the same potential.

Moreover, the potential of the wiring 125 is set to "H" and the potential of the wiring 216 is set to "H", whereby the transistor 203 is turned on and the potential of the wiring 211 becomes a potential "Vr" of the wiring 218 in the circuit 201. That is, an output potential of the pixel 100 in the reset state is initialized to the potential "Vr".

At Time T2, the potential of the wiring 121 is set to "H", the potential of the wiring 122 is set to "L", the potential of the wiring 123 is set to "L", the potential of the wiring 125 is set to "L", and the potential of the wiring 216 is set to "L", so that the transistors 103, 105, and 108 are turned off, and the potential of the node N1 changes to "$V_{RES1}$–VA" by the operation of the photoelectric conversion device 101. Accordingly, the potential of the node N2 changes to "$V_{RES2}$–VB" owing to capacitive coupling of the capacitor 104. Note that when the capacitance of the capacitor 104 is sufficiently larger than the capacitance of the node N2, VA becomes substantially equal to VB. In addition, the transistor 203 is turned off, so that the potential of the wiring 221 is kept at "Vr".

At Time T3, the potential of the wiring 121 is set to "L", whereby the transistor 102 is turned off and the potentials of the node N1 and the node N2 are retained.

At Time T4, the potential of the wiring 125 is set to "H", the potential of the wiring 213 is set to "H", and the potential of the wiring 215 is set to an appropriate analog potential such as "$V_{bias}$", whereby the transistor 108 is turned on, and current corresponding to the potential of the node N2 flows from the wiring 112 to the transistor 107. Here, the potential of the other electrode of the capacitor 202 changes in accordance with the current flowing through the wiring 112, and a change amount Y is added to the potential "Vr" of the wiring 211 by capacitive coupling.

Accordingly, the potential of the wiring 211 becomes "Vr+Y". Here, given that Vr=0, Y is a difference between image data and data at the time of reset (noise). That is, image data without noise components can be obtained.

When the transistors 205 and 206 are turned on, the image data can be output to the wiring 212 by a source follower operation of the transistor 204.

<Motion Detecting Mode>

Figure 6:
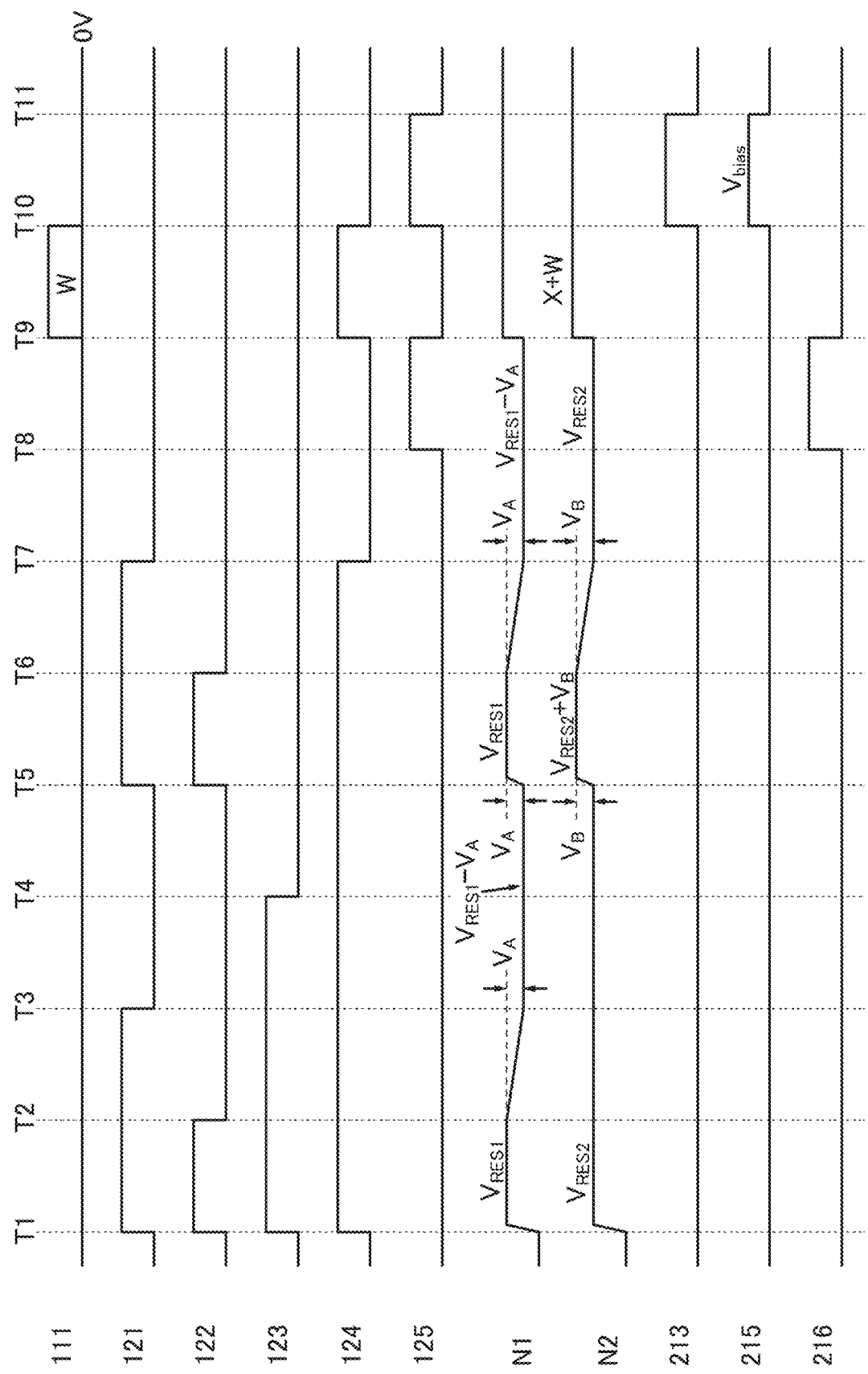
FIG. 6 is a timing chart showing a motion detecting operation (without difference) and a product-sum operation.

Next, a motion detecting function of the pixel 100 and a product-sum operation by the pixel block 200 and the circuit 201 will be described with reference to a timing chart shown in FIG. 6.

First, an operation in the motion detecting mode will be described with reference to the timing chart from Time T1 to T7. Note that FIG. 6 shows the case where there is no difference between a reference image and a comparative image.

Note that a period from Time T1 to T7 is a period for determining the potential of the node N2. A weight (W) will be added to the node N2 later by capacitive coupling of the capacitor 106; thus, the potential of the other electrode of the capacitor 106 is set to a potential corresponding to a weight coefficient of 0 at least during the period. Hence, during the period, the potential of the wiring 111 is set to the potential corresponding to a weight coefficient of 0 (e.g., 0 V) and the potential of the wiring 124 is set to "H".

At Time T1, the potential of the wiring 121 is set to "H", the potential of the wiring 122 is set to "H", and the potential of the wiring 123 is set to "H", whereby the transistors 102 and 103 are turned on, and the potential of the node N1 becomes the reset potential "$V_{RES1}$" (the potential of the wiring 114). In addition, the transistor 105 is turned on, so that the potential of the node N2 becomes the reset potential "$V_{RES2}$" (the potential of the wiring 115). Note that "$V_{RES1}$" and "$V_{RES2}$" may be the same potential.

At Time T2, the potential of the wiring 121 is set to "H", the potential of the wiring 122 is set to "L", and the potential of the wiring 123 is set to "H", so that the transistor 103 is turned off, and the potential of the node N1 changes to "$V_{RES1}-V_A$" by the operation of the photoelectric conversion device 101. At this time, the transistor 105 is on, so that the potential of the node N2 is kept at "$V_{RES2}$".

At Time T3, the potential of the wiring 121 is set to "L", whereby the transistor 102 is turned off and the potential of the node N1 is retained. In addition, the transistor 105 is on, so that the potential of the node N2 is kept at "$V_{RES2}$".

At Time T4, the potential of the wiring 123 is set to "L", whereby the transistor 105 is turned off, and the potential of the node N2 is retained. The operation from Time T1 to T4 corresponds to operations for obtaining and retaining the reference image.

At Time T5, the potential of the wiring 121 is set to "H" and the potential of the wiring 122 is set to "H", whereby the transistors 102 and 103 are turned on, and the potential of the node N1 changes from "$V_{RES1}-V_A$" to "$V_{RES1}$". That is, the potential of the node N1 increases by "$V_A$". At this time, the amount of change in the node N1 is capacitively coupled to the potential of the node N2, and the potential of the node N2 becomes "$V_{RES2}+V_B$". As described above, $V_A$ becomes substantially equal to $V_B$.

At Time T6, the potential of the wiring 121 is set to "H" and the potential of the wiring 122 is set to "L", whereby the transistor 103 is turned off, and the potential of the node N1 changes to "$V_{RES1}-V_A$" by the operation of the photoelectric conversion device 101. A change amount "$-V_A$" in the node N1 is capacitively coupled to the node N2; thus, the potential of the node N2 becomes "$V_{RES2}$".

At Time T7, the potential of the wiring 121 is set to "L", whereby the transistor 102 is turned off, and the potentials of the node N1 and the node N2 are retained. The operation from Time T5 to T7 corresponds to operations for obtaining and retaining the comparative image.

That is, in the case where there is no difference between the reference image and the comparative image, the potential of the node N1 becomes equal to the potential of the reference image that has been retained before Time T5. The potential of the node N2 is a reset potential, which means that there is no difference between the reference image and the comparative image.

Figure 7:
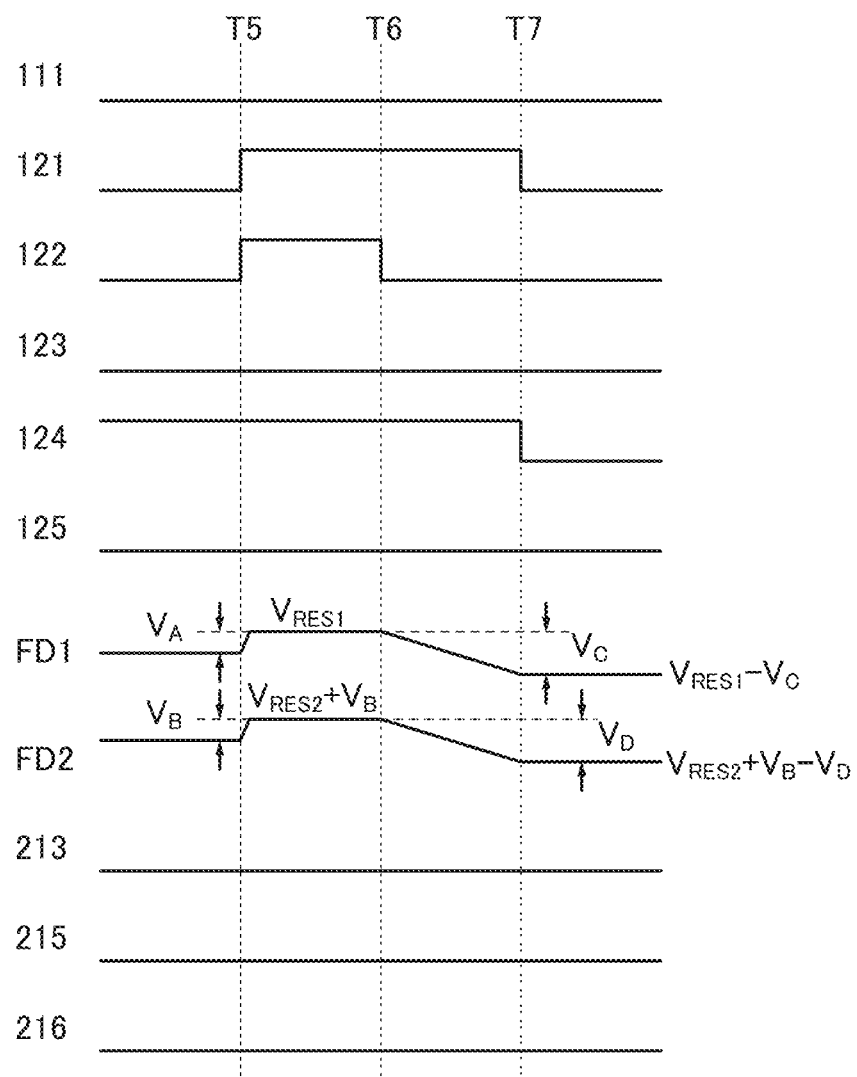
FIG. 7 is a timing chart showing a motion detecting operation (with difference).

Note that in the case where there is a difference between the reference image and the comparative image, the potential of the node N1 becomes "$V_{RES1}-V_C$" and the potential of the node N2 becomes "$V_{RES2}+V_B-V_D$" at Time T7, as shown in a timing chart in FIG. 7. Here, "$V_C$" is a value that differs from "$V_A$", and "$V_D$" is a value that differs from "$V_B$". That is, the potential of the node N2 is different from a reset potential, which means that there is a difference between the reference image and the comparative image.

Next, a product-sum operation will be described with reference to the timing chart of FIG. 6 from Time T8 to T11. First, an operation for calculating the difference (data A) between the data obtained when image capturing is performed and the data obtained by adding a weight to the data will be described. Note that whether there is a difference between the reference image and the comparative image does not influence the product-sum operation described here.

At Time T8, the potential of the wiring 125 is set to "H" and the potential of the wiring 216 is set to "H", whereby the transistor 203 is turned on and the potential of the wiring 211 becomes the potential "Vr" of the wiring 218 in the circuit 201. That is, the output potential of the pixel 100 in the reset state is initialized to "Vr". The operation up to Time T7 corresponds to obtaining the data obtained when image capturing is performed, and the data is represented by the potential "Vr" of the wiring 211.

At Time T9, the potential of the wiring 111 is set to a potential corresponding to a weight coefficient W, the potential of the wiring 124 is set to "H", the potential of the wiring 125 is set to "L", and the potential of the wiring 216 is set to "L", whereby the transistor 109 is turned on and the potential of the other electrode of the capacitor 106 changes from "0" to "W". Thus, the difference "W" is added to the node N2. That is, when the potential of the node N2 is determined to be "X" by the image data capturing operation, the potential of the node N2 to which the weight coefficient W is added becomes "X+W".

At Time T10, the potential of the wiring 124 is set to "L", the potential of the wiring 125 is set to "H", the potential of the wiring 213 is set to "H", and the potential of the wiring 215 is set to "H", whereby the potential of the other electrode of the capacitor 106 and the potential of the node N2 are retained, the transistor 108 is turned on, and current corresponding to the potential "X+W" of the node N2 flows from the wiring 112 to the transistor 107.

Here, the potential of the other electrode of the capacitor 202 changes in accordance with the current flowing through the wiring 112, and a change amount Z is added to the potential Vr of the wiring 211 by capacitive coupling. Accordingly, the potential of the wiring 211 becomes "Vr+ Z". Here, given that Vr=0, Z is the difference itself, which means that the data A is calculated.

The potential of the wiring 213 is set to "H" and the potential of the wiring 215 is set to an appropriate analog potential such as "$V_{bias}$", so that the circuit 201 can output a signal potential corresponding to the data A by a source follower operation.

In the same step, the difference (data B) between the data obtained when image capturing is not performed and the data obtained by adding a weight to the data can be calculated. Since image capturing is not performed, the operation does not include an accumulation period. For example, the wiring 122 is set at "H" when the wiring 121 is at "H", so that the potential of the node N1 can be kept at the reset potential. The operation from Time T5 to T8 can be omitted when the potentials of the node N1 and the node N2 before Time T8 are each the reset potential.

Although one pixel is described here, a plurality of pixels are connected in parallel to the circuit 201 and the above operation (product-sum operation) is performed on the plurality of pixels.

The data A and the data B output from the circuit 201 in the above operations are input to the circuit 301. Calculation of the difference between the data A and the data B is performed in the circuit 301, so that unnecessary offset components other than the product of the image data (potential X) and the weight coefficient (potential W) can be eliminated. The circuit 301 may have a structure in which the difference is calculated by utilizing a memory circuit and software processing, other than the structure including an arithmetic circuit such as the circuit 201.

The weight coefficient can be output from the circuit 305 illustrated in FIG. 1 to the wiring 111, and it is preferable to rewrite the weight coefficient more than once in a frame period. As the circuit 305, a decoder can be used. The circuit 305 may include a D/A converter or an SRAM.

A signal can be output from the circuit 303 to the wiring 112 for selecting the pixel 100 to which the weight coefficient is input. As the circuit 303, a decoder or a shift register can be used.

A signal can be output from the circuit 304 to the wiring 125 or the like connected to the gate of the transistor 108 of the pixel 100. As the circuit 304, a decoder or a shift register can be used.

Although the processing of data of the captured image is described above, image data without processing can be extracted in the imaging device of one embodiment of the present invention.

In the product-sum operation, pixels in a plurality of rows are preferably selected at a time. Meanwhile, in the case where only imaging data is extracted, data is desirably extracted from pixels in one row. In one embodiment of the present invention, the circuit 304 for selecting the pixels 100 has a function of changing the number of rows to be selected.

<Shift Register>

Figure 8:
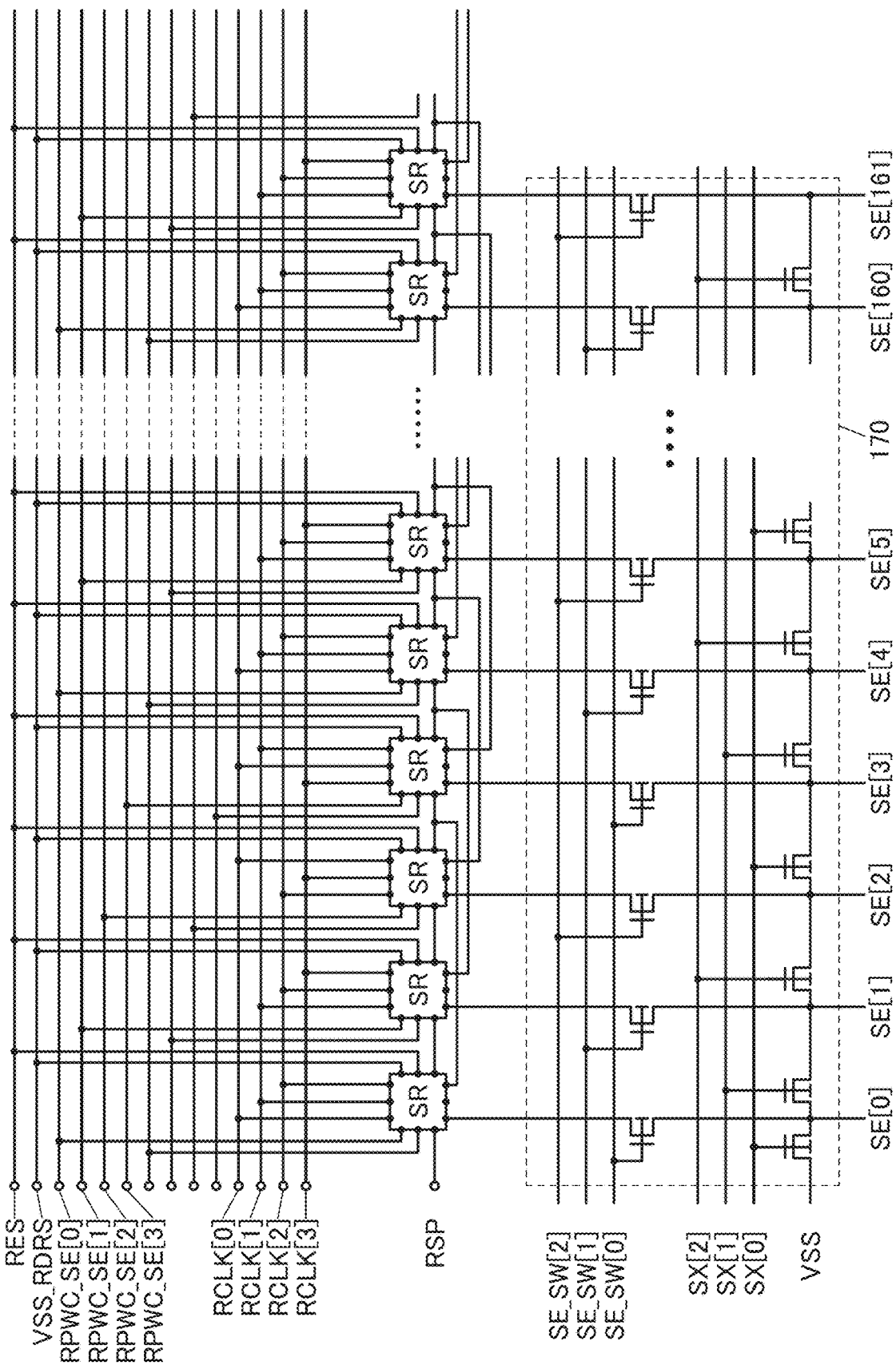
FIG. 8 is a diagram showing a circuit 304.

FIG. 8 is an example of a circuit that can be used as the circuit 304. The circuit is a shift register circuit, in which a plurality of logic circuits (SR) are electrically connected. To the logic circuits (SR), signal lines such as a wiring RES, a wiring VSS_RDRS, wirings RPWC_SE[0:3], wirings RCLK[0:3], and a wiring RSP are connected and appropriate signal potentials are input to the respective signal lines, so that selection signal potentials can be sequentially output from the logic circuits (SR).

A circuit 170 is electrically connected to the logic circuits (SR). A plurality of transistors are provided in the circuit 170 and are connected to signal lines such as wirings SE_SW [0:2] and wirings SX[0:2]. When appropriate signal potentials are input to the respective signal lines, electrical conduction of the transistors is controlled. By the control by the circuit 170, the number of rows of pixels to be selected can be changed.

One of a source and a drain of one transistor is electrically connected to an output terminal of one logic circuit (SR), and the other of the source and the drain of the transistor is connected to a wiring SE. The wiring SE is electrically connected to the wiring 122 for selecting the pixel 100.

A signal potential supplied from the wiring SE_SW[0] can be input to a gate of the transistor connected to the wiring SE[0]. A signal potential supplied from the wiring SE_SW[1] can be input to a gate of the transistor connected to the wiring SE[1]. A signal potential supplied from the wiring SE_SW[2] can be input to a gate of the transistor connected to the wiring SE[2].

Signal potentials supplied from the wirings SE_SW[0:2] can be input to gates of the transistors connected to the wiring SE[3] and the subsequent wirings SE in the same order.

Moreover, adjacent wirings SE are electrically connected to each other through one transistor, and the wiring SE[0] is electrically connected to a power supply line (VSS) through one transistor.

A signal potential supplied from the wiring SX[0] can be input to a gate of the transistor that electrically connects the power supply line (VSS) and the wiring SE[0]. A signal potential supplied from the wiring SX[1] can be input to a gate of the transistor that electrically connects the wiring SE[0] and the wiring SE[1]. A signal potential supplied from the wiring SX[2] can be input to a gate of the transistor that electrically connects the wiring SE[1] and the wiring SE[2]. Signal potentials supplied from the wirings SX[0:2] can be input to gates of the transistors that electrically connect the subsequent adjacent wirings SE in the same order.

Figure 9:
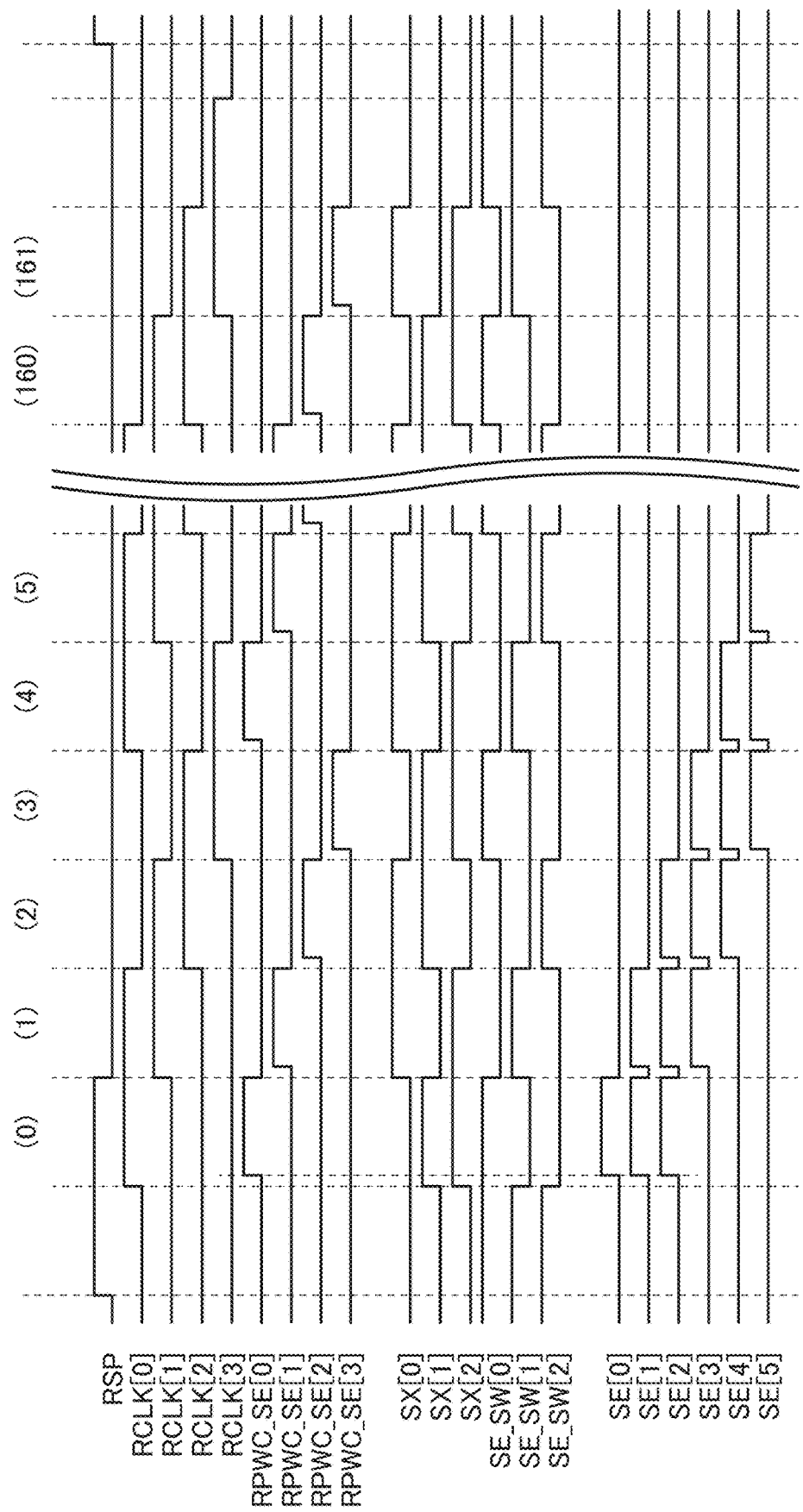
FIG. 9 is a timing chart showing an operation of the circuit 304.

FIG. 9 is a timing chart showing an operation in which a plurality of rows (three rows) are selected at a time by the circuit illustrated in FIG. 8. Note that (0) to (161) correspond to timings at which the logic circuits (SR) output signal potentials to the wirings SE.

When the potential of the wiring SX[0] is "L", the potential of the wiring SX[1] is "H", the potential of the wiring SX[2] is "H", the potential of the wiring SE_SW[0] is "H", the potential of the wiring SE_SW[1] is "L", and the potential of the wiring SE_SW[2] is "L" at the timing (0), electrical conduction of the respective transistors is controlled and "H", "H", and "H" are output to the wiring SE[0], the wiring SE[1], and the wiring SE[2], respectively. To the other wirings SE, "L" is output.

Thus, three rows can be selected at a time, and a product-sum operation of pixels of three rows and three columns can be performed, for example.

When the potential of the wiring SX[0] is "H", the potential of the wiring SX[1] is "L", the potential of the wiring SX[2] is "H", the potential of the wiring SE_SW[0] is "L", the potential of the wiring SE_SW[1] is "H", and the potential of the wiring SE_SW[2] is "L" at the timing (1), electrical conduction of the respective transistors is controlled and "L", "H", "H", and "H" are output to the wiring SE[0], the wiring SE[1], the wiring SE[2], and the wiring SE[3], respectively.

To the other wirings SE, "L" is output.

That is, at the timing (1), a product-sum operation with a stride of 1, in which one-row shift from the timing (0) is made, can be performed.

Figure 10:
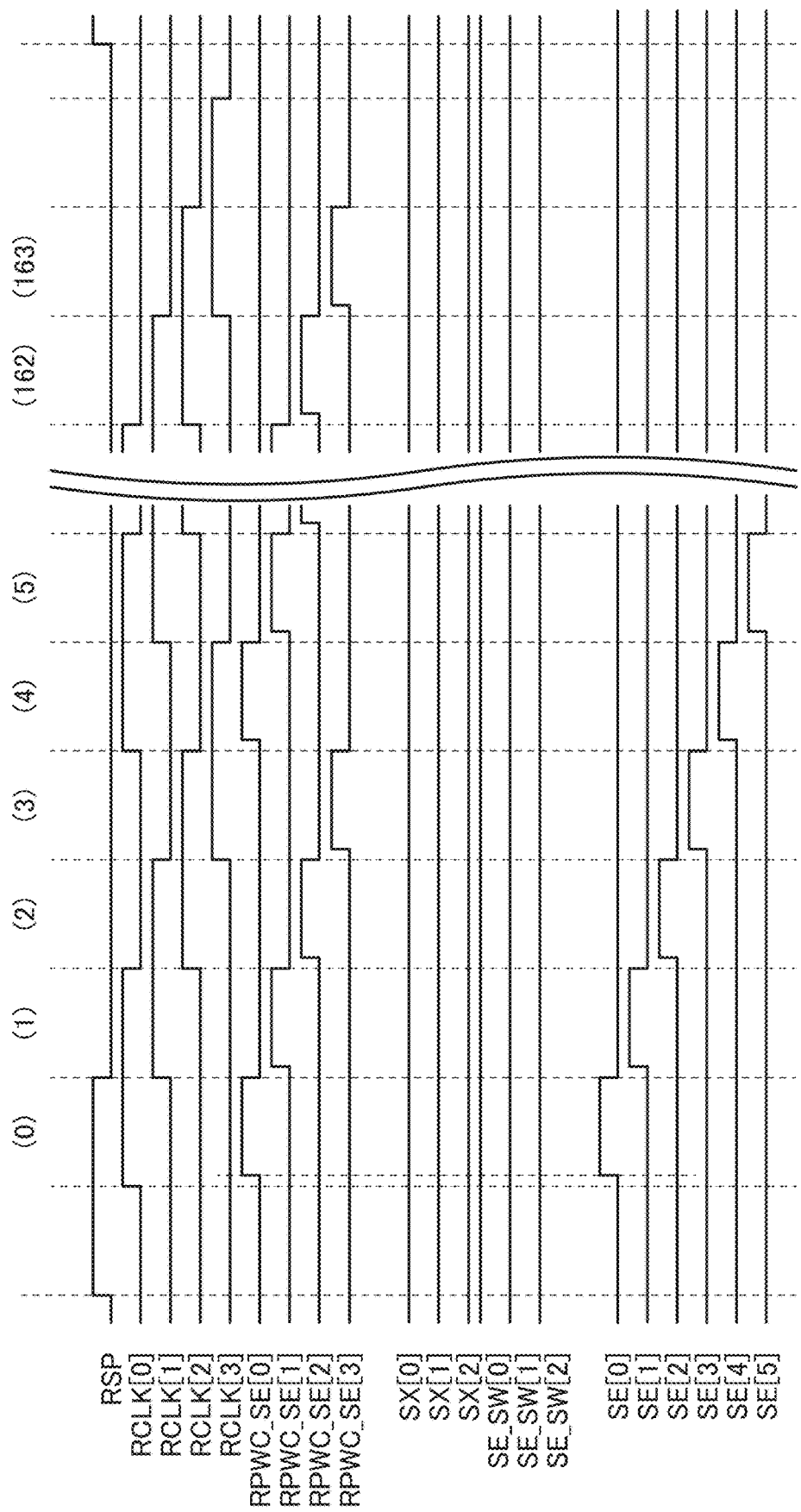
FIG. 10 is a timing chart showing the operation of the circuit 304.

FIG. 10 is a timing chart showing an operation in which one row is selected by the circuit illustrated in FIG. 8.

In the operation according to the timing chart, the potentials of the wirings SE_SW[0:2] always remain at "H", and the potentials of the wirings SX[0:2] always remain at "L". Thus, outputs of the logic circuits (SR) are input to the respective wirings SE without any changes, which enables selection of one row at a time.

<Circuits 301 and 302>

Figure 11A:
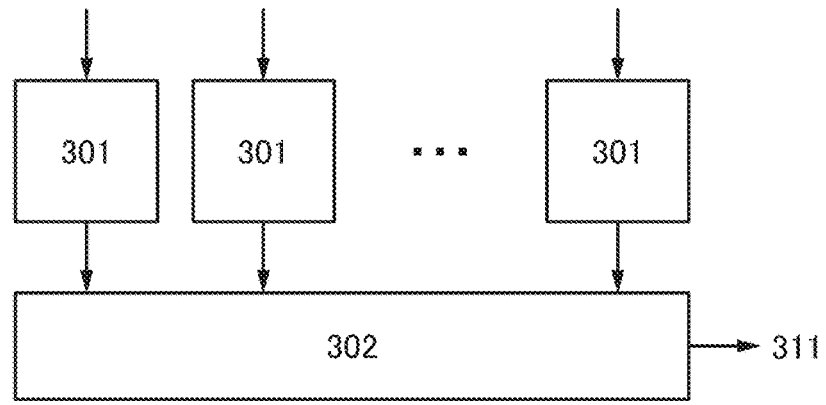
FIG. 11A and FIG. 11B are diagrams illustrating circuits 301 and a circuit 302.

FIG. 11A is a diagram illustrating the circuit 302 and the circuits 301 connected to the circuit 201. Product-sum operation result data output from the circuit 201 are sequentially input to the circuits 301. The circuits 301 may each have a variety of arithmetic functions in addition to the above-described function of calculating the difference between the data A and the data B. For example, the circuits 301 can have a structure similar to that of the circuit 201. Alternatively, the function of the circuits 301 may be replaced by software processing.

The circuits 301 may each include a circuit that performs an arithmetic operation of an activation function. A comparator circuit can be used as the circuit, for example. A comparator circuit outputs a result of comparing input data and a set threshold as binary data. In other words, the pixel blocks 200 and the circuits 301 can operate as part of elements in a neural network.

The circuit 301 may include an A/D converter. When image data is output to the outside without a product-sum operation or the like, analog data can be converted into digital data by the circuit 301.

Furthermore, in the case where the data output from the pixel blocks 200, which corresponds to image data of a plurality of bits, can be binarized by the circuits 301, the binarization can be rephrased as compression of image data.

Data output from the circuits 301 are sequentially input to the circuit 302. The circuit 302 can have a structure including a latch circuit, a shift register, and the like, for example. With this structure, parallel-serial conversion can be performed and data input in parallel can be output to a wiring 311 as serial data. The connection destination of the wiring 311 is not limited. For example, it can be connected to a neural network, a memory device, a communication device, or the like.

Figure 11B:
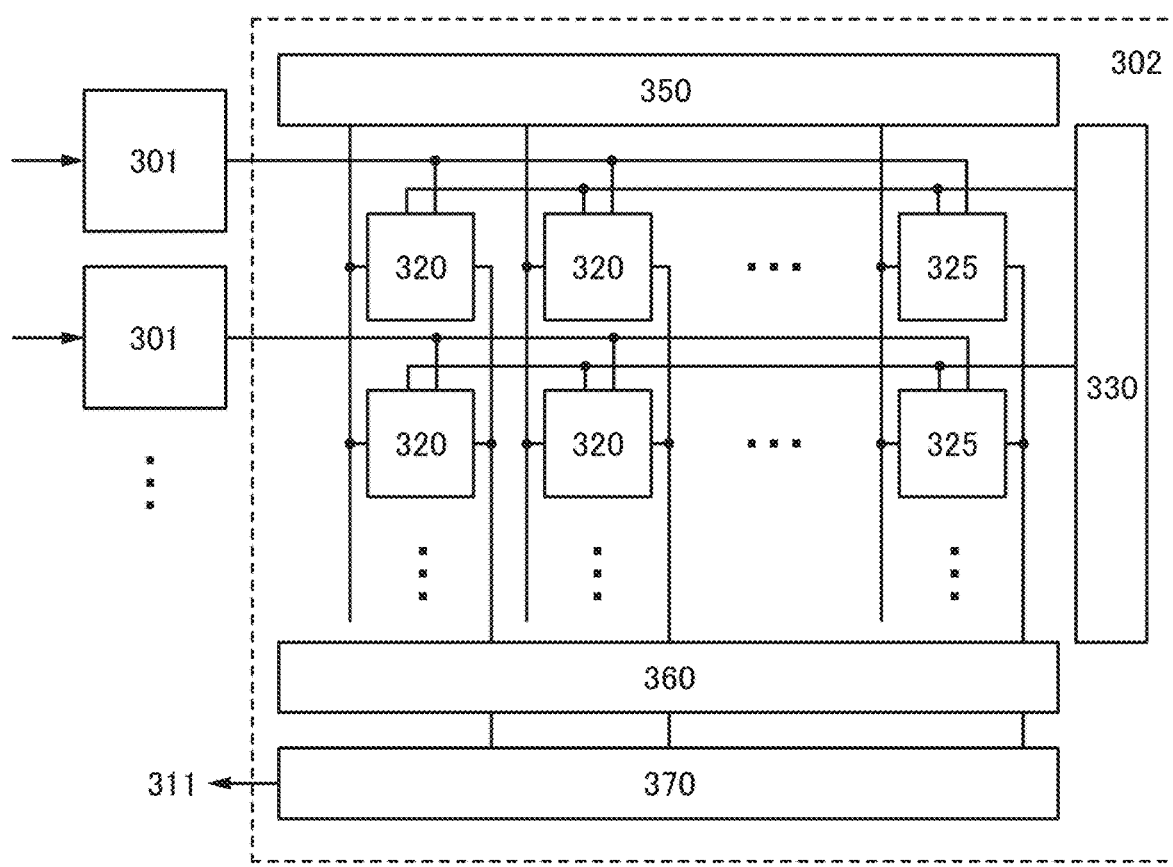

Moreover, as illustrated in FIG. 11B, the circuit 302 may include a neural network. The neural network includes memory cells arranged in a matrix, and each memory cell retains a weight coefficient. Data output from the circuits 301 are input to corresponding memory cells 320, and a product-sum operation can be performed. Note that the number of memory cells illustrated in FIG. 11B is an example, and the number is not limited.

The neural network illustrated in FIG. 11B includes the memory cells 320 and reference memory cells 325 which are arranged in a matrix, a circuit 330, a circuit 350, a circuit 360, and a circuit 370.

Figure 12:
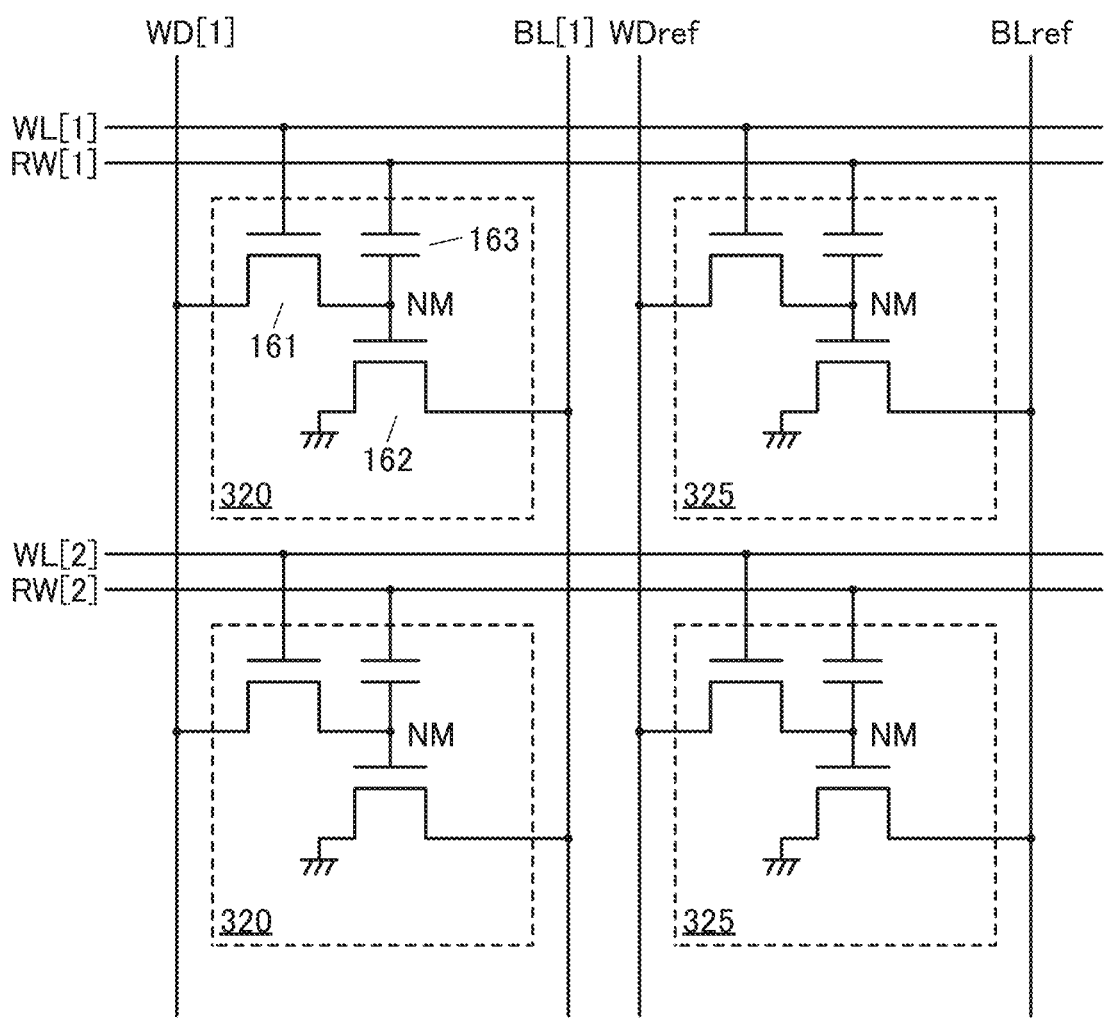
FIG. 12 is a diagram illustrating memory cells.

FIG. 12 illustrates an example of the memory cells 320 and the reference memory cells 325. The reference memory cells 325 are provided in an arbitrary one column. The memory cells 320 and the reference memory cells 325 have similar structures and each include a transistor 161, a transistor 162, and a capacitor 163.

One of a source and a drain of the transistor 161 is electrically connected to a gate of the transistor 162. The gate of the transistor 162 is electrically connected to one electrode of the capacitor 163. Here, a point where the one of the source and the drain of the transistor 161, the gate of the transistor 162, and the one electrode of the capacitor 163 are connected is referred to as a node NM.

A gate of the transistor 161 is electrically connected to a wiring WL. The other electrode of the capacitor 163 is electrically connected to a wiring RW. One of a source and a drain of the transistor 162 is electrically connected to a reference potential wiring such as a GND wiring.

In the memory cell 320, the other of the source and the drain of the transistor 161 is electrically connected to a wiring WD. The other of the source and the drain of the transistor 162 is electrically connected to a wiring BL.

In the reference memory cell 325, the other of the source and the drain of the transistor 161 is electrically connected to a wiring WDref. The other of the source and the drain of the transistor 162 is electrically connected to a wiring BLref.

The wiring WL is electrically connected to the circuit 330. As the circuit 330, a decoder, a shift register, or the like can be used.

The wiring RW is electrically connected to the circuit 301. Binary data output from the circuit 301 is written to each memory cell. Note that a sequential circuit such as a shift register may be included between the circuit 301 and the memory cells.

The wiring WD and the wiring WDref are electrically connected to the circuit 350. As the circuit 350, a decoder, a shift register, or the like can be used. The circuit 350 may include a D/A converter or an SRAM. The circuit 350 can output a weight coefficient to be written to the node NM.

The wiring BL and the wiring BLref are electrically connected to the circuit 360. The circuit 360 can have a structure equivalent to that of the circuit 201. By the circuit 360, a signal of a product-sum operation result from which offset components are eliminated can be obtained.

The circuit 360 is electrically connected to the circuit 370. The circuit 370 can also be referred to as an activation function circuit. The activation function circuit has a function of performing an arithmetic operation for converting the signal input from the circuit 360 in accordance with a predefined activation function. As the activation function, for example, a sigmoid function, a tanh function, a softmax function, a ReLU function, a threshold function, or the like can be used. The signal converted by the activation function circuit is output to the outside as output data.

Figure 13A:
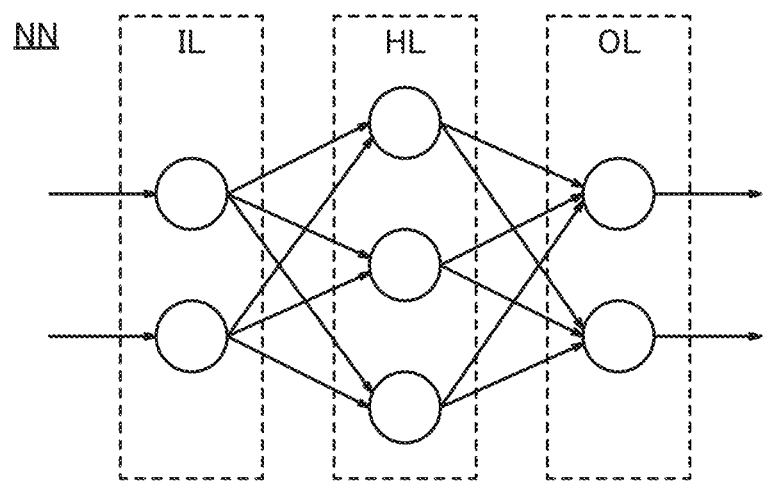
FIG. 13A and FIG. 13B are diagrams illustrating a structure example of a neural network.

As illustrated in FIG. 13A, a neural network NN can be formed of an input layer IL, an output layer OL, and a middle layer (hidden layer) HL. The input layer IL, the output layer OL, and the middle layer HL each include one or more neurons (units). Note that the middle layer HL may be composed of one layer or two or more layers. A neural network including two or more middle layers HL can also be referred to as a DNN (deep neural network). Learning using a deep neural network can also be referred to as deep learning.

Input data is input to each neuron in the input layer IL. A signal output from a neuron in the previous layer or the subsequent layer is input to each neuron in the middle layer HL. To each neuron in the output layer OL, output signals of the neurons in the previous layer are input. Note that each neuron may be connected to all the neurons in the previous and subsequent layers (full connection), or may be connected to some of the neurons.

Figure 13B:
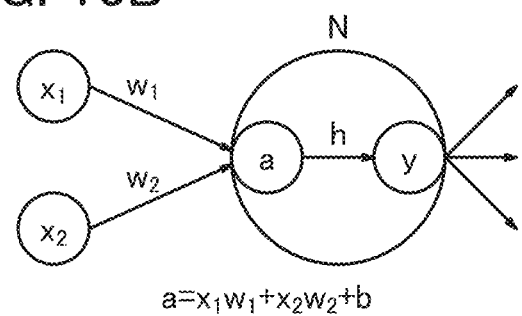

FIG. 13B illustrates an example of an arithmetic operation with the neurons. Here, a neuron N and two neurons in the previous layer which output signals to the neuron N are illustrated. An output $x_1$ of a neuron in the previous layer and an output $x_2$ of a neuron in the previous layer are input to the neuron N. Then, in the neuron N, a total sum $x_1w_1+x_2w_2$ of a multiplication result ($x_1w_1$) of the output $x_1$ and a weight $w_1$ and a multiplication result ($x_2w_2$) of the output $x_2$ and a weight $w_2$ is calculated, and then a bias b is added as necessary, so that the value $a=x_1w_1+x_2w_2+b$ is obtained. Then, the value a is converted with an activation function h, and an output signal y=ah is output from the neuron N.

In this manner, the arithmetic operation with the neurons includes the arithmetic operation that sums the products of the outputs and the weights of the neurons in the previous layer, that is, the product-sum operation ($x_1w_1+x_2w_2$ described above). This product-sum operation may be performed using a program on software or may be performed using hardware.

In one embodiment of the present invention, an analog circuit is used as hardware to perform a product-sum operation. In the case where an analog circuit is used as the product-sum operation circuit, the circuit scale of the product-sum operation circuit can be reduced, or higher processing speed and lower power consumption can be achieved by reduced frequency of access to a memory.

The product-sum operation circuit preferably has a structure including an OS transistor. An OS transistor is suitably used as a transistor included in an analog memory of the product-sum operation circuit because of its extremely low off-state current. Note that the product-sum operation circuit may be formed using both a Si transistor and an OS transistor.

<Operation of Imaging Device>

Figure 14:
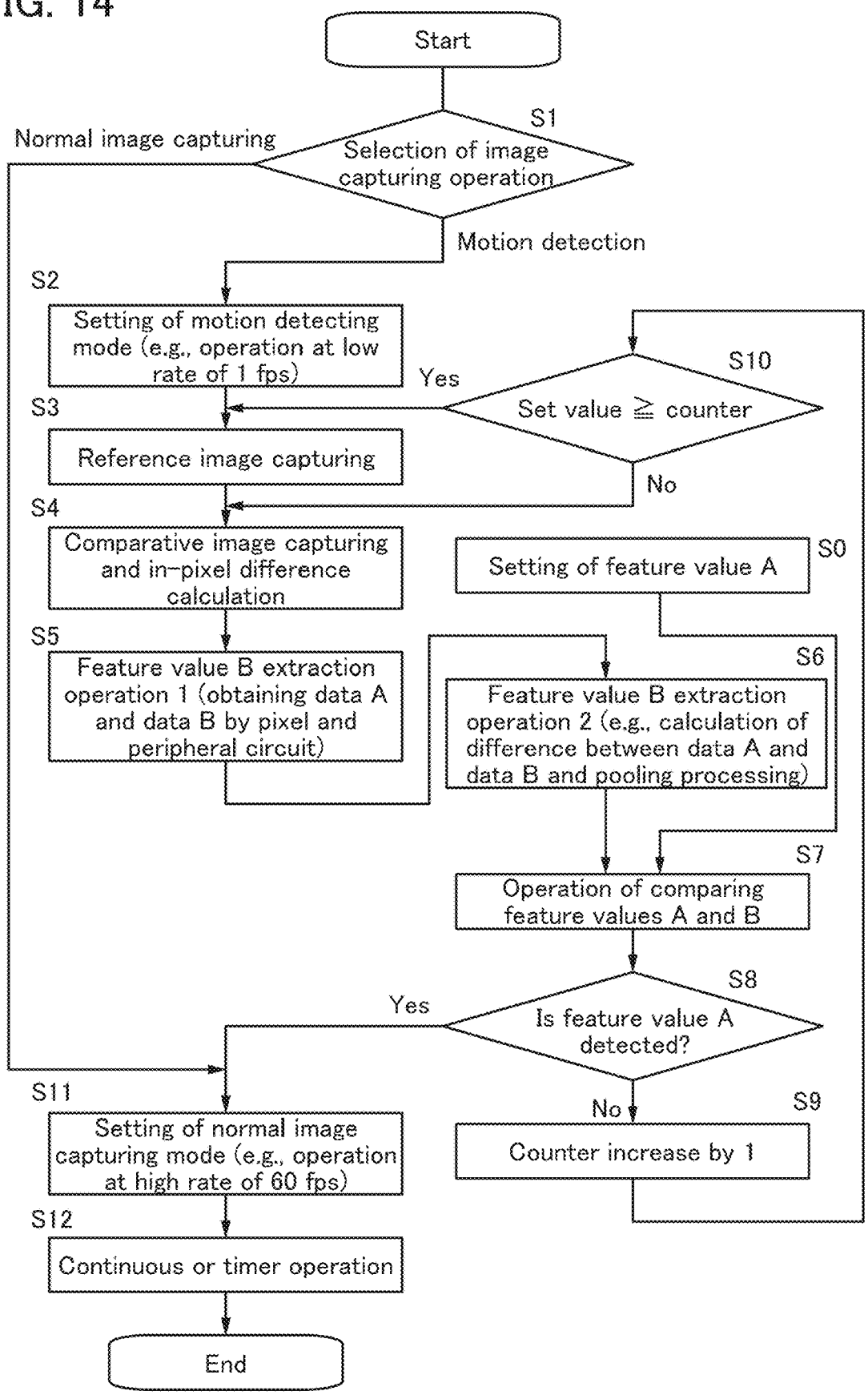
FIG. 14 is a flow chart showing an operation of an imaging device.

Next, an example of a method for operating the imaging device of one embodiment of the present invention will be described with reference to a flow chart shown in FIG. 14.

First, an image capturing operation is selected (S1). In the case of performing normal image capturing, the process goes to setting of a normal image capturing mode (S11).

The normal image capturing mode is a mode in which a moving image is captured at a high rate, and for example, a frame rate is set to 15 fps to 240 fps, preferably 30 fps to 120 fps, and typically 60 fps. Next, a continuous operation or a timer operation is performed under the set conditions (S12). The image capturing operation is terminated after the timer operation or by a user's judgement.

In the case where motion detection is conducted, the process goes to setting of a motion detecting mode (S2).

The motion detecting mode is a mode in which a moving image is captured at a low rate, and for example, a frame rate is set to higher than or equal to 0.1 fps and lower than or equal to 10 fps. Setting a frame rate low can reduce power consumption. Note that in the case where the period from when a change is found in an imaging object until the imaging object returns to the original state is short, a frame rate may be set to relatively high.

Next, a reference image is captured (S3). The image capturing operation of the reference image corresponds to the operation from Time T1 to T4 in the timing chart of FIG. 5.

Next, a comparative image is captured and an in-pixel difference calculation is performed (S4). These operations correspond to the operation from Time T5 to T7 in the timing chart of FIG. 6.

Next, a feature value B extraction operation 1 is performed (S5). This operation corresponds to obtaining the data A by the operation from Time T8 to T11 in the timing charge of FIG. 6 and obtaining the data B by the operation performed when image capturing is not performed. Note that a weight added to the image data here corresponds to a convolution filter of a convolutional neural network (CNN).

Next, a feature value B extraction operation 2 is performed (S6). This operation can be performed by the circuit 301 or an external circuit, for example, and a difference between the data A and the data B is calculated. Pooling processing may also be performed. The difference between the data A and the data B is obtained, so that offset components other than the product of the image data (X) and the weight coefficient (W) can be eliminated. That is, the feature value B refers to a feature value extracted from data of the captured image.

Next, an operation of comparing the feature values A and B is performed (S7 and S8). This operation can be performed by, for example, an external circuit. Note that the feature value A to be a reference is set (S0) at any timing before this operation. A feature value such as a shape or a pattern of an object can be used as the feature value A, for example. Thus, a convolution filter is preferably selected in accordance with the feature value A.

In the case where the feature value A is detected from the feature value B through the comparison of the feature value A with the feature value B extracted in S6, the process goes to S11 and image capturing in the normal image capturing mode is performed. In the case where the feature value A is not detected, the process returns to S3 or S4 through a counter operation (S9 and S10) or the like. Note that a threshold value indicating whether the feature value A is detected or not can be set arbitrarily.

When the feature value A is not detected, return to S4 does not cause a problem in the short term since the reference image is retained in the pixel, whereas a change in the illuminance of natural light or a change in an object overtime sometimes influences the operation of comparing the feature values. Thus, it is preferable that the process return to S3 and the reference image be captured again when the set value converted into time reaches, for example, one minute, ten minutes, one hour, or six hours with the use of a counter or the like. Alternatively, time-based control using a timer or the like may be performed.

Note that the number of feature values A may be two or more. In that case, conditions such as whether all the feature values A are detected and whether some of the feature values A are detected can be set. In the case where the feature value A is not detected but there is a difference between the reference image and the comparative image, the process may go to S11.

Figure 15A:
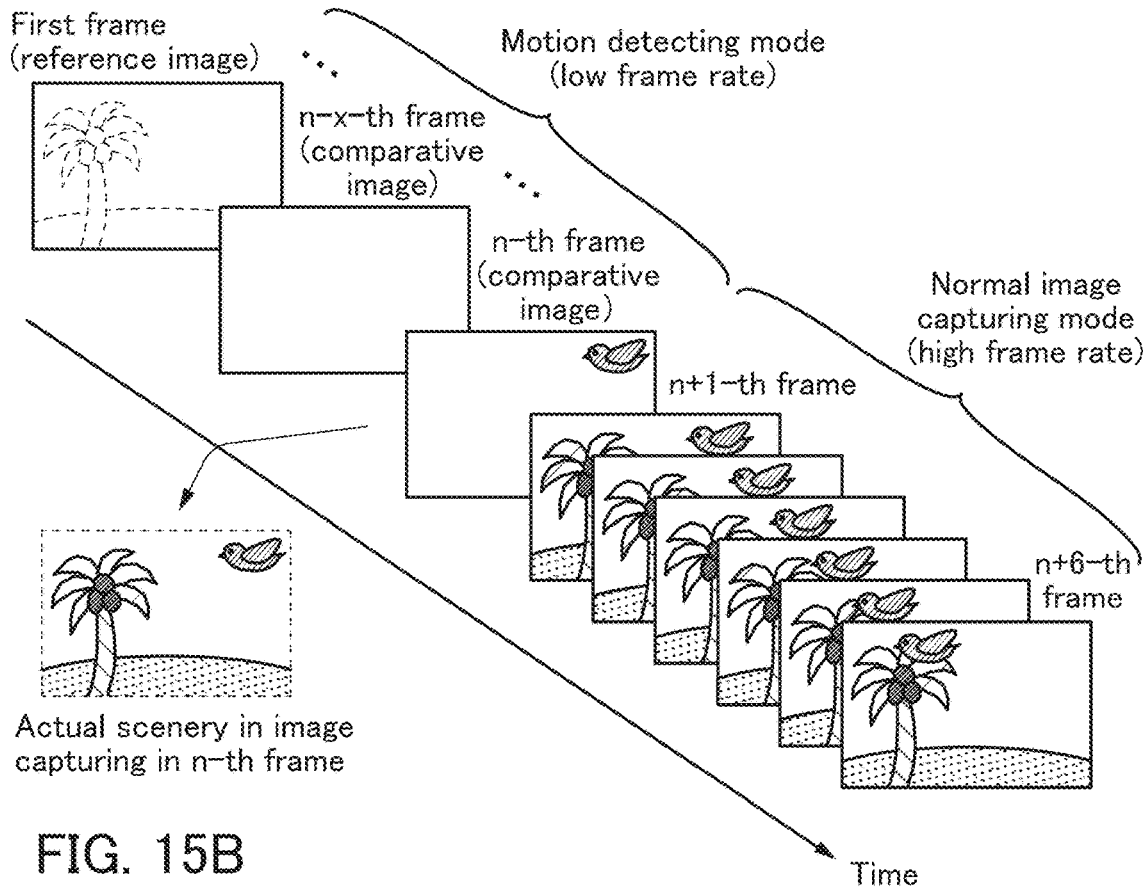
FIG. 15A and FIG. 15B are diagrams illustrating an operation of an imaging device.
Figure 15B:
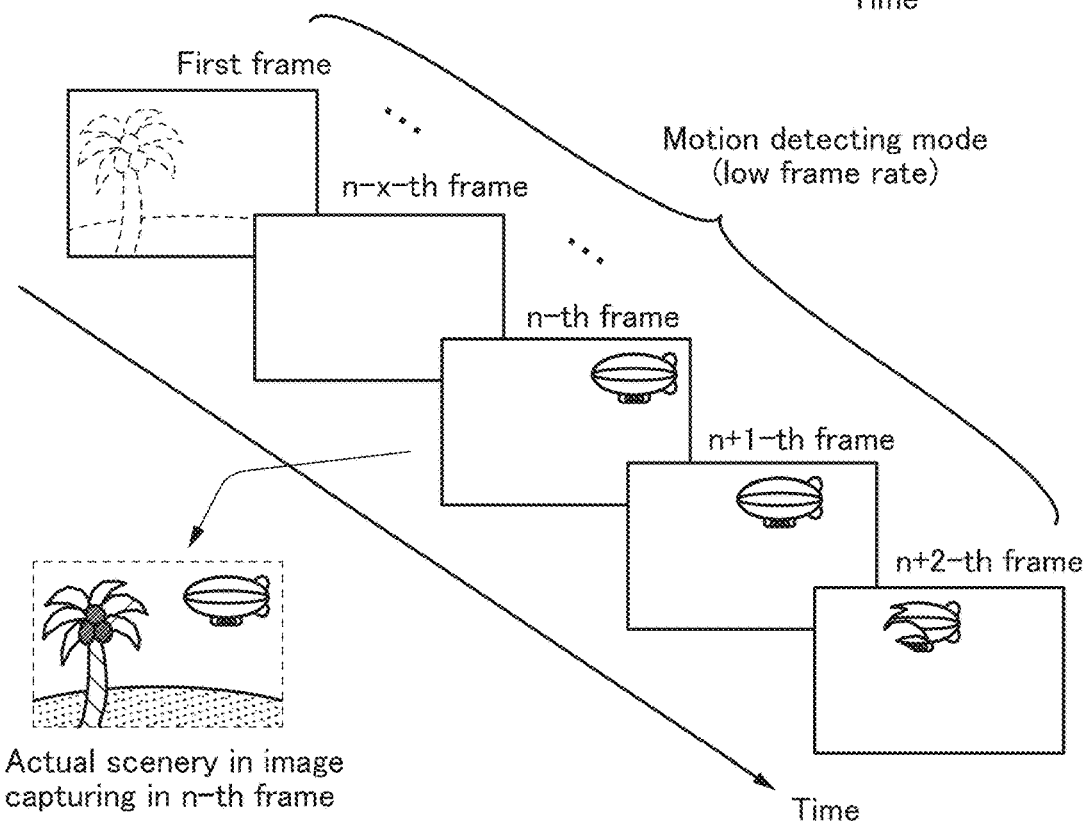

FIG. 15A and FIG. 15B are diagrams illustrating a specific operation in the motion detecting mode.

FIG. 15A is a diagram illustrating an operation of the case where the feature value A is detected, and illustrates a change in frame image along the time axis. Note that an object is scenery, and the feature value A is data including the features of a bird.

First, a frame rate is set low, and a reference image is captured in a first frame (which corresponds to S3). Note that in the first frame in FIG. 15A, an image of scenery is indicated by dashed lines; actually, the reference image is retained in a pixel and image data is not output from the imaging device.

Subsequent to the capturing of the reference image, operations from the capturing of a comparative image and an in-pixel difference calculation (which correspond to S4) to determining detection of the feature value A (corresponding to S8) are performed in each frame. The n-x-th frame (n and x are each a natural number, and n>x is larger than 1) in FIG. 15A illustrates the case where the scenery does not change. The image data to be output is data on a difference between the reference image and the comparative image, and the image data without any change corresponds to the all-white or all-black image. In the case where the scenery does not change, a frame similar to the n-x-th frame is repeated.

Next, when an image of a bird is captured in the n-th frame, the correspondence to the feature value A including the features of a bird is determined, and the mode is switched to the normal image capturing mode at a high frame rate (S11) for the n+1-th frame and subsequent frames. The above is the operation of the case where the feature value A is detected.

FIG. 15B is a diagram illustrating an operation of the case where the feature value A is not detected. Image capturing is started under the same conditions as those in FIG. 15A, and when the scenery changes but the feature value A (bird) is not captured, the motion detecting mode continues and is not switched to the normal image capturing mode. Although FIG. 15B illustrates the case where an image of an airship is captured in the n-th frame, the correspondence to the feature value A is not determined, so that the motion detecting mode continues for the n+1-th frame and subsequent frames.

As described above, the imaging device of one embodiment of the present invention can determine whether a specified object is detected or not. Thus, in the case where the imaging device is used as a security camera or the like, only a human can be an object that causes mode switching and a dog, a cat, a plant, or the like cannot be the object that causes mode switching, for example.

This embodiment can be combined with any of the other embodiments as appropriate.

Embodiment 2

In this embodiment, structure examples and the like of the imaging device of one embodiment of the present invention will be described.

<Structure Example>

Figure 16A:
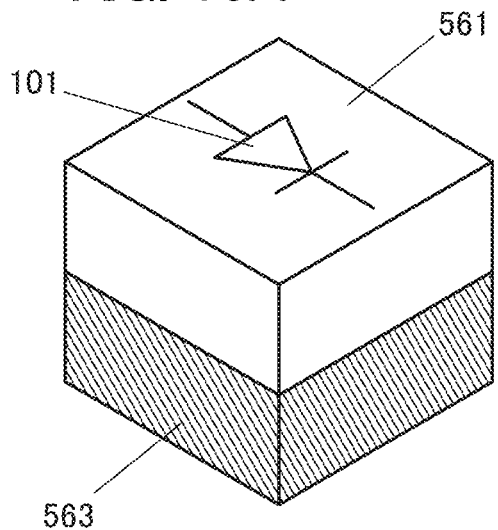
FIG. 16A to FIG. 16D are diagrams illustrating structures of a pixel of an imaging device.

FIG. 16A is a diagram illustrating a structure example of a pixel in an imaging device, and a stacked-layer structure of a layer 561 and a layer 563 can be employed.

Figure 17A:
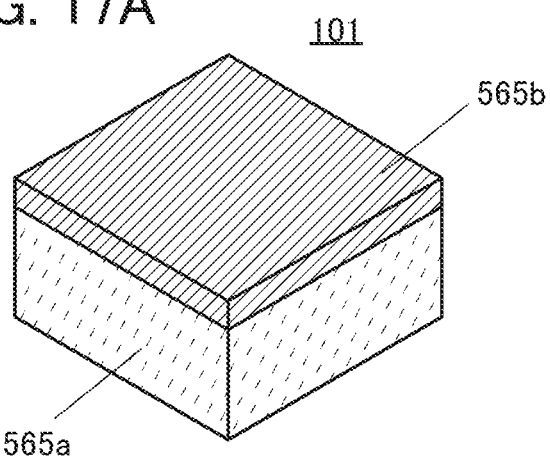
FIG. 17A to FIG. 17C are diagrams illustrating structures of a photoelectric conversion device.

The layer 561 includes the photoelectric conversion device 101. The photoelectric conversion device 101 can include a layer 565a and a layer 565b as illustrated in FIG. 17A. Note that a layer may be rephrased as a region.

The photoelectric conversion device 101 illustrated in FIG. 17A is a pn-junction photodiode; for example, a p-type semiconductor can be used for the layer 565a, and an n-type semiconductor can be used for the layer 565b. Alternatively, an n-type semiconductor may be used for the layer 565a, and a p-type semiconductor may be used for the layer 565b.

The pn-junction photodiode can be formed using typically single crystal silicon.

Figure 17B:
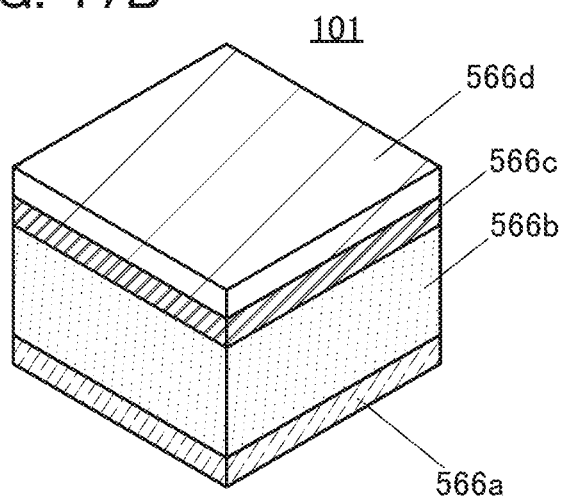

The photoelectric conversion device 101 included in the layer 561 may have a stacked-layer structure of a layer 566a, a layer 566b, a layer 566c, and a layer 566d as illustrated in FIG. 17B. The photoelectric conversion device 101 illustrated in FIG. 17B is an example of an avalanche photodiode, and the layer 566a and the layer 566d correspond to electrodes and the layers 566b and 566c correspond to a photoelectric conversion portion.

The layer 566a is preferably a low-resistance metal layer or the like. For example, aluminum, titanium, tungsten, tantalum, silver, or a stacked layer thereof can be used.

A conductive layer having a high light-transmitting property with respect to visible light is preferably used as the layer 566d. For example, indium oxide, tin oxide, zinc oxide, indium tin oxide, gallium zinc oxide, indium gallium zinc oxide, graphene, or the like can be used. Note that a structure in which the layer 566d is omitted can also be employed.

A structure of a pn-junction photodiode containing a selenium-based material in a photoelectric conversion layer can be used for the layers 566b and 566c of the photoelectric conversion portion, for example. A selenium-based material, which is a p-type semiconductor, is preferably used for the layer 566b, and gallium oxide or the like, which is an n-type semiconductor, is preferably used for the layer 566c.

A photoelectric conversion device containing a selenium-based material has characteristics of high external quantum efficiency with respect to visible light. In the photoelectric conversion device, electrons are greatly amplified with respect to the amount of incident light by utilizing the avalanche multiplication. A selenium-based material has a high light-absorption coefficient and thus has advantages in production; for example, a photoelectric conversion layer can be formed using a thin film. A thin film of a selenium-based material can be formed by a vacuum evaporation method, a sputtering method, or the like.

As a selenium-based material, crystalline selenium such as single crystal selenium or polycrystalline selenium, amorphous selenium, a compound of copper, indium, and selenium (CIS), a compound of copper, indium, gallium, and selenium (CIGS), or the like can be used.

An n-type semiconductor is preferably formed using a material with a wide band gap and a light-transmitting property with respect to visible light. For example, zinc oxide, gallium oxide, indium oxide, tin oxide, or mixed oxide thereof can be used. In addition, these materials have a function of a hole-injection blocking layer, so that a dark current can be decreased.

Figure 17C:
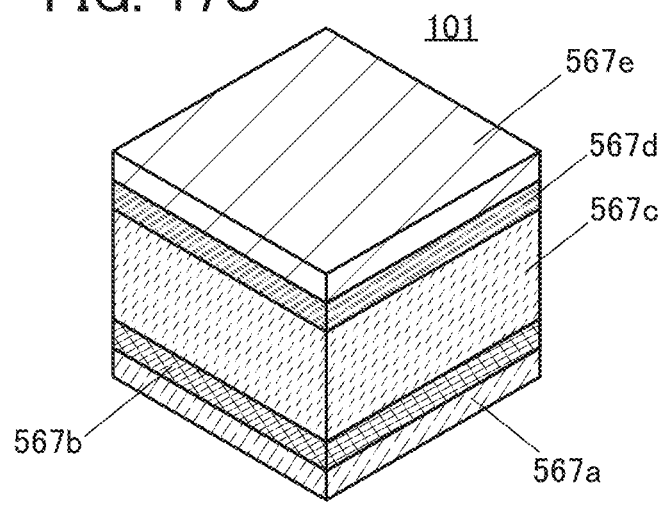

The photoelectric conversion device 101 included in the layer 561 may have a stacked-layer structure of a layer 567a, a layer 567b, a layer 567c, a layer 567d, and a layer 567e as illustrated in FIG. 17C. The photoelectric conversion device 101 illustrated in FIG. 17C is an example of an organic photoconductive film; the layer 567a is a lower electrode, the layer 567e is an upper electrode having a light-transmitting property, and the layers 567b, 567c, and 567d correspond to a photoelectric conversion portion.

One of the layers 567b and 567d in the photoelectric conversion portion can be a hole-transport layer and the other can be an electron-transport layer. The layer 567c can be a photoelectric conversion layer.

For the hole-transport layer, molybdenum oxide can be used, for example. For the electron-transport layer, fullerene such as $C_{60}$ or $C_{70}$, or a derivative thereof can be used, for example.

As the photoelectric conversion layer, a mixed layer of an n-type organic semiconductor and a p-type organic semiconductor (bulk heterojunction structure) can be used.

For the layer 563 illustrated in FIG. 16A, a silicon substrate can be used, for example. The silicon substrate includes a Si transistor or the like. With the use of the Si transistor, as well as a pixel circuit, a circuit for driving the pixel circuit, a circuit for reading out an image signal, an image processing circuit, a neural network, a communication circuit, or the like can be formed. Furthermore, a CPU (Central Processing Unit), an MCU (Micro Controller Unit), a memory circuit such as a DRAM (Dynamic Random Access Memory), or the like may be formed. Note that the above circuits except the pixel circuit are each referred to as a functional circuit in this embodiment.

For example, some or all of the transistors included in the pixel circuits (the pixels 100) and the functional circuits (the circuits 201, 301, 302, 303, 304, 305, and the like) described in Embodiment 1 can be provided in the layer 563.

Figure 16B:
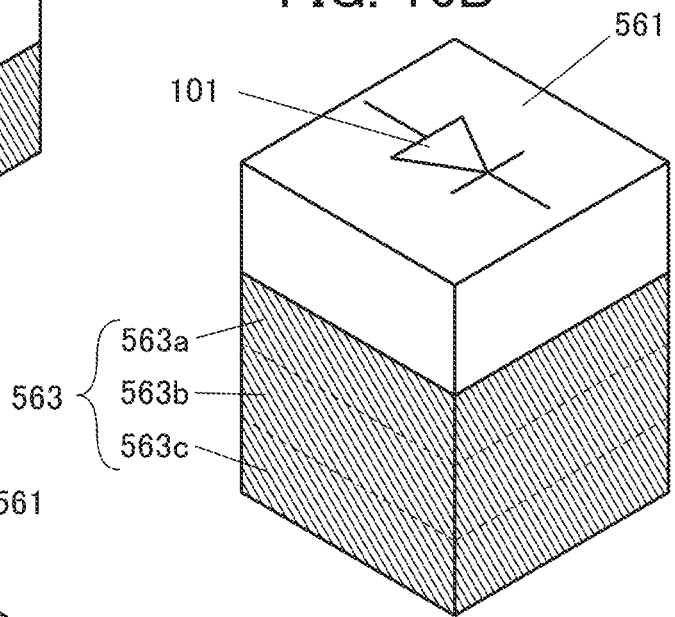

The layer 563 may be a stack of a plurality of layers as illustrated in FIG. 16B. Although FIG. 16B illustrates an example in which the layer 563 is composed of three layers 563a, 563b, and 563c, a two-layer structure may be employed. Alternatively, the layer 563 may be a stack of four or more layers. These layers can be stacked by a bonding process, for example. With this structure, the pixel circuits and the functional circuits can be dispersed in a plurality of layers; thus, the pixel circuits and the functional circuits can be provided to overlap with each other, which enables a small-sized and high-performance imaging device to be manufactured.

Figure 16C:
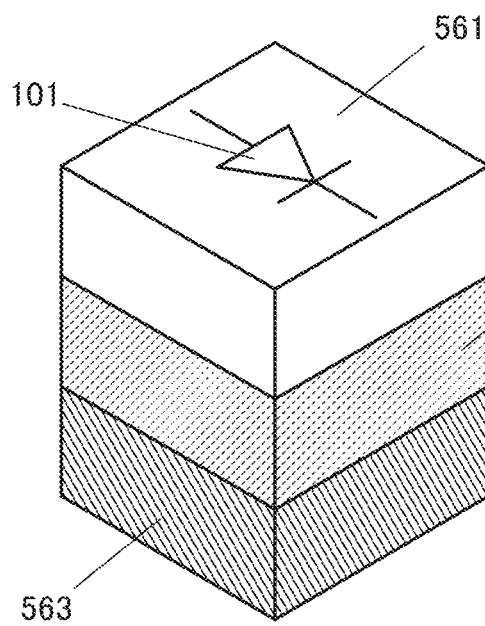

Furthermore, the pixel may have a stacked-layer structure of the layer 561, a layer 562, and the layer 563 as illustrated in FIG. 16C.

The layer 562 can include an OS transistor. One or more of the above-described functional circuits may be formed using an OS transistor. Alternatively, one or more of the functional circuits may be formed using a Si transistor in the layer 563 and an OS transistor in the layer 562.

A normally-off CPU (also referred to as "Noff-CPU") can be formed using an OS transistor and a Si transistor, for example. Note that the Noff-CPU is an integrated circuit including a normally-off transistor, which is in a non-conduction state (also referred to as an off state) even when a gate voltage is 0 V.

In the Noff-CPU, power supply to a circuit that does not need to operate can be stopped so that the circuit can be brought into a standby state. The circuit brought into the standby state because of the stop of power supply does not consume power. Thus, the power usage of the Noff-CPU can be minimized. Moreover, the Noff-CPU can retain data necessary for operation, such as setting conditions, for a long time even when power supply is stopped. The return from the standby state requires only restart of power supply to the circuit and does not require rewriting of setting conditions or the like. In other words, high-speed return from the standby state is possible. As described here, the Noff-CPU can have a reduced power consumption without a significant decrease in operation speed.

Figure 16D:
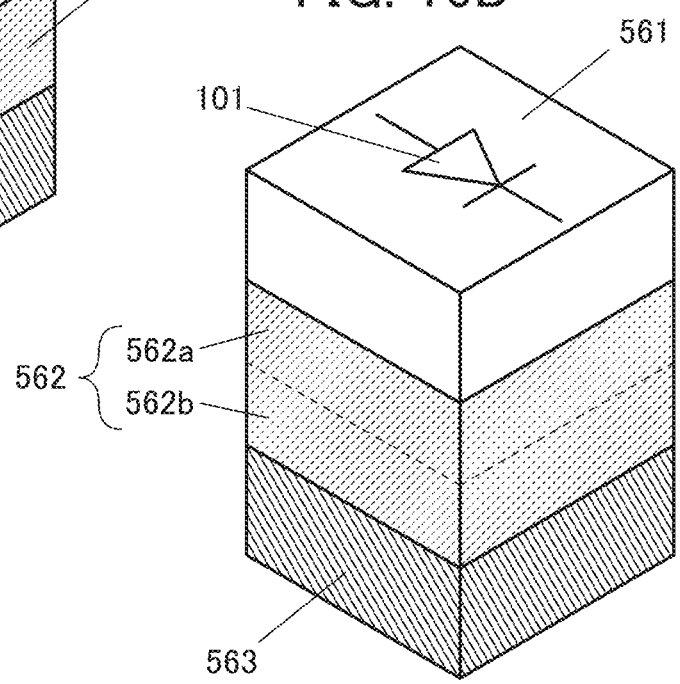

The layer 562 may be a stack of a plurality of layers as illustrated in FIG. 16D. Although FIG. 16D illustrates an example in which the layer 562 is composed of two layers 562a and 563b, a stacked-layer structure of three or more layers may be employed. These layers can be formed to be stacked over the layer 563, for example. Alternatively, the layers formed over the layer 563 and the layers formed over the layer 561 may be bonded to each other.

As a semiconductor material used for an OS transistor, a metal oxide whose energy gap is greater than or equal to 2 eV, preferably greater than or equal to 2.5 eV, further preferably greater than or equal to 3 eV can be used. A typical example thereof is an oxide semiconductor containing indium, and a CAAC-OS, a CAC-OS, each of which will be described later, or the like can be used, for example. A CAAC-OS has a crystal structure including stable atoms and is suitable for a transistor that is required to have high reliability, and the like. A CAC-OS has high mobility and is suitable for a transistor that operates at high speed, and the like.

In an OS transistor, a semiconductor layer has a large energy gap, and thus the OS transistor has an extremely low off-state current of several yoctoamperes per micrometer (current per micrometer of a channel width). An OS transistor has features such that impact ionization, an avalanche breakdown, a short-channel effect, or the like does not occur, which are different from those of a Si transistor. Thus, the use of an OS transistor enables formation of a circuit having high withstand voltage and high reliability. Moreover, variations in electrical characteristics due to crystallinity unevenness, which are caused in the Si transistor, are less likely to occur in OS transistors.

A semiconductor layer in an OS transistor can be, for example, a film represented by an In-M-Zn-based oxide that contains indium, zinc, and M (one or more selected from metals such as aluminum, titanium, gallium, germanium, yttrium, zirconium, lanthanum, cerium, tin, neodymium, and hafnium). The In-M-Zn-based oxide can be typically formed by a sputtering method. Alternatively, the In-M-Zn-based oxide may be formed by an ALD (Atomic layer deposition) method.

It is preferable that the atomic ratio of metal elements of a sputtering target used for forming the In-M-Zn-based oxide by a sputtering method satisfy In≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the formed semiconductor layer may vary from the above atomic ratio of metal elements in the sputtering target in a range of ±40%.

An oxide semiconductor with low carrier density is used for the semiconductor layer. For example, for the semiconductor layer, an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. The oxide semiconductor has a low density of defect states and can thus be referred to as an oxide semiconductor having stable characteristics.

Note that the composition is not limited to those described above, and a material having the appropriate composition may be used depending on required semiconductor characteristics and electrical characteristics of the transistor (e.g., field-effect mobility and threshold voltage). To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon, which is one of elements belonging to Group 14, is contained in the oxide semiconductor contained in the semiconductor layer, oxygen vacancies are increased, and the semiconductor layer becomes n-type. Thus, the concentration of silicon or carbon (the concentration obtained by secondary ion mass spectrometry) in the semiconductor layer is set to lower than or equal to $2\times10^{18}$ atoms/cm$^3$, preferably lower than or equal to $2\times10^{17}$ atoms/cm$^3$.

Alkali metal and alkaline earth metal might generate carriers when bonded to an oxide semiconductor, in which case the off-state current of the transistor might be increased. Therefore, the concentration of alkali metal or alkaline earth metal in the semiconductor layer (the concentration obtained by secondary ion mass spectrometry) is set to lower than or equal to $1\times10^{18}$ atoms/cm$^3$, preferably lower than or equal to $2\times10^{16}$ atoms/cm$^3$.

When nitrogen is contained in the oxide semiconductor contained in the semiconductor layer, electrons serving as carriers are generated and the carrier density increases, so that the semiconductor layer easily becomes n-type. As a result, a transistor using an oxide semiconductor that contains nitrogen is likely to have normally-on characteristics. Hence, the nitrogen concentration (the concentration obtained by secondary ion mass spectrometry) in the semiconductor layer is preferably set to lower than or equal to $5\times10^{18}$ atoms/cm$^3$.

When hydrogen is contained in the oxide semiconductor contained in the semiconductor layer, hydrogen reacts with oxygen bonded to a metal atom to be water, and thus sometimes forms oxygen vacancies in the oxide semiconductor. When the channel formation region in the oxide semiconductor includes oxygen vacancies, the transistor sometimes has normally-on characteristics. In some cases, a defect in which hydrogen enters oxygen vacancies functions as a donor and generates electrons serving as carriers. In other cases, bonding of part of hydrogen to oxygen bonded to a metal atom generates electrons serving as carriers. Thus, a transistor using an oxide semiconductor that contains a large amount of hydrogen is likely to have normally-on characteristics.

A defect in which hydrogen enters oxygen vacancies can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration of the oxide semiconductor, which is obtained by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When an oxide semiconductor with sufficiently reduced impurities such as hydrogen is used for a channel formation region of a transistor, stable electrical characteristics can be given.

The semiconductor layer may have a non-single-crystal structure, for example. Examples of the non-single-crystal structure include CAAC-OS (C-Axis Aligned Crystalline Oxide Semiconductor) including a c-axis aligned crystal, a polycrystalline structure, a microcrystalline structure, and an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. Alternatively, an oxide film having an amorphous structure has, for example, a completely amorphous structure and no crystal part.

Note that the semiconductor layer may be a mixed film including two or more of a region having an amorphous structure, a region having a microcrystalline structure, a region having a polycrystalline structure, a CAAC-OS region, and a region having a single crystal structure. The mixed film has, for example, a single-layer structure or a stacked-layer structure including two or more of the above regions in some cases.

The composition of a CAC (Cloud-Aligned Composite)-OS, which is one embodiment of a non-single-crystal semiconductor layer, will be described below.

A CAC-OS refers to one composition of a material in which elements constituting an oxide semiconductor are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in an oxide semiconductor is hereinafter referred to as a mosaic pattern or a patch-like pattern.

Note that an oxide semiconductor preferably contains at least indium. It is particularly preferable that indium and zinc be contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide (hereinafter, $InO_{X1}$ (X1 is a real number greater than 0)) or indium zinc oxide (hereinafter, $In_{X2}Zn_{Y2}O_{Z2}$ (X2, Y2, and Z2 are real numbers greater than 0)), and gallium oxide (hereinafter, $GaO_{X3}$ (X3 is a real number greater than 0)) or gallium zinc oxide (hereinafter, $Ga_{X4}Zn_{Y4}O_{Z4}$ (X4, Y4, and Z4 are real numbers greater than 0)), and a mosaic pattern is formed. Then, $InO_{X1}$ or $In_{X2}Zn_{Y2}O_{Z2}$ forming the mosaic pattern is evenly distributed in the film (this composition is hereinafter also referred to as a cloud-like composition).

That is, the CAC-OS is a composite oxide semiconductor having a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ ($-1\leq x0 \leq 1$; m0 is a given number).

The above crystalline compound has a single crystal structure, a polycrystalline structure, or a CAAC structure. Note that the CAAC structure is a crystal structure in which a plurality of IGZO nanocrystals have c-axis alignment and are connected in the a-b plane without alignment.

On the other hand, the CAC-OS relates to the material composition of an oxide semiconductor. The CAC-OS refers to a composition in which, in the material composition containing In, Ga, Zn, and O, some regions that include Ga as a main component and are observed as nanoparticles and some regions that include In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film including In as a main component and a film including Ga as a main component is not included.

Note that a clear boundary cannot sometimes be observed between the region including $GaO_{X3}$ as a main component and the region including $In_{X2}Zn_{Y2}O_{Z2}$ or $InO_{X1}$ as a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRD) measurement methods. That is, it is found from the X-ray diffraction measurement that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanobeam electron beam), a ring-like high-luminance region (ring region) and a plurality of bright spots in the ring region are observed. It is therefore found from the electron diffraction pattern that the crystal structure of the CAC-OS includes an nc (nano-crystal) structure with no alignment in the plan-view direction and the cross-sectional direction.

Moreover, for example, it can be confirmed by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a composition different from that of an IGZO compound in which the metal elements are evenly distributed, and has characteristics different from those of the IGZO compound. That is, in the CAC-OS, the region including $GaO_{X3}$ or the like as a main component and the region including $In_{X2}Zn_{Y2}O_{Z2}$ or $InO_{X1}$ as a main component are separated to form a mosaic pattern.

Here, a region including $In_{X2}Zn_{Y2}O_{Z2}$ or $InO_{X1}$ as a main component is a region whose conductivity is higher than that of a region including $GaO_{X3}$ or the like as a main component. In other words, when carriers flow through the regions including $In_{X2}Zn_{Y2}O_{Z2}$ or $InO_{X1}$ as a main component, the conductivity of an oxide semiconductor is exhibited. Accordingly, when the regions including $In_{X2}Zn_{Y2}O_{Z2}$ or $InO_{X1}$ as a main component are distributed in an oxide semiconductor like a cloud, high field-effect mobility (μ) can be achieved.

By contrast, a region including $GaO_{X3}$ or the like as a main component is a region whose insulating property is higher than that of a region including $In_{X2}Zn_{Y2}O_{Z2}$ or $InO_{X1}$ as a main component. In other words, when the regions including $GaO_{X3}$ or the like as a main component are distributed in an oxide semiconductor, leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and high field-effect mobility (μ) can be achieved.

A semiconductor element using the CAC-OS has high reliability. Thus, the CAC-OS is suitably used as a constituent material of a variety of semiconductor devices.

<Stacked-Layer Structure 1>

Next, a stacked-layer structure of the imaging device will be described with reference to a cross-sectional view. Note that components such as insulating layers and conductive layers are described below as examples, and other components may be further included. Alternatively, some components described below may be omitted. A stacked-layer structure described below can be formed by a bonding process, a polishing process, or the like as needed.

Figure 18:
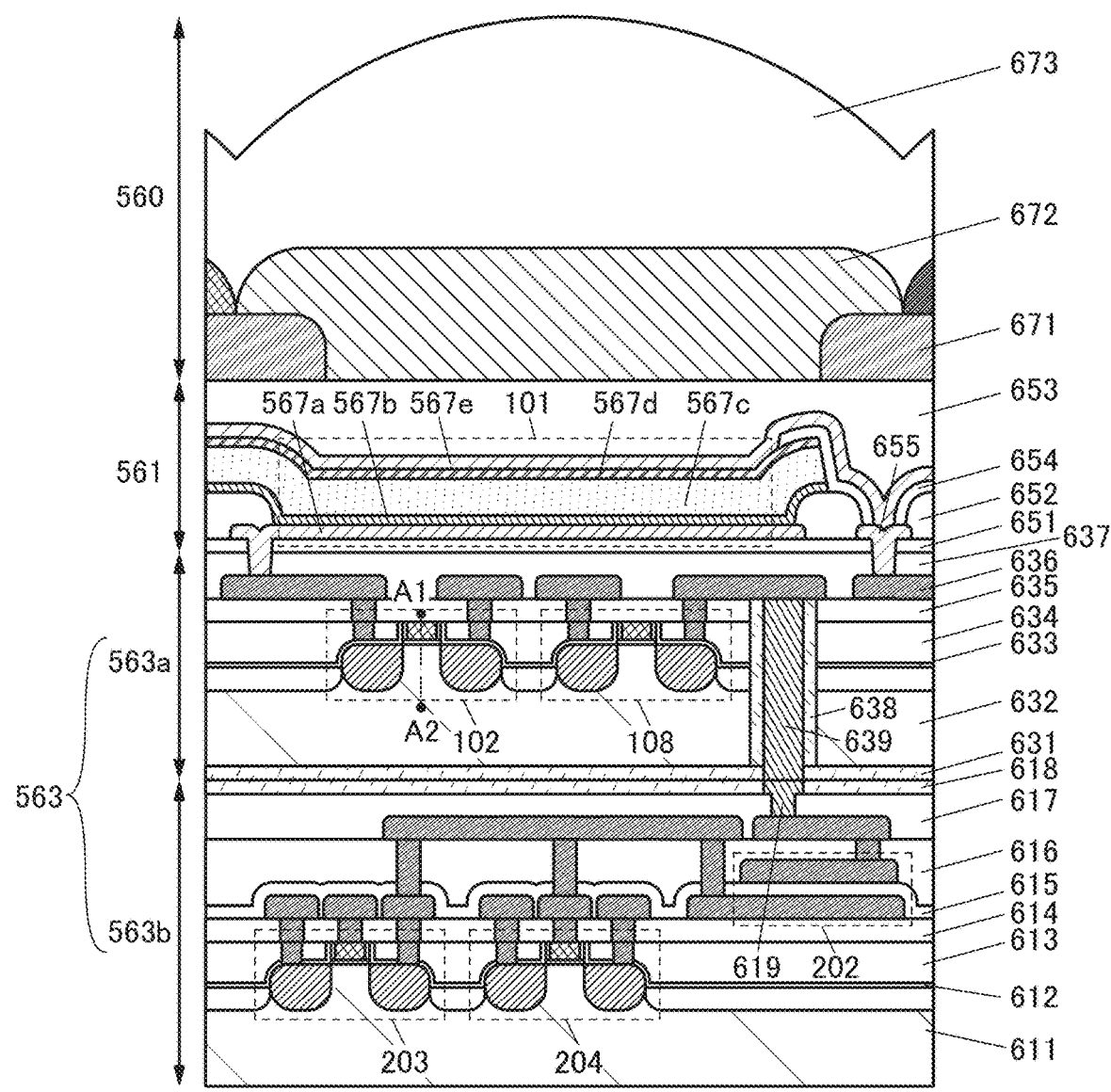
FIG. 18 is a cross-sectional view illustrating a pixel.

FIG. 18 is an example of a cross-sectional view of a stack including layers 560 and 561 and the layer 563 and including a bonding surface between the layer 563a and the layer 563b of the layer 563.

<Layer 563b>

The layer 563b includes a functional circuit provided on a silicon substrate 611. Here, the capacitor 202, the transistor 203, and the transistor 204 each of which is included in the circuit 201 are illustrated as part of the functional circuit. One electrode of the capacitor 202, one of the source and the drain of the transistor 203, and the gate of the transistor 204 are electrically connected to one another.

The silicon substrate 611 and insulating layers 612, 613, 614, 615, 616, 617, and 618 are provided in the layer 563b. The insulating layer 612 functions as a protective film. The insulating layers 613, 613, 616, and 617 function as interlayer insulating films and planarization films. The insulating layer 615 functions as a dielectric layer of the capacitor 202. The insulating layer 618 and a conductive layer 619 function as bonding layers. The conductive layer 619 is electrically connected to the one electrode of the capacitor 202.

As the protective film, for example, a silicon nitride film, a silicon oxide film, an aluminum oxide film, or the like can be used. As the interlayer insulating film and the planarization film, for example, an inorganic insulating film such as a silicon oxide film or an organic insulating film of an acrylic resin, a polyimide resin, or the like can be used. As the dielectric layer of the capacitor, a silicon nitride film, a silicon oxide film, an aluminum oxide film, or the like can be used. The bonding layers will be described later.

As a conductor that can be used for a wiring, an electrode, and a plug used for electrical connection between devices, a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like is selected and used as appropriate. The conductor is not limited to a single layer, and may be a plurality of layers including different materials.

<Layer 563a>

The layer 563a includes the components of the pixel 100. Here, the transistor 102 and the transistor 108 are illustrated as some of the components of the pixel 100. In the cross-sectional view illustrated in FIG. 18, electrical connection between the transistors is not illustrated.

A silicon substrate 632 and insulating layers 631, 633, 634, 635, 637, and 638 are provided in the layer 563a. In addition, conductive layers 636 and 639 are provided.

The insulating layer 631 and the conductive layer 639 function as bonding layers. The insulating layers 634, 635, and 637 function as interlayer insulating films and planarization films. The insulating layer 633 functions as a protective film. The insulating layer 638 has a function of insulating the silicon substrate 632 from the conductive layer 639. The insulating layer 638 can be formed using a material similar to that for another insulating layer. The insulating layer 638 may be formed using the same material as that for the insulating layer 631.

The conductive layer 639 is electrically connected to the other of the source and the drain of the transistor 108 and the conductive layer 619. The conductive layer 636 is electrically connected to the wiring 113 (see FIG. 3A).

Figure 19A:
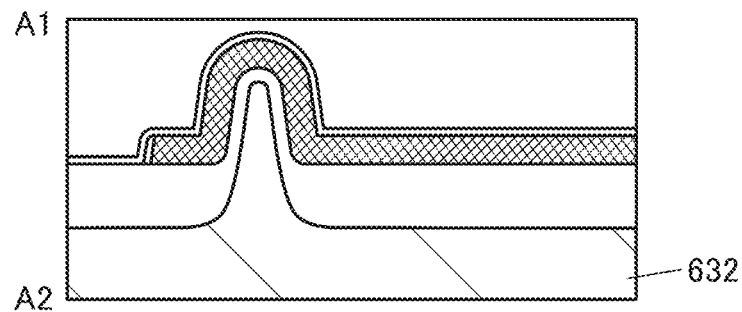
FIG. 19A to FIG. 19C are diagrams illustrating Si transistors.
Figure 19B:
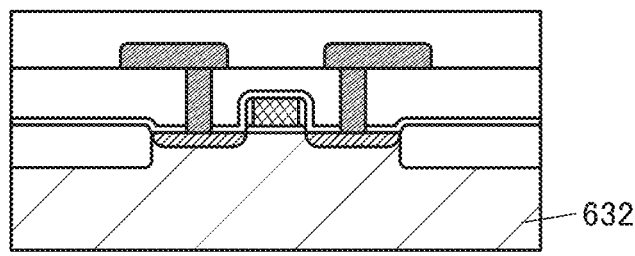

Si transistors illustrated in FIG. 18 are fin-type transistors including channel formation regions in the silicon substrates (the silicon substrates 611 and 632). FIG. 19A illustrates a cross section (a cross section along A1-A2 in the layer 563a in FIG. 18) in the channel width direction. Note that the Si transistors may each be a planar-type transistor as illustrated in FIG. 19B.

Figure 19C:
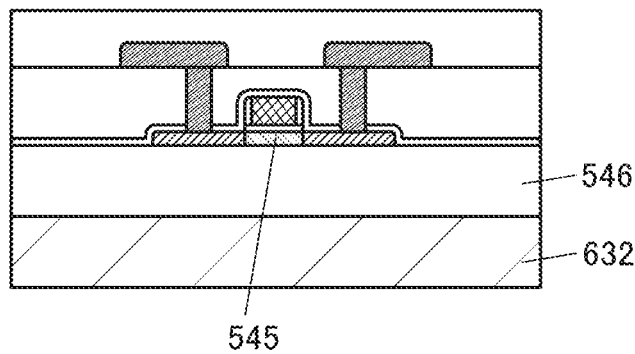

Alternatively, as illustrated in FIG. 19C, a transistor including a semiconductor layer 545 of a silicon thin film may be used. The semiconductor layer 545 can be single crystal silicon (SOI (Silicon on Insulator)) formed on an insulating layer 546 on the silicon substrate 611, for example.

<Layer 561>

The layer 561 includes the photoelectric conversion device 101. The photoelectric conversion device 101 can be formed over the layer 563a. FIG. 18 illustrates the photoelectric conversion device 101 having a structure in which the organic photoconductive film illustrated in FIG. 17C is used as the photoelectric conversion layer. Here, the layer 567a is a cathode, and the layer 567e is an anode.

Insulating layers 651, 652, 653, and 654 and a conductive layer 655 are provided in the layer 561.

The insulating layers 651, 653, and 654 function as interlayer insulating films and planarization films. The insulating layer 654 is provided to cover an end portion of the photoelectric conversion device 101, and has a function of preventing a short circuit between the layer 567e and the layer 567a. The insulating layer 652 functions as an element isolation layer. An organic insulating film or the like is preferably used as the element isolation layer.

The layer 567a corresponding to the cathode of the photoelectric conversion device 101 is electrically connected to one of the source and the drain of the transistor 102 included in the layer 563a. The layer 567e corresponding to the anode of the photoelectric conversion device 101 is electrically connected to the conductive layer 636 included in the layer 563a through the conductive layer 655.

<Layer 560>

The layer 560 is formed over the layer 561. The layer 560 includes a light-blocking layer 671, an optical conversion layer 672, and a microlens array 673.

The light-blocking layer 671 can suppress entry of light into an adjacent pixel. As the light-blocking layer 671, a metal layer of aluminum, tungsten, or the like can be used. The metal layer and a dielectric film functioning as an anti-reflection film may be stacked.

As the optical conversion layer 672, a color filter can be used. When colors of (red), G (green), B (blue), Y (yellow), C (cyan), M (magenta), and the like are assigned to the color filters of respective pixels, a color image can be obtained.

When a wavelength cut filter is used as the optical conversion layer 672, the imaging device can capture images in various wavelength regions.

For example, when a filter that blocks light having a wavelength shorter than or equal to that of visible light is used as the optical conversion layer 672, an infrared imaging device can be obtained. When a filter that blocks light having a wavelength shorter than or equal to that of near infrared light is used as the optical conversion layer 672, a far-infrared imaging device can be obtained. When a filter that blocks light having a wavelength longer than or equal to that of visible light is used as the optical conversion layer 672, an ultraviolet imaging device can be obtained.

Furthermore, when a scintillator is used as the optical conversion layer 672, an imaging device that obtains an image visualizing the intensity of radiation, which is used for an X-ray imaging device or the like, can be obtained. Radiation such as X-rays passes through an object and enters the scintillator, and then is converted into light (fluorescence) such as visible light or ultraviolet light owing to a photoluminescence phenomenon. Then, the photoelectric conversion device 101 detects the light to obtain image data. Furthermore, the imaging device having this structure may be used in a radiation detector or the like.

A scintillator contains a substance that, when irradiated with radiation such as X-rays or gamma-rays, absorbs energy of the radiation to emit visible light or ultraviolet light. For example, a resin or ceramics in which $Gd_2O_2S$:Tb, $Gd_2O_2S$:Pr, $Gd_2O_2S$:Eu, $BaFCl$:Eu, NaI, CsI, $CaF_2$, $BaF_2$, $CeF_3$, LiF, LiI, ZnO, or the like is dispersed can be used.

The microlens array 673 is provided over the optical conversion layer 672. Light passing through an individual lens of the microlens array 673 goes through the optical conversion layer 672 directly under the lens, and the photoelectric conversion device 101 is irradiated with the light. With the microlens array 673, collected light can be incident on the photoelectric conversion device 101; thus, photoelectric conversion can be efficiently performed. The microlens array 673 is preferably formed using a resin, glass, or the like with a high visible-light transmitting property.

<Bonding>

Next, bonding of the layer 563b and the layer 563a will be described.

The insulating layer 618 and the conductive layer 619 are provided in the layer 563b. The conductive layer 619 includes a region embedded in the insulating layer 618. Furthermore, the surfaces of the insulating layer 618 and the conductive layer 619 are planarized to be level with each other.

The insulating layer 631 and the conductive layer 639 are provided in the layer 563a. The conductive layer 639 includes a region embedded in the insulating layer 631. Furthermore, the surfaces of the insulating layer 631 and the conductive layer 639 are planarized to be level with each other.

Here, a main component of the conductive layer 619 and a main component of the conductive layer 639 are preferably the same metal element. Furthermore, the insulating layer 618 and the insulating layer 631 are preferably formed of the same component.

For the conductive layers 619 and 639, Cu, Al, Sn, Zn, W, Ag, Pt, or Au can be used, for example. Preferably, Cu, Al, W, or Au is used for easy bonding. In addition, for the insulating layers 618 and 631, silicon oxide, silicon oxynitride, silicon nitride oxide, silicon nitride, titanium nitride, or the like can be used.

That is, the same metal material described above is preferably used for the conductive layer 619 and the conductive layer 639. Furthermore, the same insulating material described above is preferably used for the insulating layer 618 and the insulating layer 631. With this structure, bonding can be performed at the boundary between the layer 563b and the layer 563a.

Note that the conductive layer 619 and the conductive layer 639 may each have a multilayer structure of a plurality of layers; in that case, the outer layers (bonding surfaces) are formed of the same metal material. The insulating layer 618 and the insulating layer 631 may each have a multilayer structure of a plurality of layers; in that case, the outer layers (bonding surfaces) are formed of the same insulating material.

Through the above bonding, the electrical connection between the conductive layer 619 and the conductive layer 639 can be obtained. Moreover, the connection between the insulating layer 618 and the insulating layer 631 with mechanical strength can be obtained.

For bonding metal layers to each other, a surface activated bonding method in which an oxide film, a layer adsorbing impurities, and the like on the surface are removed by sputtering or the like and the cleaned and activated surfaces are brought into contact to be bonded to each other can be used. Alternatively, a diffusion bonding method in which the surfaces are bonded to each other by using temperature and pressure together can be used, for example. Both methods cause bonding at an atomic level, and therefore not only electrically but also mechanically excellent bonding can be obtained.

Furthermore, for bonding insulating layers to each other, a hydrophilic bonding method or the like can be used; in the method, after high planarity is obtained by polishing or the like, the surfaces of the insulating layers subjected to hydrophilicity treatment with oxygen plasma or the like are arranged in contact with and bonded to each other temporarily, and then dehydrated by heat treatment to perform final bonding. The hydrophilic bonding method can also cause bonding at an atomic level; thus, mechanically excellent bonding can be obtained.

When the layer 563b and the layer 563a are bonded to each other, the insulating layers and the metal layers coexist on their bonding surfaces; therefore, the surface activated bonding method and the hydrophilic bonding method are performed in combination, for example.

For example, a method can be used in which the surfaces are made clean after polishing, the surfaces of the metal layers are subjected to antioxidant treatment and hydrophilicity treatment, and then bonding is performed. Furthermore, hydrophilicity treatment may be performed on the surfaces of the metal layers being hardly oxidizable metal such as Au. Note that a bonding method other than the above-mentioned methods may be used.

The above bonding allows the circuit 201 included in the layer 563b to be electrically connected to the components of the pixel 100 included in the layer 563a.

<Modification Example of Stacked-Layer Structure 1>

Figure 20:
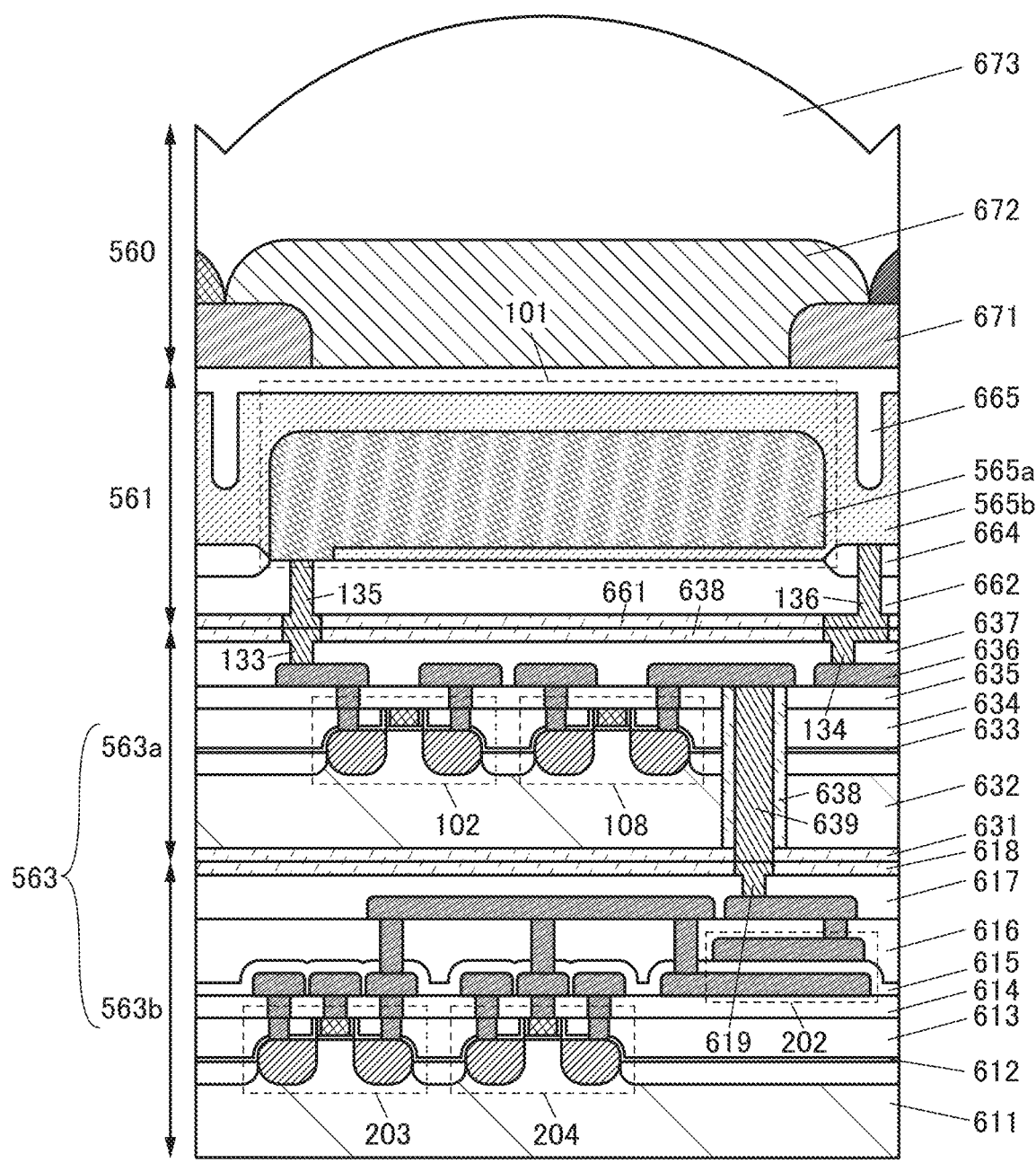
FIG. 20 is a cross-sectional view illustrating a pixel.

FIG. 20 is a modification example of the stacked-layer structure illustrated in FIG. 18 and differs from FIG. 18 in the structure of the photoelectric conversion device 101 included in the layer 561 and part of the structure of the layer 563a; a bonding surface is also included between the layer 561 and the layer 563a.

The layer 561 includes the photoelectric conversion device 101, insulating layers 661, 662, 664, and 665, and conductive layers 135 and 136.

The photoelectric conversion device 101 is a pn-junction photodiode formed on a silicon substrate and includes the layer 565b corresponding to a p-type region and the layer 565a corresponding to an n-type region. The photoelectric conversion device 101 is a pinned photodiode, which can suppress dark current and reduce noise with the thin p-type region (part of the layer 565b) provided on the surface side (current extraction side) of the layer 565a.

The insulating layer 661 and the conductive layers 135 and 136 function as bonding layers. The insulating layer 662 functions as an interlayer insulating film and a planarization film. The insulating layer 664 functions as an element isolation layer. The insulating layer 665 has a function of suppressing carrier leakage.

The silicon substrate is provided with an opening portion that separates pixels, and the insulating layer 665 is provided on the top surface of the silicon substrate and in the opening portion. The insulating layer 665 can suppress leakage of carriers generated in the photoelectric conversion device 101 to an adjacent pixel. The insulating layer 665 also has a function of suppressing entry of stray light. Therefore, color mixture can be suppressed with the insulating layer 665. Note that an anti-reflection film may be provided between the top surface of the silicon substrate and the insulating layer 665.

The element isolation layer can be formed by a LOCOS (LOCal Oxidation of Silicon) method. Alternatively, an STI (Shallow Trench Isolation) method or the like may be used to form the element isolation layer. As the insulating layer 665, for example, an inorganic insulating film of silicon oxide, silicon nitride, or the like or an organic insulating film of polyimide, acrylic, or the like can be used. The insulating layer 665 may have a multilayer structure.

The layer 565a (corresponding to the n-type region and the cathode) of the photoelectric conversion device 101 is electrically connected to the conductive layer 135. The layer 565b (corresponding to the p-type region and the anode) is electrically connected to the conductive layer 136. The conductive layers 135 and 136 each include a region embedded in the insulating layer 661. Furthermore, the surfaces of the insulating layer 661 and the conductive layers 135 and 136 are planarized to be level with each other.

In the layer 563a, the insulating layer 638 is formed over the insulating layer 637. In addition, a conductive layer 133 electrically connected to one of the source and the drain of the transistor 102 and a conductive layer 134 electrically connected to the conductive layer 636 are formed.

The insulating layer 638 and the conductive layers 133 and 134 function as bonding layers. The conductive layers 133 and 134 each include a region embedded in the insulating layer 638. Furthermore, the surfaces of the insulating layer 638 and the conductive layers 133 and 134 are planarized to be level with each other.

Here, the conductive layers 133, 134, 135, and 136 are the same bonding layers as the above-described conductive layers 619 and 639. The insulating layers 638 and 661 are the same bonding layers as the above-described insulating layers 618 and 631.

Thus, when the conductive layer 133 and the conductive layer 135 are bonded to each other, the layer 565a (corresponding to the n-type region and the cathode) of the photoelectric conversion device can be electrically connected to the one of the source and the drain of the transistor 102. In addition, when the conductive layer 134 and the conductive layer 136 are bonded to each other, the layer 565b (corresponding to the p-type region and the anode) of the photoelectric conversion device can be electrically connected to the wiring 113 (see FIG. 3). When the insulating layer 638 and the insulating layer 661 are bonded to each other, electrical bonding and mechanical bonding of the layer 561 and the layer 563a can be performed.

<Stacked-Layer Structure 2>

Figure 21:
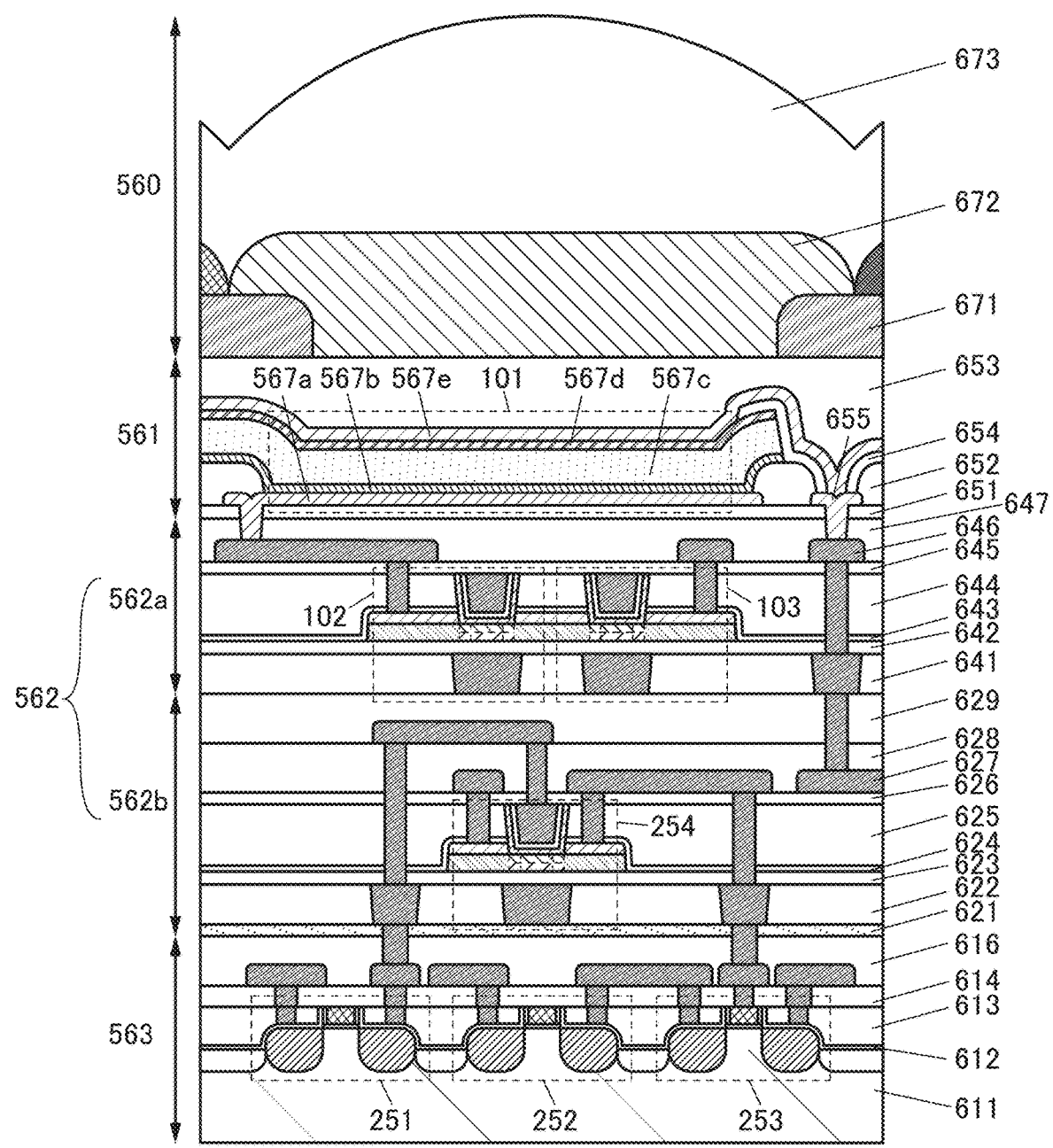
FIG. 21 is a cross-sectional view illustrating a pixel.

FIG. 21 is an example of a cross-sectional view of a stack including the layers 560, 561, 562, and 563 and not including a bonding surface. Si transistors are provided in the layer 563. OS transistors are provided in the layer 562. Here, an example will be described in which components of a memory circuit are provided in the layer 562 and the layer 563 and a driver circuit for the memory circuit is provided in the layer 563. Note that the structures of the layer 561 and the layer 560 are the same as those illustrated in FIG. 18; thus, the description thereof is omitted here.

<Layer 563>

The layer 563 includes a functional circuit provided on the silicon substrate 611. Here, a transistor 251 included in the driver circuit for the memory circuit and transistors 252 and 253 included in the memory circuit are illustrated as part of the functional circuit.

<Layer 562b>

The layer 562b is formed over the layer 563. The layer 562b includes an OS transistor. Here, a transistor 254 is illustrated as part of the memory circuit.

Insulating layers 621, 622, 623, 624, 625, 626, 628, and 629 are provided in the layer 562b. Moreover, a conductive layer 627 is provided. The conductive layer 627 can be electrically connected to the wiring 113 (see FIG. 3).

The insulating layer 621 functions as a blocking layer. The insulating layers 622, 623, 625, 626, 628, and 629 function as interlayer insulating films and planarization films. The insulating layer 624 functions as a protective film.

As the blocking layer, a film that has a function of preventing hydrogen diffusion is preferably used. In a Si device, hydrogen is necessary to terminate dangling bonds; however, hydrogen in the vicinity of an OS transistor is one factor of generating carriers in an oxide semiconductor layer, which leads to a decrease in reliability. Therefore, a hydrogen blocking film is preferably provided between a layer in which the Si device is formed and a layer in which the OS transistor is formed.

For the blocking film, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ) can be used.

Note that the memory circuits included in the layer 563 and the layer 562b include the transistor 254, the transistor 253, and the transistor 252 in their memory cells. One of the source and the drain of the transistor 254 is electrically connected to a gate of the transistor 253. A gate of the transistor 254 is electrically connected to the transistor 251 included in the driver circuit for the memory circuit.

In the memory cell, the gate of the transistor 253 functions as a data retention portion and data writing is performed in the transistor 254. The transistor 252 is turned on, whereby reading from the memory cell is performed. The use of an OS transistor with a low off-state current as the transistor 254 connected to the data retention portion can lengthen data retention time. Refer to the description of a NOSRAM and the like in the following embodiment for the details.

Figure 22A:
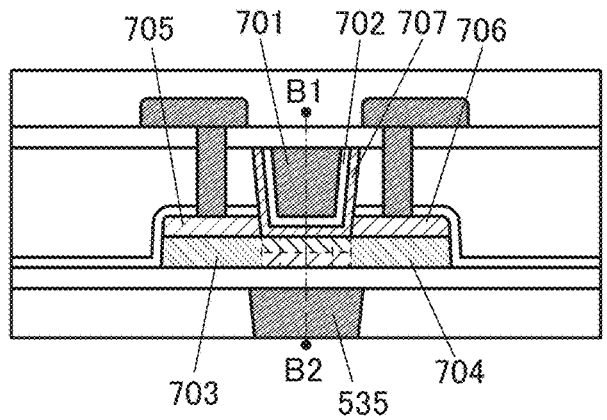
FIG. 22A to FIG. 22D are diagrams illustrating OS transistors.

The details of an OS transistor are illustrated in FIG. 22A. The OS transistor illustrated in FIG. 22A has a self-aligned structure in which a source electrode 705 and a drain electrode 706 are formed through provision of an insulating layer over a stacked layer of an oxide semiconductor layer and a conductive layer and provision of opening portions reaching the oxide semiconductor layer.

The OS transistor can include a gate electrode 701 and a gate insulating film 702 in addition to a channel formation region, a source region 703, and a drain region 704, which are formed in the oxide semiconductor layer. At least the gate insulating film 702 and the gate electrode 701 are provided in the opening portion. The groove may further be provided with an oxide semiconductor layer 707.

Figure 22B:
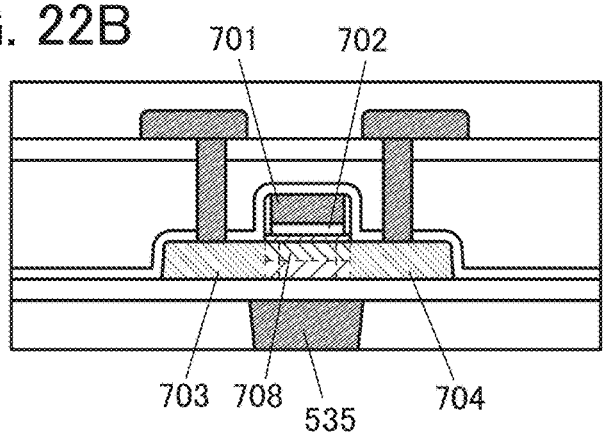

As illustrated in FIG. 22B, the OS transistor may have a self-aligned structure in which the source region 703 and the drain region 704 are formed in the semiconductor layer with the gate electrode 701 as a mask.

Figure 22C:
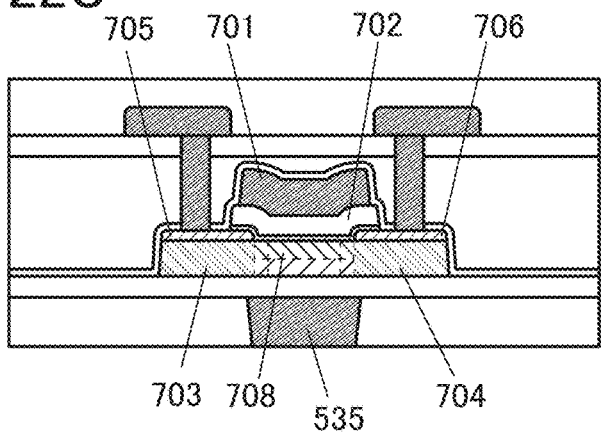

As illustrated in FIG. 22C, the OS transistor may be a non-self-aligned top-gate transistor including a region where the source electrode 705 or the drain electrode 706 overlaps with the gate electrode 701.

Figure 22D:
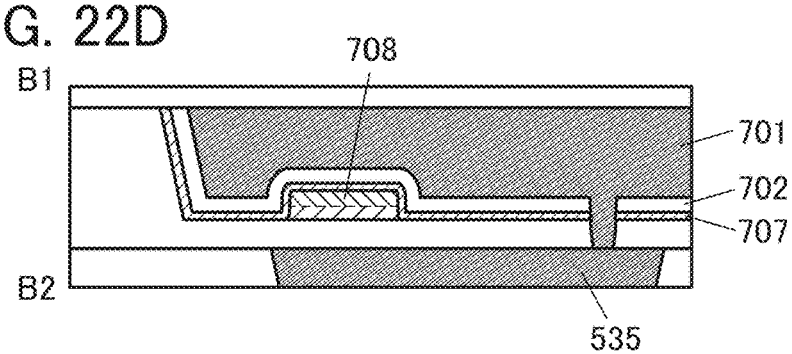

Although the OS transistor has a structure with a back gate 535, it may have a structure without a back gate. As illustrated in a cross-sectional view of the transistor in the channel width direction in FIG. 22D, the back gate 535 may be electrically connected to a front gate of the transistor, which is provided to face the back gate. Note that FIG. 22D illustrates an example of a B1-B2 cross section of the transistor in FIG. 22A, and the same applies to a transistor having any of the other structures. Different fixed potentials may be supplied to the back gate 535 and the front gate.

<Layer 562a>

The layer 562a is formed over the layer 562b. The layer 562a includes the components of the pixel 100 including OS transistors. Here, the transistor 102 and the transistor 103 are illustrated as some of the components of the pixel 100.

Insulating layers 641, 642, 643, 644, 645, and 647 are provided in the layer 562a. Moreover, a conductive layer 646 is provided.

The insulating layers 641, 642, 644, 645, and 647 function as interlayer insulating films and planarization films. The insulating layer 643 functions as a protective film.

One of the source and the drain of the transistor 102 is electrically connected to the cathode of the photoelectric conversion device 101 included in the layer 561. The conductive layer 646 is electrically connected to the anode of the photoelectric conversion device 101 included in the layer 561 and the conductive layer 627 included in the layer 562b.

Although not illustrated in the cross-sectional view in FIG. 21, a pixel circuit included in the layer 562a can be electrically connected to the circuit 201 included in the layer 563. The circuit 201 can be electrically connected to another functional circuit.

<Modification Example of Stacked-Layer Structure 2>

Figure 23:
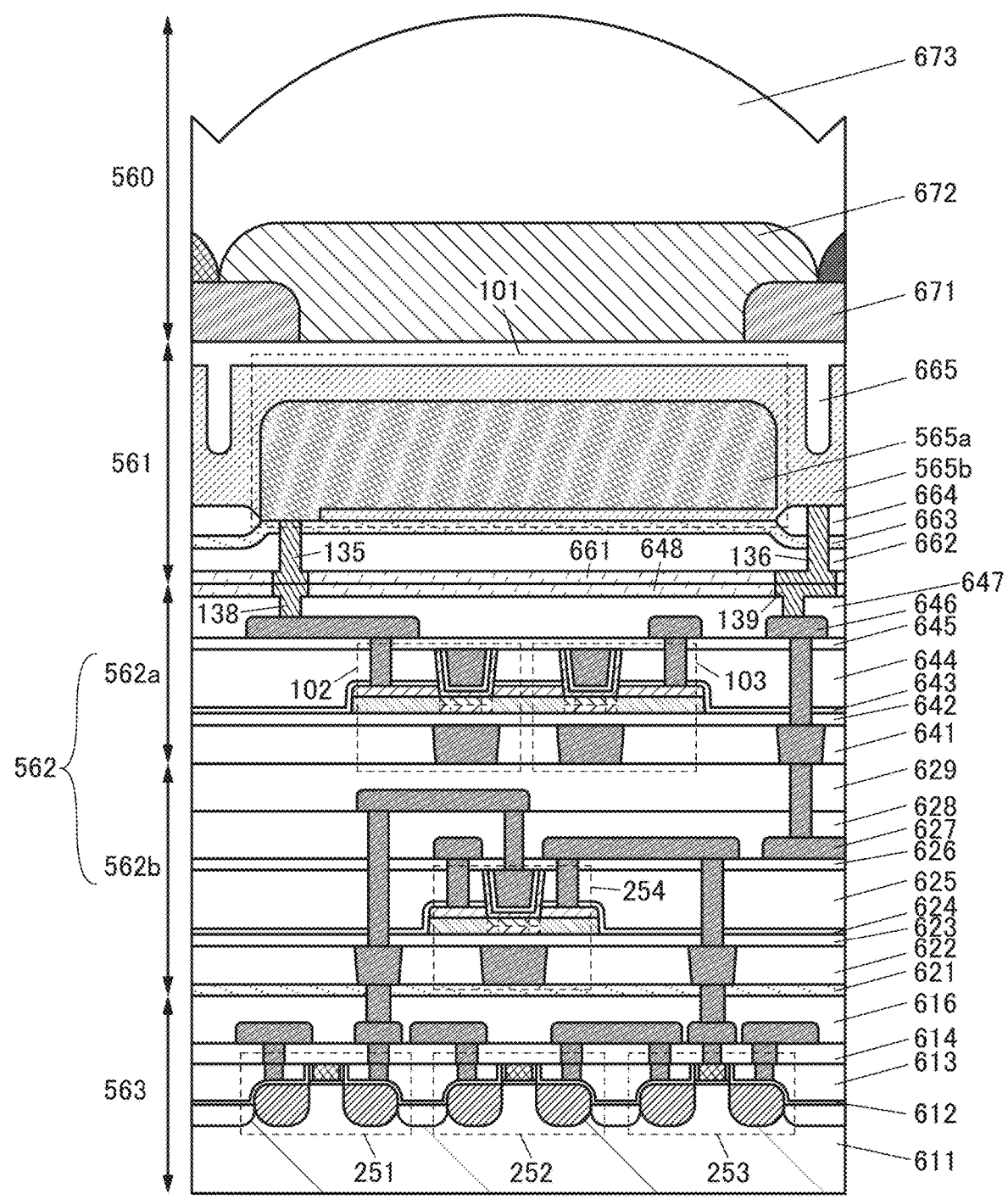
FIG. 23 is a cross-sectional view illustrating a pixel.

FIG. 23 is a modification example of the stacked-layer structure illustrated in FIG. 22 and differs from FIG. 22 in the structure of the photoelectric conversion device 101 included in the layer 561 and part of the structure of the layer 562a; a bonding surface is included between the layer 561 and the layer 562a.

The photoelectric conversion device 101 included in the layer 561 is a pn-junction photodiode formed on a silicon substrate and has a structure similar to that illustrated in FIG. 20.

In the layer 562a, an insulating layer 648 is formed over the insulating layer 647. In addition, a conductive layer 138 electrically connected to one of the source and the drain of the transistor 102 and a conductive layer 139 electrically connected to the conductive layer 646 are formed.

The insulating layer 648 and the conductive layers 138 and 139 function as bonding layers. The conductive layers 138 and 139 each include a region embedded in the insulating layer 648. Furthermore, the surfaces of the insulating layer 648 and the conductive layers 133 and 134 are planarized to be level with each other.

Here, the conductive layers 138 and 139 are the same bonding layers as the above-described conductive layers 619 and 639. The insulating layer 648 is the same bonding layer as the above-described insulating layers 618 and 631.

Thus, when the conductive layer 138 and the conductive layer 135 are bonded to each other, the layer 565a (corresponding to the n-type region and the cathode) of the photoelectric conversion device can be electrically connected to the one of the source and the drain of the transistor 102. In addition, when the conductive layer 139 and the conductive layer 136 are bonded to each other, the layer 565b (corresponding to the p-type region and the anode) of the photoelectric conversion device can be electrically connected to the wiring 113 (see FIG. 3). When the insulating layer 648 and the insulating layer 661 are bonded to each other, electrical bonding and mechanical bonding of the layer 561 and the layer 562a can be performed.

In the case where a plurality of Si devices are stacked, a polishing step and a bonding step are required to be performed a plurality of times. Consequently, there are issues such as a large number of manufacturing steps, the need for a dedicated apparatus, and a low yield, and the manufacturing cost is high. An OS transistor can be formed to be stacked over a silicon substrate on which a device is formed, and thus a bonding step can be skipped.

FIG. 24A1 is an external perspective view of the top surface side of a package in which an image sensor chip is placed. The package includes a package substrate 410 to which an image sensor chip 450 (see FIG. 24A3) is fixed, a cover glass 420, an adhesive 430 for bonding them, and the like.

FIG. 24A2 is an external perspective view of the bottom surface side of the package. A BGA (Ball grid array) in which solder balls are used as bumps 440 on the bottom surface of the package is employed. Note that, without being limited to the BGA, an LGA (Land grid array), a PGA (Pin Grid Array), or the like may be employed.

Figure 26A:
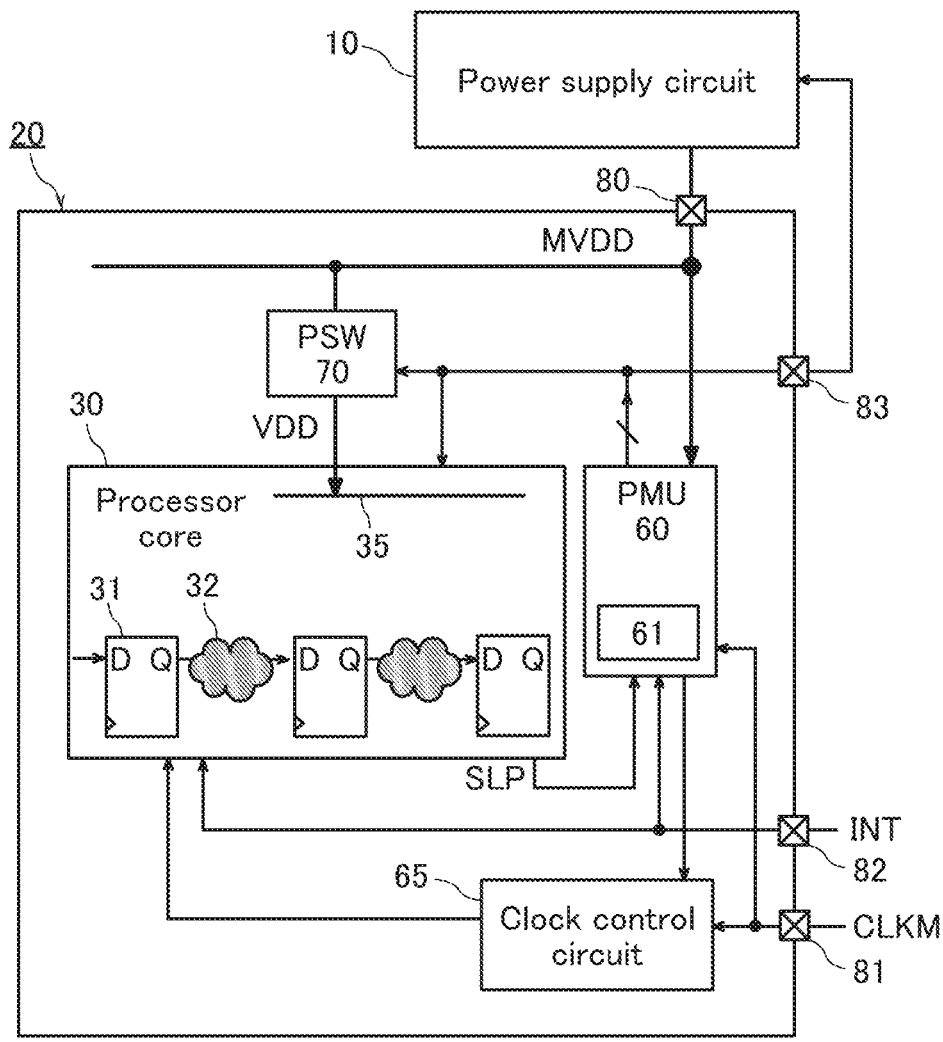
FIG. 26A and FIG. 26B are block diagrams illustrating a structure example of a semiconductor device.

FIG. 26A3 is a perspective view of the package, in which parts of the cover glass 420 and the adhesive 430 are not illustrated. Electrode pads 460 are formed over the package substrate 410, and the electrode pads 460 and the bumps 440 are electrically connected to each other via through-holes. The electrode pads 460 are electrically connected to the image sensor chip 450 through wires 470.

FIG. 24B1 is an external perspective view of the top surface side of a camera module in which an image sensor chip is placed in a package with a built-in lens. The camera module includes a package substrate 411 to which an image sensor chip 451 (FIG. 24B3) is fixed, a lens cover 421, a lens 435, and the like. Furthermore, an IC chip 490 (FIG. 24B3) having functions of a driver circuit, a signal conversion circuit, and the like of an imaging device is provided between the package substrate 411 and the image sensor chip 451; thus, the structure as an SiP (System in package) is included.

FIG. 24B2 is an external perspective view of the bottom surface side of the camera module. A QFN (Quad flat no-lead package) structure in which lands 441 for mounting are provided on the bottom surface and side surfaces of the package substrate 411 is employed. Note that this structure is only an example, and a QFP (Quad flat package) or the above-mentioned BGA may also be provided.

FIG. 24B3 is a perspective view of the module, in which parts of the lens cover 421 and the lens 435 are not illustrated. The lands 441 are electrically connected to electrode pads 461, and the electrode pads 461 are electrically connected to the image sensor chip 451 or the IC chip 490 through wires 471.

The image sensor chip placed in a package having the above form can be easily mounted on a printed substrate or the like, and the image sensor chip can be incorporated into a variety of semiconductor devices and electronic devices.

This embodiment can be combined with any of the other embodiments as appropriate.

Embodiment 3

In this embodiment, a memory circuit that can be used as the functional circuit described in Embodiment 2 and can form a stack with the pixel circuit will be described.

The memory circuit can store data captured in the pixel circuit or product-sum operation results. Thus, an imaging device including the memory circuit can perform high-speed image capturing and arithmetic operation.

FIG. 25A illustrates the connection relation between components (a memory cell 321a, a row driver 312, and a column driver 313) included in a memory circuit 321. An OS transistor is preferably used as a transistor included in the memory cell 321a.

The memory circuit 321 includes m×n memory cells 321a in total; m memory cells (m is an integer greater than or equal to 1) in a column and n memory cells (n is an integer greater than or equal to 1) in a row, and the memory cells 321a are arranged in a matrix. FIG. 25A also illustrates addresses of the memory cells 321a. For example, [1,1] represents a memory cell 321a positioned at an address of the first row and the first column, and [i,j] (i is an integer of 1 to m, and j is an integer of 1 to n) represents a memory cell 321a positioned at an address of the i-th row and the j-th column. The number of wirings connecting the memory circuit 321 and the row driver 312 is determined by the structure of the memory cell 321a, the number of memory cells 321a included in one column, or the like. The number of wirings connecting the memory circuit 321 and the column driver 313 is determined by the structure of the memory cell 321a, the number of memory cells 321a included in one row, or the like.

FIG. 25B to FIG. 25E illustrate a memory cell 321aA to a memory cell 321aD that can be used as the memory cell 321a. Note that in the following description, a bit line and the like can be connected to the column driver 313. A word line and the like can be connected to the row driver 312.

For the row driver 312 and the column driver 313, a decoder or a shift register can be used, for example. Note that a plurality of row drivers 312 and a plurality of column drivers 313 may be provided.

[DOSRAM]

FIG. 25B illustrates a circuit structure example of the memory cell 321aA of a DRAM type. In this specification and the like, a DRAM using an OS transistor is referred to as a DOSRAM (Dynamic Oxide Semiconductor Random Access Memory). The memory cell 321aA includes a transistor M11 and a capacitor Cs.

A first terminal of the transistor M11 is connected to a first terminal of the capacitor Cs, a second terminal of the transistor M11 is connected to a wiring BIL, a gate of the transistor M11 is connected to a wiring WL, and a back gate of the transistor M11 is connected to a wiring BGL. A second terminal of the capacitor Cs is connected to a wiring GNDL. The wiring GNDL is a wiring for supplying a low-level potential (reference potential).

The wiring BIL functions as a bit line. The wiring WL functions as a word line. The wiring BGL functions as a wiring for applying a potential to the back gate of the transistor M11. By applying a given potential to the wiring BGL, the threshold voltage of the transistor M11 can be increased or decreased.

Data writing and reading are performed in such a manner that a high-level potential is applied to the wiring WL to turn on the transistor M11 so that the wiring BIL is electrically connected to the first terminal of the capacitor Cs.

An OS transistor is preferably used as the transistor M11. An oxide semiconductor including one of indium, an element M (the element M is one or more of aluminum, gallium, yttrium, and tin), and zinc is preferably used for a semiconductor layer of the OS transistor. In particular, an oxide semiconductor including indium, gallium, and zinc is preferably used.

The OS transistor using the oxide semiconductor including indium, gallium, and zinc has a feature of an extremely low off-state current. The use of the OS transistor as the transistor M11 enables the leakage current of the transistor M11 to be extremely low. That is, with the use of the transistor M11, written data can be retained for a long time, and thus the frequency of refresh of the memory cell can be reduced. In addition, refresh operation of the memory cell can be omitted.

[NOSRAM]

FIG. 25C illustrates a circuit structure example of a memory cell 321aB that is of a gain cell type including two transistors and one capacitor (also referred to as "2Tr1C-type"). The memory cell 321aB includes the transistor M11, a transistor M3, and the capacitor Cs.

The first terminal of the transistor M11 is connected to the first terminal of the capacitor Cs, the second terminal of the transistor M11 is connected to a wiring WBL, the gate of the transistor M11 is connected to the wiring WL, and the back gate of the transistor M11 is connected to the wiring BGL. The second terminal of the capacitor Cs is connected to a wiring RL. A first terminal of the transistor M3 is connected to a wiring RBL, a second terminal of the transistor M3 is connected to a wiring SL, and a gate of the transistor M3 is connected to the first terminal of the capacitor Cs.

The wiring WBL functions as a write bit line. The wiring RBL functions as a read bit line. The wiring WL functions as a word line. The wiring RL functions as a wiring for applying a predetermined potential to the second terminal of the capacitor Cs. The reference potential is preferably applied to the wiring RL at the time of data writing and during data retention.

The wiring BGL functions as a wiring for applying a potential to the back gate of the transistor M11. By applying a given potential to the wiring BGL, the threshold voltage of the transistor M11 can be increased or decreased.

Data writing is performed in such a manner that a high-level potential is applied to the wiring WL to turn on the transistor M11 so that the wiring WBL is electrically connected to the first terminal of the capacitor Cs. Specifically, when the transistor M11 is in an on state, a potential corresponding to information to be stored is applied to the wiring WBL, whereby the potential is written to the first terminal of the capacitor Cs and the gate of the transistor M3. After that, a low-level potential is applied to the wiring WL to turn off the transistor M11, whereby the potential of the first terminal of the capacitor Cs and the potential of the gate of the transistor M3 are retained.

Data reading is performed by applying a predetermined potential to the wiring RL and the wiring SL. Current flowing between a source and a drain of the transistor M3 and the potential of the first terminal of the transistor M3 are determined by the potential of the gate of the transistor M3 and the potential of the second terminal of the transistor M3; thus, by reading out the potential of the wiring RBL connected to the first terminal of the transistor M3, the potential retained at the first terminal of the capacitor Cs (or the gate of the transistor M3) can be read. In other words, information written to this memory cell can be read from the potential retained at the first terminal of the capacitor Cs (or the gate of the transistor M3). Alternatively, existence or absence of information written to this memory cell can be found.

Alternatively, as illustrated in FIG. 25D, the wiring WBL and the wiring RBL may be combined into one wiring BIL. In a memory cell 321aC illustrated in FIG. 25D, one wiring BIL corresponds to the wiring WBL and the wiring RBL in the memory cell 321aB, and the second terminal of the transistor M11 and the first terminal of the transistor M3 are connected to the wiring BIL. In other words, in the memory cell 321aC, one wiring BIL operates as a write bit line and a read bit line.

Note that also in each of the memory cell 321aB and the memory cell 321aC, an OS transistor is preferably used as the transistor M11. A memory device using a 2Tr1C-type memory cell using an OS transistor as the transistor M11, such as the memory cell 321aB and the memory cell 321aC, is referred to as a NOSRAM (Non-volatile Oxide Semiconductor Random Access Memory).

FIG. 25E illustrates a circuit structure example of a memory cell 321aD that is of a gain cell including three transistors and one capacitor (also referred to as "3Tr1C-type"). The memory cell 321aD includes the transistor M11, a transistor M5, a transistor M6, and the capacitor Cs.

The first terminal of the transistor M11 is connected to the first terminal of the capacitor Cs, the second terminal of the transistor M11 is connected to the wiring BIL, the gate of the transistor M11 is connected to the wiring WL, and the back gate of the transistor M11 is electrically connected to the wiring BGL. The second terminal of the capacitor Cs is electrically connected to a first terminal of the transistor M5 and the wiring GNDL. A second terminal of the transistor M5 is connected to a first terminal of the transistor M6, and a gate of the transistor M5 is connected to the first terminal of the capacitor Cs. A second terminal of the transistor M6 is connected to the wiring BIL, and a gate of the transistor M6 is connected to the wiring RL.

The wiring BIL functions as a bit line, the wiring WL functions as a write word line, and the wiring RL functions as a read word line.

The wiring BGL functions as a wiring for applying a potential to the back gate of the transistor M11. By applying a given potential to the wiring BGL, the threshold voltage of the transistor M11 can be increased or decreased.

Data writing is performed in such a manner that a high-level potential is applied to the wiring WL to turn on the transistor M11 so that the wiring BIL is connected to the first terminal of the capacitor Cs. Specifically, when the transistor M11 is in an on state, a potential corresponding to information to be stored is applied to the wiring BIL, whereby the potential is written to the first terminal of the capacitor Cs and the gate of the transistor M5. After that, a low-level potential is applied to the wiring WL to turn off the transistor M11, whereby the potential of the first terminal of the capacitor Cs and the potential of the gate of the transistor M5 are retained.

Data reading is performed in such a manner that after a predetermined potential is precharged to the wiring BIL, the wiring BIL is brought into an electrically floating state, and a high-level potential is applied to the wiring RL. Since the wiring RL has the high-level potential, the transistor M6 is turned on, which electrically connects the wiring BIL and the second terminal of the transistor M5. At this time, the potential of the wiring BIL is applied to the second terminal of the transistor M5; the potential of the second terminal of the transistor M5 and the potential of the wiring BIL are changed in accordance with the potential retained at the first terminal of the capacitor Cs (or the gate of the transistor M5). Here, by reading out the potential of the wiring BIL, the potential retained at the first terminal of the capacitor Cs (or the gate of the transistor M5) can be read. In other words, information written to this memory cell can be read from the potential retained at the first terminal of the capacitor Cs (or the gate of the transistor M5). Alternatively, existence or absence of information written to this memory cell can be found.

Note that also in the memory cell 321aD, an OS transistor is preferably used as the transistor M11. The 3Tr1C-type memory cell 321aD using an OS transistor as the transistor M11 is one embodiment of the NOSRAM. The circuit structure of the memory cell can be changed as appropriate. A Si transistor can also be used as a transistor included in the memory cell.

Embodiment 4

In this embodiment, a semiconductor device that can be used as the functional circuit described in Embodiment 2 and can form a stack with the pixel circuit will be described.

The semiconductor device described in this embodiment includes a processor and has a function of controlling the operation of an imaging device. The semiconductor device described in this embodiment is an example of a basic structure of a processor and a peripheral circuit, and a circuit having this structure can be referred to as a CPU, an MCU, or the like.

The semiconductor device is of a normally-off type and can control imaging timing for the pixel circuit and the driver circuit, for example. A circuit capable of power gating or a power supply circuit in the semiconductor device can be brought into a resting state by power gating. Only a particular circuit and a power supply circuit may be brought into a power-on mode as needed so that an imaging enable signal can be output to the pixel circuit and the driver circuit. Note that another necessary processing or the like in the semiconductor device can be executed.

Power gating can be performed in the imaging device of one embodiment of the present invention that includes the semiconductor device and is in the motion detecting mode, for example; thus, the power consumption can be reduced.

A structure, a power management system, and the like of the semiconductor device will be described.
<Structure Example 1 of Semiconductor Device>

A semiconductor device and power management thereof will be described with reference to FIG. 26A and FIG. 26B. The semiconductor device illustrated in FIG. 26A includes a power supply circuit 10 and a processing unit (PU) 20. The PU 20 is a circuit having a function of executing an instruction. The PU 20 includes a plurality of functional circuits integrated over one chip. The PU 20 includes a processor core 30, a power management unit (PMU) 60, a clock control circuit 65, a power switch (PSW) 70, and a terminal 80 to a terminal 83. FIG. 26A illustrates an example in which the power supply circuit 10 is provided over a chip different from a chip over which the PU 20 is provided. A power supply potential VDD is input from the power supply circuit 10 to the terminal 80. A reference clock signal CLKM is input from the outside to the terminal 81. A signal INT is input from the outside to the terminal 82. The signal INT is an interrupt signal for requesting interrupt processing. The signal INT is input to the PU 20 and the PMU 60. A control signal generated in the PMU 60 is output to the terminal 83, and the terminal 83 is electrically connected to the power supply circuit 10.
<Processor Core 30 and Memory Circuit 31>

The processor core 30 is a circuit having a function of processing an instruction and can be referred to as an arithmetic processing circuit. The processor core 30 includes a memory circuit 31, a combinational circuit 32, and the like, and a variety of functional circuits are formed using these circuits. For example, the memory circuit 31 is included in a register. Note that D represents an input signal, and Q represents an output signal.

Figure 26B:
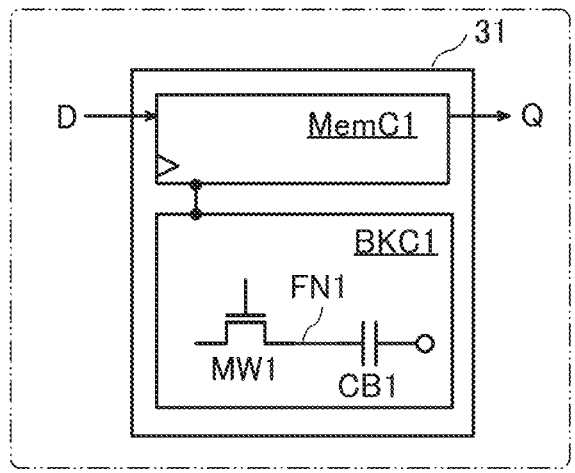

As illustrated in FIG. 26B, the memory circuit 31 includes a circuit MemC1 and a circuit BKC1. The circuit MemC1 has a function of retaining data generated in the processor core 30, and can be formed using a flip-flop circuit or a latch circuit, for example. The circuit BKC1 can function as a backup circuit of the circuit MemC1, and can retain data for a long time even when power supply is stopped or supply of a clock signal is stopped. Including such a memory circuit 31 enables power gating of the processor core 30. This is because the state of the processor core 30 at the time of power-off can be retained by saving data of the circuit MemC1 to the circuit BKC1 in the memory circuit 31 before power-off. When the power supply is restarted, data retained in the circuit BKC1 is written to the circuit MemC1; thus, the state of the processor core 30 at the time of power-off can be restored. Consequently, the PU 20 can perform normal processing immediately after the power supply is restarted.

The circuit BKC1 includes at least a retention circuit including one transistor (MW1) and one capacitor (CB1). The retention circuit illustrated in FIG. 26B has a circuit structure similar to a 1T1C (one transistor and one capacitor) memory cell structure of a standard DRAM (dynamic random access memory), and can perform writing and reading operations in a similar manner. By control of the conduction state of the transistor MW1, charging and discharging of the capacitor CB1 are controlled. When the transistor MW1 is turned off, a node FN1 is brought into an electrically floating state. Fluctuation in the potential of the node FN1 can be inhibited by a significant reduction in the drain current of the transistor MW1 in an off state (off-state current); thus, the data retention time of the circuit BKC1 can be made longer. The data retention time of the circuit BKC1 is determined by the leakage current of the transistor MW1, the capacitance of the capacitor CB1, and the like. The use of the transistor MW1 having an extremely low off-state current eliminates the necessity of refreshing the circuit BKC1 while a PU 21 operates. Thus, the circuit BKC1 can be used as a substantially nonvolatile memory circuit.

An OS transistor is preferably used as the transistor MW1. Since the off-state current of the OS transistor is extremely low, the circuit BKC1 can substantially function as a nonvolatile memory circuit while the PU 20 operates.

Data is written with voltage in the circuit BKC1; thus, the write power of the circuit BKC1 can be lower than that of an MRAM (magnetoresistive RAM) in which writing is performed with current. Furthermore, unlike in a flash memory, the number of data rewriting times is not limited because data is retained by the load capacitance of the node FN1.

In the circuit BKC1, energy required for data writing corresponds to energy required for charging and discharging of charge in the capacitor CB1. By contrast, in a memory circuit including a two-terminal memory element such as an MRAM, energy required for data writing corresponds to energy consumed when current flows to the memory element. In the MRAM, energy required for data writing is high because current continuously flows during a data writing period. As compared with such an MRAM, the circuit BKC1 can reduce energy consumed by data writing. Thus, as compared with a memory circuit in which a backup circuit is formed using an MRAM, the memory circuit 31 can frequently perform voltage scaling and power gating for reducing consumed energy, which leads to a reduction in the power consumption of the PU 20.

<Power Management>

The PMU 60 has a function of controlling a power gating operation, a clock gating operation, a voltage scaling operation, and the like. Specifically, the PMU 60 has a function of controlling the power supply circuit 10, a function of controlling the memory circuit 31, a function of controlling the clock control circuit 65, and a function of controlling the PSW 70. Thus, the PMU 60 has a function of generating control signals for controlling these circuits (10, 31, 65, and 70). The PMU 60 includes a circuit 61. The circuit 61 has a function of measuring time. The PMU 60 has a function of performing power management on the basis of data on time obtained by the circuit 61.

The PSW 70 has a function of controlling supply of a power supply potential MVDD to the PU 20 in response to a control signal of the PMU 60. Here, a power supply potential supplied to the PU 20 through the PSW 70 is referred to as the power supply potential VDD. The processor core 30 may include a plurality of power domains. In that case, supply of power to the plurality of power domains may be controlled independently by the PSW 70. In addition, the processor core 30 may include a power domain that does not require power gating. In that case, a power supply potential may be supplied to this power domain without through the PSW 70.

The reference clock signal CLKM is input to the clock control circuit 65, and the clock control circuit 65 has a function of generating and outputting a gated clock signal. The clock control circuit 65 has a function of stopping supply of a clock signal to the processor core 30 in response to a control signal of the PMU 60. The power supply circuit 10 has a function of changing the magnitude of the potential VDD in response to a control signal of the PMU 60.

A signal SLP output from the processor core 30 to the PMU 60 is a trigger signal for transferring the processor core 30 to a resting state. When the signal SLP is input to the PMU 60, the PMU 60 generates a control signal for transition to a resting state and outputs the control signal to a functional circuit to be controlled. The power supply circuit 10 makes MVDD lower than that in normal operation in response to a control signal of the PMU 60. After the processor core 30 is in the resting state for a certain period of time, the PMU 60 controls the PSW 70 and stops power supply to the processor core 30. When the processor core 30 is transferred from a normal state to the resting state, the PMU 60 performs a voltage scaling operation for lowering the power supply potential VDD of the processor core 30. When the period of the resting state exceeds the set time, the PMU 60 performs a power gating operation for stopping supply of VDD to the processor core 30 in order to further reduce the power consumption of the processor core 30. Next, power management of the semiconductor device illustrated in FIG. 26A and FIG. 26B will be described.

Figure 27A:
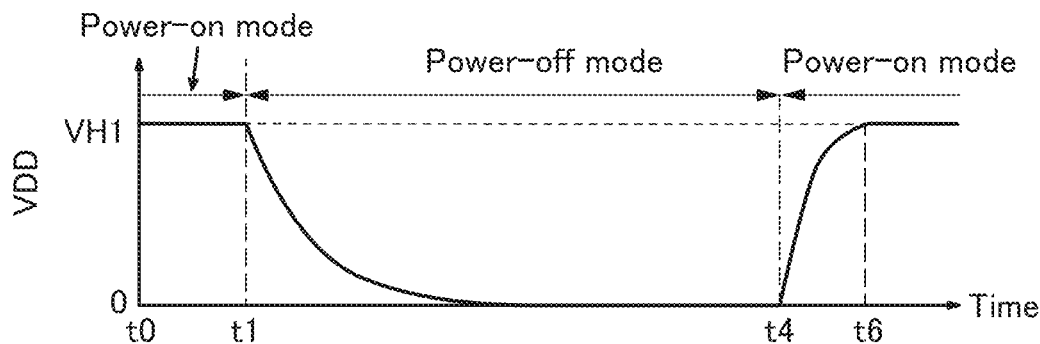
FIG. 27A to FIG. 27D are diagrams showing power management operation examples of semiconductor devices.
Figure 27B:
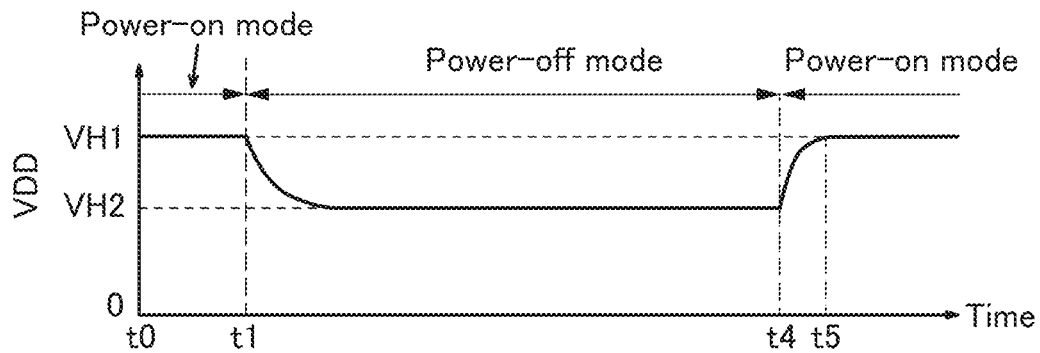
Figure 27C:
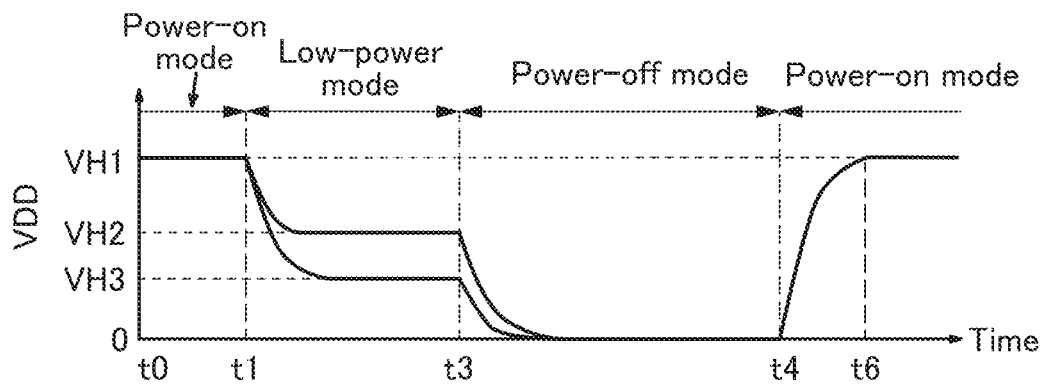
Figure 27D:
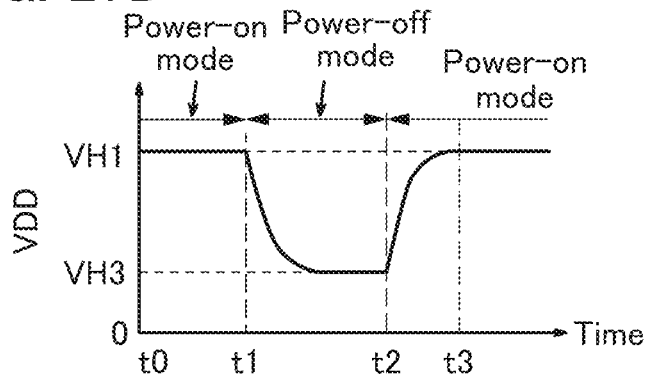

FIG. 27A to FIG. 27D are diagrams schematically showing changes in the potential of a power supply line. The power supply potential VDD is supplied to the power supply line through the PSW 70. The horizontal axis in each diagram shows the time elapsing between transition from the normal state to the resting state, and t0, t1, and the like each represent time. FIG. 27A shows an example in which only power gating is executed in the resting state, and FIG. 27B shows an example in which only voltage scaling is executed in the resting state. FIG. 27C and FIG. 27D each show an example in which voltage scaling and power gating are executed. In the normal state, the magnitude of the power supply potential MVDD supplied from the power supply circuit 10 is VH1.

In the following description, the power mode of the PU 20 is divided into three modes: a power-on mode, a power-off mode, and a low-power mode. The power-on mode is a mode in which the power supply potential VDD that enables normal processing is supplied to the PU 20. The power-off mode is a mode in which the supply of VDD is stopped by the PSW 70. The low-power mode is a mode in which the power supply potential VDD lower than that in the power-on mode is supplied.

The example in FIG. 27A is described. At the time t0, processing for transition to the resting state is started in the processor core 30. For example, backup of the memory circuit 31 is performed. The PMU 60 controls the PSW 70 and stops supply of power to the processor core 30 at the time t1. A power supply line 35 is self-discharged and its potential is decreased to 0 V. Consequently, leakage current of the processor core 30 in the resting state can be significantly lowered, so that power consumption in the resting state (hereinafter, referred to as standby power in some cases) can be reduced. In the case where the processor core 30 returns to the normal state in response to an interrupt request or the like from the outside, the PMU 60 controls the PSW 70 and restarts the supply of VDD. Here, at time t4, the supply of VDD is restarted. The potential of the power supply line 35 increases and becomes VH1 at time t6.

In the case of the example in FIG. 27B, voltage scaling is performed; thus, at the time t1, the PMU 60 controls the power supply circuit 10 and lowers the potential of MVDD to VH2. The potential of the power supply line 35 eventually becomes VH2. At the time t4, when the power supply potential MVDD returns from VH2 to VH1, the potential of the power supply line 35 increases and becomes VH1 at time t5.

In the case of the example in FIG. 27A, time taken for the return from the resting state to the normal state (overhead time) is time taken to increase the potential of the power supply line 35 from 0 V to VH1, and an energy overhead required for the return is energy required to charge the load capacitance of the power supply line 35 from 0 V to VH1. When the period of the power-off mode (t1 to t4) is sufficiently long, power gating is effective in reducing standby power of the PU 20. By contrast, when the period (t1 to t4) is short, power required for the return to the normal state is higher than power reduced by power-off; therefore, the effect of power gating cannot be obtained.

In the example of voltage scaling shown in FIG. 27B, the potential of the power supply line 35 is VH2 in the resting state; thus, the amount of standby power reduction is smaller than that in the example of power gating in FIG. 27A. In the example of FIG. 27B, fluctuation in the potential of the power supply line 35 is small; therefore, time taken for the return to the normal state is shorter and energy required for the return is lower than those in the example of FIG. 27A. Accordingly, the semiconductor device illustrated in FIG. 26 can perform power management in which power gating and voltage scaling are combined to efficiently reduce the standby power of the PU 20. FIG. 27C and FIG. 27D each show a power management example.

As shown in FIG. 27C, first, a voltage scaling operation is performed in the resting state and the mode is transferred from the power-on mode to the low-power mode. As in FIG. 27B, at the time t1, the PMU 60 controls the power supply circuit 10 and lowers the potential of MVDD to VH2; thus, the potential of the power supply line 35 eventually becomes VH2. After a certain period of time from transition to the low-power mode (t1 to t3), the PMU 60 controls the PSW 70 and transfers the mode to the power-off mode. In the period (t3 to t4), power reduced by powering off the PU 20 by power gating, which includes power consumed by returning to the normal state, is higher than power reduced by supplying VH2 to the PU 20.

For example, the potential VH2 is a power supply potential high enough to retain data in the circuit MemC1 of the memory circuit 31, and a potential VH3 is a potential at which data of the circuit MemC1 is lost. In the PU 20 of FIG. 26A, the circuit BKC1 can retain data even while power supply is stopped. When data of the memory circuit 31 is saved to the circuit BKC1 in the period (t0 to t1), VDD can be lowered to the potential VH3 at which data of the circuit MemC1 is lost in the low-power mode. Thus, the standby power of the PU 20 can be further reduced.

The PMU 60 has a function of returning the PU 20 to the normal state in response to an interrupt request or the like. The PMU 60 controls the power supply circuit 10 to increase the magnitude of MVDD to VH1 and controls the PSW 70 to restart the supply of VDD from the PU 20. After the time t4, the power-on mode continues. In the case where the potential of the power supply line 35 is stabilized at the time t6, the PU 20 can perform a normal operation after the time t6.

FIG. 27D shows an example in which an interrupt request for the return to a normal operation is input before the time t3. After the time t2, the power-on mode continues. At the time t2, the PMU 60 controls the power supply circuit 10 to change the magnitude of MVDD to the potential VH1 in the power-on mode. At the time t3, the potential of the power supply line 35 increases to VH1.

As shown in FIG. 27C and FIG. 27D, time required to restore the potential of the power supply line 35 to VH1 in the resting state is longer when the mode returns from the power-off mode to the power-on mode than when the mode returns from the low-power mode to the power-on mode. Thus, the PMU 60 has a function of adjusting timing of returning the processor core 30 from the resting state to the normal state depending on the power mode. Accordingly, the processor core 30 can return from the resting state to the normal state in the minimum time.

Figure 28:
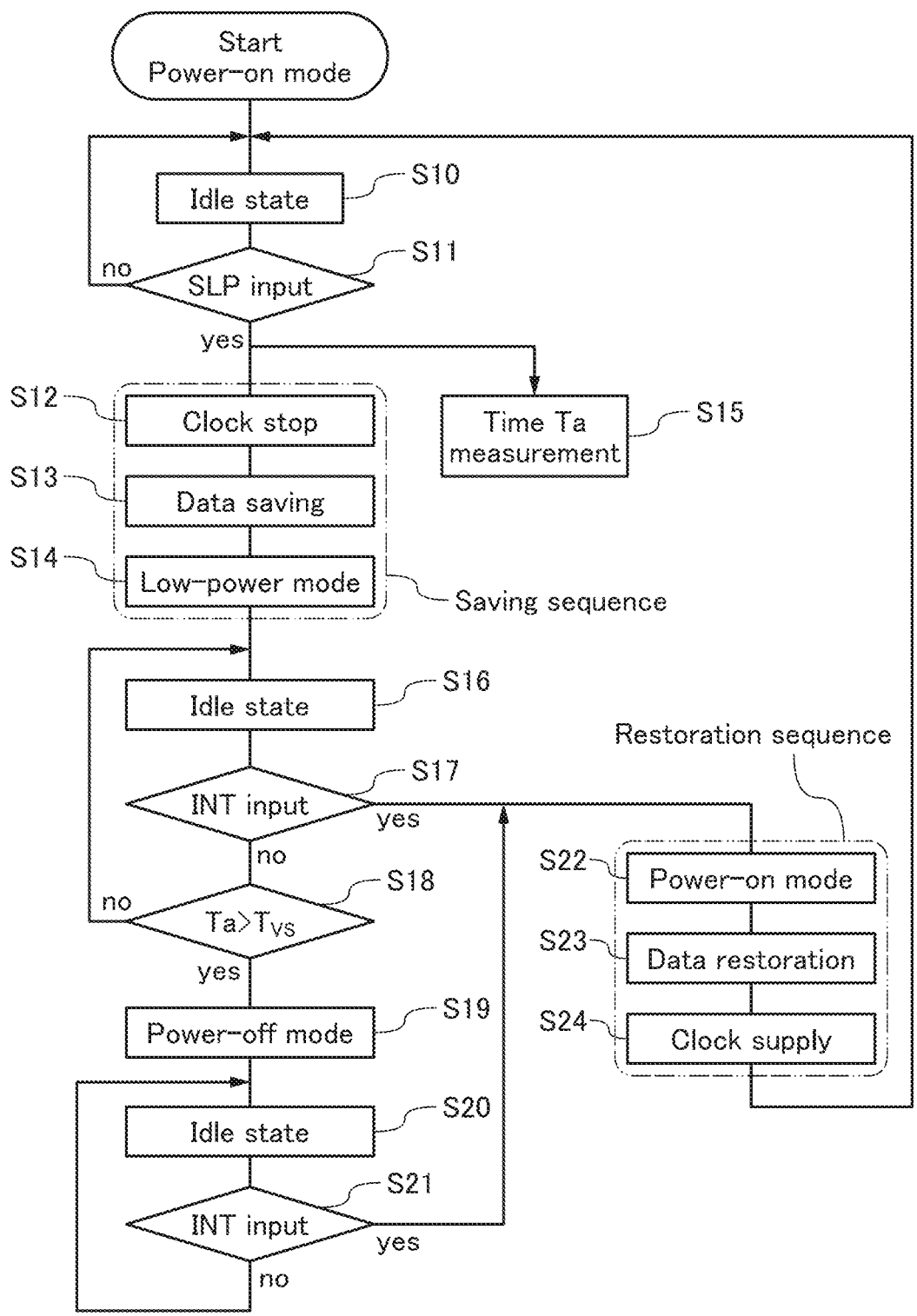
FIG. 28 is a flow chart showing a power management operation example of a semiconductor device.

In the resting state, transition time from the low-power mode to the power-off mode can be measured by the circuit 61 provided in the PMU 60. When the signal SLP is input from the PU 20, the PMU 60 starts time measurement in the circuit 61. After a certain period of time from transition to the low-power mode, the PMU 60 is transferred to the power-off mode. The PSW 70 is turned off by a control signal of the PMU 60, and the supply of VDD is stopped. In this manner, the PMU 60 can be transferred from the low-power mode to the power-off mode in response to an interrupt request based on measurement data of the circuit 61. A power management operation example of the PMU 60 will be described below with reference to a flow chart shown in FIG. 28.

The PU 20 performs a normal operation. The power mode is a power-on mode and the PMU 60 is in an idle state (S10). The PMU 60 is in the idle state until the signal SLP is input, and a saving sequence is executed with input of the signal SLP as a trigger (S11). In the saving sequence example of FIG. 28, first, the PMU 60 outputs a control signal to the clock control circuit 65 and stops output of a clock signal (S12). Next, a control signal for data saving is output to the memory circuit 31 (S13). In the memory circuit 31, data retained in the circuit MemC1 is saved to the circuit BKC1 in response to a control signal of the PMU 60. Finally, the PMU 60 controls the power supply circuit 10 to lower MVDD. Through these operations, the power mode is transferred to the low-power mode (S14). When the signal SLP is input, the PMU 60 controls the circuit 61 included therein and measures time Ta in the low-power mode (S15). Timing of operating the circuit 61 may be any timing as long as the saving sequence is executed; for example, the circuit 61 may operate when the signal SLP is input, when a control signal is output to the clock control circuit 65, when data saving is started, when data saving is terminated, or when a control signal is output to the power supply circuit 10.

After the saving sequence is executed, the PMU 60 is set in an idle state (S16), and monitors input of the signal INT and the measurement time Ta of the clock control circuit 65. When the signal INT is input, the sequence is transferred to a restoration sequence (S17). Whether the time Ta exceeds set time $T_{vs}$ is determined (S18). When the time Ta exceeds the time $T_{vs}$, the PMU 60 transfers the power mode to the power-off mode (S19). When the time Ta does not exceed the time $T_{vs}$, the PMU 60 remains in the idle state (S16). The time $T_{vs}$ is set such that the standby power of the processor core 30 in the power-off mode can be lower than that in the low-power mode.

In S19, the PMU 60 outputs, to the PSW 70, a control signal for stopping supply of power to the processor core 30. After the mode is transferred to the power-off mode, the PMU 60 is set in the idle state again (S20), and input of the signal INT is monitored (S21). When the signal INT is input, the PMU 60 executes the restoration sequence.

In the restoration sequence, first, the PMU 60 is transferred from the power-off mode to the power-on mode (S22). The PMU 60 controls the power supply circuit 10 to output a power supply potential in a normal operation. In addition, the PMU 60 controls the PSW 70 to restart the supply of VDD to the processor core 30. Next, a control signal is output to the memory circuit 31 and data of the memory circuit 31 is restored (S23). In the memory circuit 31, data retained in the circuit BKC1 is restored to the circuit MemC1 in response to a control signal of the PMU 60. The PMU 60 outputs a control signal for outputting a clock signal to the clock control circuit 65 (S24). The clock control circuit 65 restarts the output of a clock signal in response to a control signal of the PMU 60.

As compared with the case where the restoration sequence is executed in accordance with determination in S21, the potential of the power supply line 35 can be quickly stabilized in the case where the restoration sequence is executed in accordance with determination in S17 because the power mode returns from the low-power mode to the power-on mode. Thus, in the PMU 60, timing of executing S23 when the restoration sequence is executed in accordance with S17 is faster than that when the restoration sequence is executed in accordance with S21. Consequently, time taken to return the processor core 30 from the resting state to the normal state can be shortened.

As described above, in power management of the semiconductor device illustrated in FIG. 26A and FIG. 26B, when the PU 20 is set in the resting state, first, time and energy overheads due to the return from the resting state to the normal state are suppressed while leakage current is reduced by lowering a power supply potential supplied to the processor core 30 with a voltage scaling operation. When the PU 20 is in the resting state for a certain period of time, a power gating operation is performed to reduce the leakage current of the processor core 30 as much as possible. Thus, the power consumption of the PU 20 in the resting state can be reduced without a decrease in the processing performance of the PU 20.

<Structure Example 2 of Semiconductor Device>

Figure 29A:
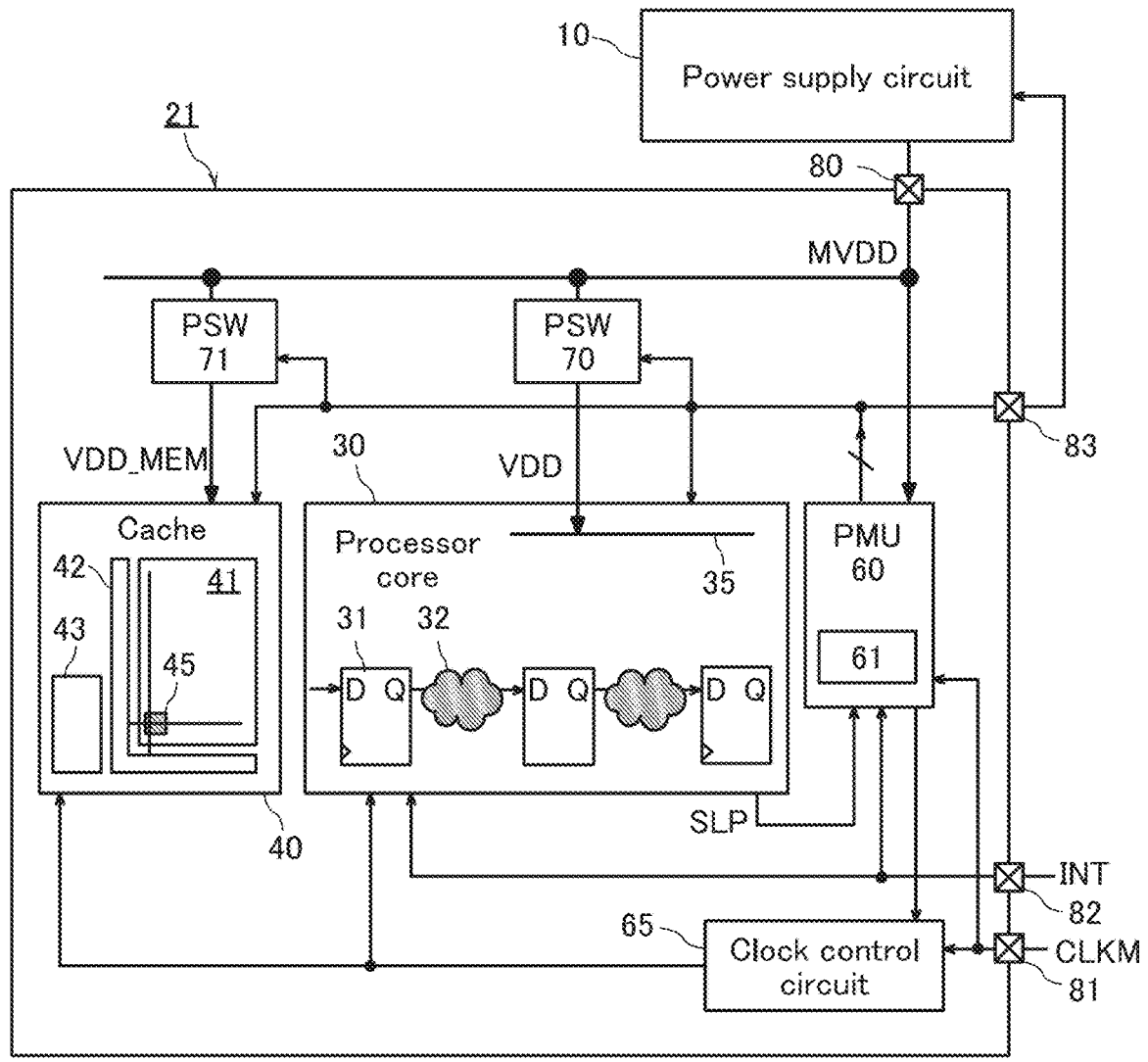
FIG. 29A and FIG. 29B are block diagrams illustrating a structure example of a semiconductor device.

FIG. 29A illustrates a modification example of the semiconductor device in FIG. 26A. A processing unit (PU) 21 illustrated in FIG. 29A has a structure obtained by addition of a cache 40 and a power switch (PSW) 71 to the PU 20. The cache 40 can perform power gating and voltage scaling as in the PU 20, and the power mode of the cache 40 changes along with the power mode of the PU 21. The PSW 71 controls supply of the power supply potential MVDD to the cache 40 and is controlled by the PMU 60. Here, a power supply potential input to the cache 40 through the PSW 71 is VDD_MEM. As in the processor core 30, a control signal from the PMU 60 and a gated clock signal from the clock control circuit 65 are input to the cache 40.

<Cache 40>

The cache 40 is a memory device having a function of temporarily storing frequently used data. The cache 40 includes a memory array 41, a peripheral circuit 42, and a control circuit 43. The memory array 41 includes a plurality of memory cells 45. The control circuit 43 controls the operation of the cache 40 in response to a request from the processor core 30. For example, a writing operation and a reading operation of the memory array 41 are controlled. The peripheral circuit 42 has a function of generating a signal for driving the memory array 41 in response to a control signal from the control circuit 43. The memory array 41 includes the memory cells 45 for retaining data.

Figure 29B:
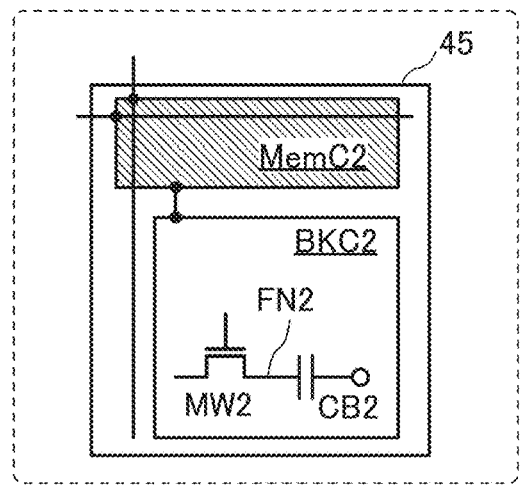

As shown in FIG. 29B, the memory cells 45 each include a circuit MemC2 and a circuit BKC2. The circuit MemC2 is a memory cell to be accessed in a normal operation. For example, an SRAM (static random access memory) cell is used. The circuit BKC2 can function as a backup circuit of the circuit MemC2, and can retain data for a long time even while power supply is stopped or supply of a clock signal is stopped. When such memory cells 45 are provided, power gating of the cache 40 can be performed. Before the power supply is stopped, data of the circuit MemC2 is saved to BKC2 in each of the memory cells 45. After the power supply is restarted, data retained in the circuit BKC2 is restored to the circuit MemC2, so that the PU 21 can quickly return to the state before the power supply is stopped.

Like the circuit BKC1 in FIG. 26B, the circuit BKC2 in each of the memory cells 45 includes at least a retention circuit including one transistor (MW2) and one capacitor (CB2). In other words, the circuit BKC2 also includes a retention circuit having a structure similar to that of a 1T1C memory cell of a standard DRAM. As in the transistor MW1, an OS transistor having an extremely low off-state current is used as the transistor MW2. Such a structure can suppress fluctuation in the potential of a node FN2 that is electrically floating also in the circuit BKC2; thus, the circuit BKC2 can retain data for a long time. The data retention time of the circuit BKC2 is determined by the leakage current of the transistor MW2, the capacitance of the capacitor CB2, and the like. When the transistor MW2 has an extremely low off-state current, the circuit BKC2 can be used as a nonvolatile memory circuit that does not need a refresh operation.

As in the PU 20, the PMU 60 performs power management (see FIG. 28) in the PU 21 illustrated in FIG. 29A. In S13 in FIG. 28, a data saving operation of the memory circuit 31 and the cache 40 is performed. In S19, the PSW 70 and the PSW 71 are controlled to stop supply of power to the processor core 30 and the cache 40. In S22, the PSW 70 and the PSW 71 are controlled to restart the supply of power to the processor core 30 and the cache 40. In S23, a data restoration operation of the memory circuit 31 and the cache 40 is performed.

Thus, like the semiconductor device illustrated in FIG. 26, the semiconductor device illustrated in FIG. 29 can reduce power in the resting state of the PU 21 without a decrease in processing performance of the PU 21 by power management in which voltage scaling and power gating are combined.

<Processor Core Structure Example>

Figure 30:
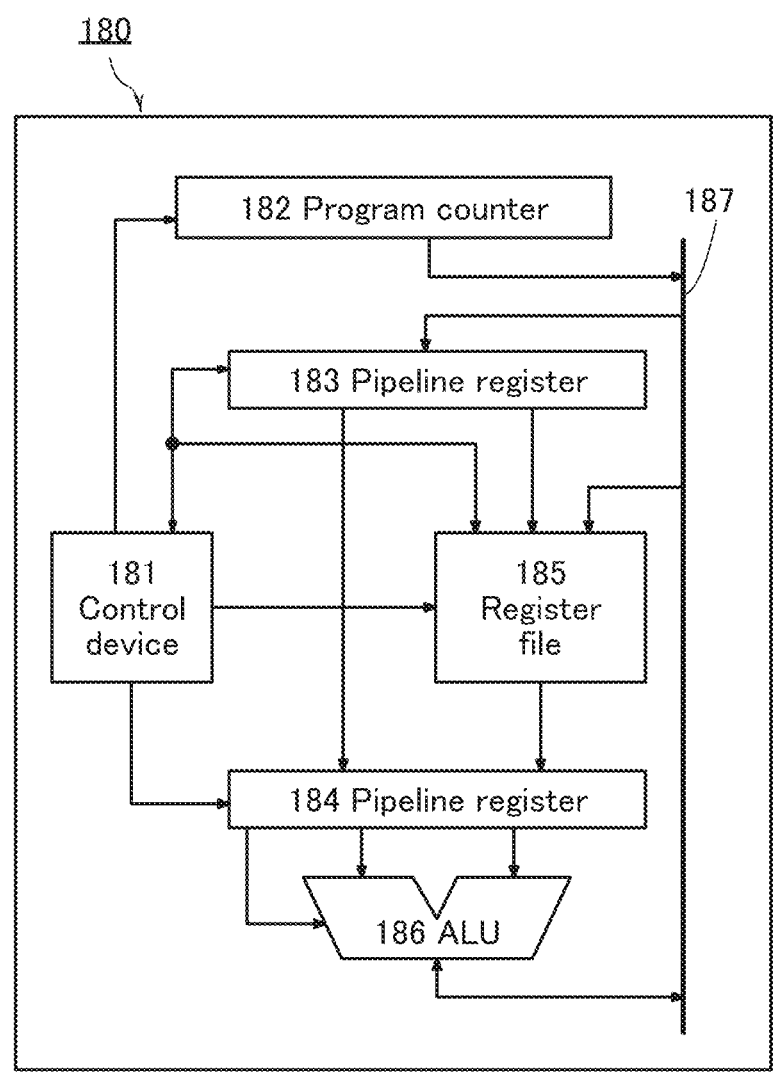
FIG. 30 is a block diagram illustrating a structure example of a processor core.

A processor core 180 illustrated in FIG. 30 is an example of a circuit that can be used as the processor core 30. The processor core 180 includes a control device 181, a program counter 182, a pipeline register 183, a pipeline register 184, a register file 185, an arithmetic logic unit (ALU) 186, and a data bus 187. Data is transmitted between the processor core 180 and a peripheral circuit such as a PMU or a cache through the data bus 187.

The control device 181 has a function of decoding and executing instructions contained in a program such as input applications by controlling the overall operations of the program counter 182, the pipeline register 183, the pipeline register 184, the register file 185, the ALU 186, and the data bus 187. The ALU 186 has a function of performing a variety of arithmetic operations such as four arithmetic operations and logic operations. The program counter 182 is a register having a function of storing the address of an instruction to be executed next.

The pipeline register 183 has a function of temporarily storing instruction data. The register file 185 includes a plurality of registers including a general-purpose register and can store data read out from a main memory, data obtained as a result of arithmetic operations in the ALU 186, or the like. The pipeline register 184 has a function of temporarily storing data used for arithmetic operations in the ALU 186, data obtained as a result of arithmetic operations in the ALU 186, or the like.

The memory circuit 31 in FIG. 26B is used as the register included in the processor core 180.

<Memory Circuit Structure Example>

Figure 31:
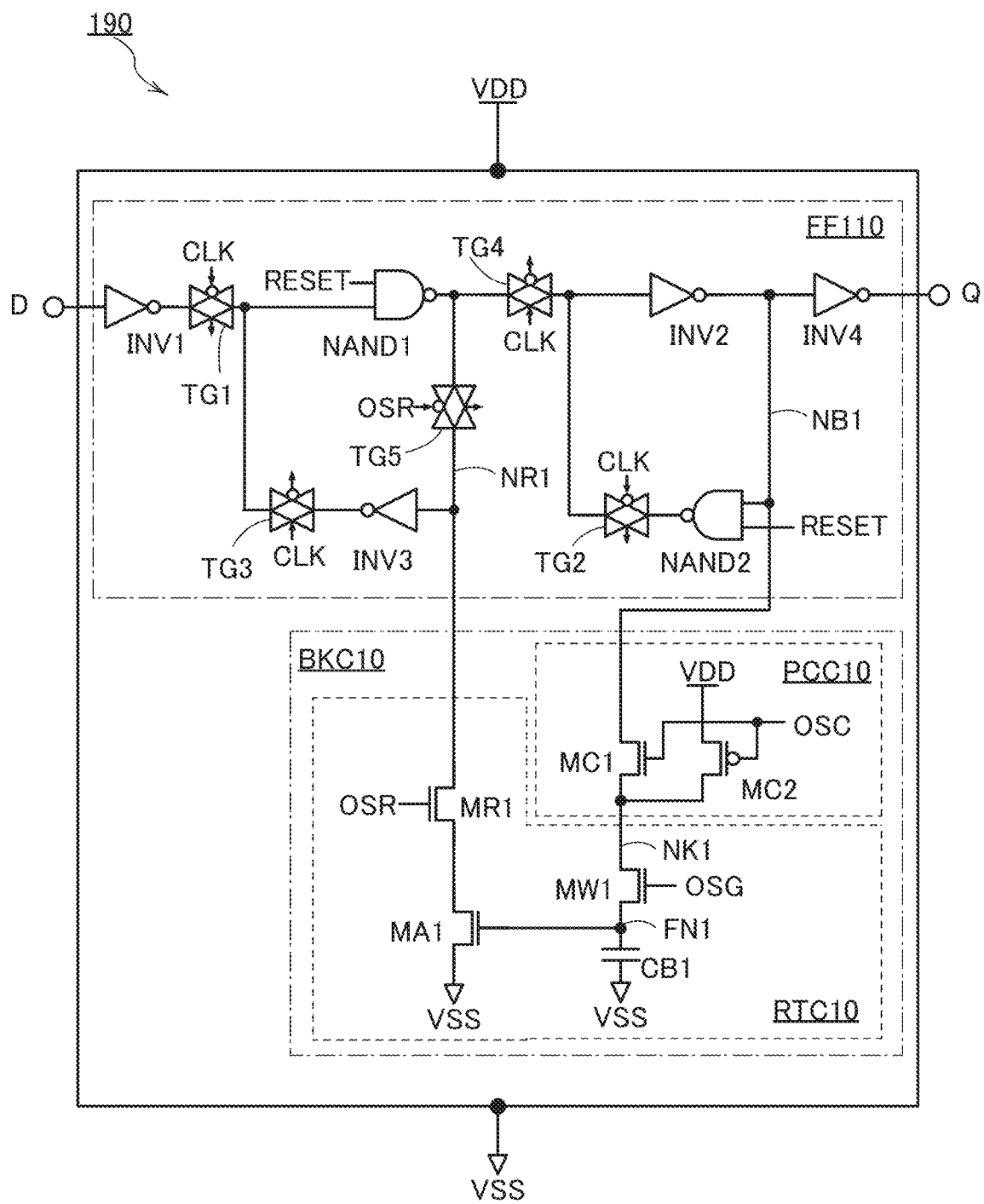
FIG. 31 is a circuit diagram illustrating a structure example of a memory circuit.

A specific structure example of the memory circuit 31 illustrated in FIG. 26B is described. FIG. 31 is a circuit diagram illustrating a memory circuit structure example. A memory circuit 190 illustrated in FIG. 31 functions as a flip-flop circuit.

A standard flip-flop circuit can be used as the circuit MemC1, and for example, a master slave flip-flop circuit can be used. Such a structure example is illustrated in FIG. 31. A flip-flop circuit 110 includes transmission gates (TG1, TG2, TG3, TG4, and TG5), inverter circuits (INV1, INV2, INV3, and INV4), and NAND circuits (NAND1 and NAND2). A signal RESET and a signal OSR are control signals output from the PMU 60. The signal OSR and an inverted signal thereof are input to TG5. A clock signal CLK and an inverted signal thereof are input to TG1 to TG4. One clocked inverter circuit may be provided instead of TG1 and INV1. One clocked NAND circuit may be provided instead of TG2 and NAND2. A clocked inverter circuit may be provided instead of TG3 and INV3. TG5 functions as a switch that controls conduction between an output node of NAND1 and anode NR1. Anode NB1 is electrically connected to an input node of a circuit BKC10, and the node NR1 is electrically connected to an output node of the circuit BKC10.

The circuit BKC10 illustrated in FIG. 31 functions as a backup circuit of the flip-flop circuit 110. The circuit BKC10 includes a circuit RTC10 and a circuit PCC10. Signals (OSG, OSC, and OSR) input to the circuit BKC10 are control signals output from the PMU 60. A power supply potential VSS is a low power supply potential and, for example, may be a ground potential (GND) or 0 V. As in the circuit BKC1, the power supply potential VSS and the power supply potential VDD are input to the flip-flop circuit 110. In the memory circuit 190, supply of VDD is controlled by the PMU 60.

The circuit RTC10 includes the transistor MW1, a transistor MA1, a transistor MR1, the node FN1, and a node NK1. The circuit RTC10 has a function of retaining data, and here, includes a 3T gain-cell memory circuit. The transistor MW1 is an OS transistor serving as a write transistor. The transistor MR1 is a read transistor, and the transistor MA1 functions as an amplifier transistor and a read transistor. The node FN1 retains data. The node NK1 is a data input node. The node NR1 is a data output node of the circuit RTC10.

FIG. 31 illustrates a structure example in which the circuit BKC10 reads out data of a slave latch circuit in the flip-flop circuit 110 in a saving operation and restores the retained data to a master latch circuit in a restoration operation. Data to be saved may be data of the master latch circuit. In addition, data may be restored to the slave latch circuit. In that case, TG5 is provided in the slave latch circuit.

The transistor MR1 and the transistor MA1 in the circuit RTC10 may be either n-channel transistors or p-channel transistors, and the levels of the potential of the signal OSR and a power supply potential supplied to the transistor MA1 may be changed depending on the conductivity types of the transistor MR1 and the transistor MA1. In addition, a logic circuit of the flip-flop circuit 110 may be set as appropriate. For example, in the case where the transistor MR1 and the transistor MA1 are p-channel transistors, NAND1 and INV3 are replaced with each other in the master latch circuit and INV2 and NAND2 are replaced with each other in the slave latch circuit. Furthermore, VDD is input to the transistor MA1 instead of VSS.

Data is written with voltage in the circuit BKC10; thus, the write power of the circuit BKC10 can be lower than that of an MRAM in which writing is performed with current. Furthermore, unlike in a flash memory, the number of data rewriting times is not limited because data is retained by the load capacitance of the node FN1.

In the circuit RTC10, energy required for data writing corresponds to energy required for charging and discharging of charge in the capacitor CB1. By contrast, in a memory circuit including a two-terminal memory element such as an MRAM, energy required for data writing corresponds to energy consumed when current flows to the memory element. Thus, as compared with an MRAM or the like in which current continuously flows during a data writing period, the circuit BKC10 can reduce energy consumed by data saving. Accordingly, as compared with the case of providing an MRAM, BET (break even time) can be shortened in the case of providing the circuit BKC10 as a backup circuit. Consequently, opportunities of performing power gating by which energy consumption can be reduced are increased, so that the power consumption of the semiconductor device can be reduced.

The circuit PCC10 includes a transistor MC1 and a transistor MC2. The circuit PCC10 has a function of precharging the node FN1. The circuit PCC10 is not necessarily provided. As described later, the data saving time of the circuit BKC10 can be shortened by provision of the circuit PCC10.

<Operation Example of Memory Circuit>

Figure 32:
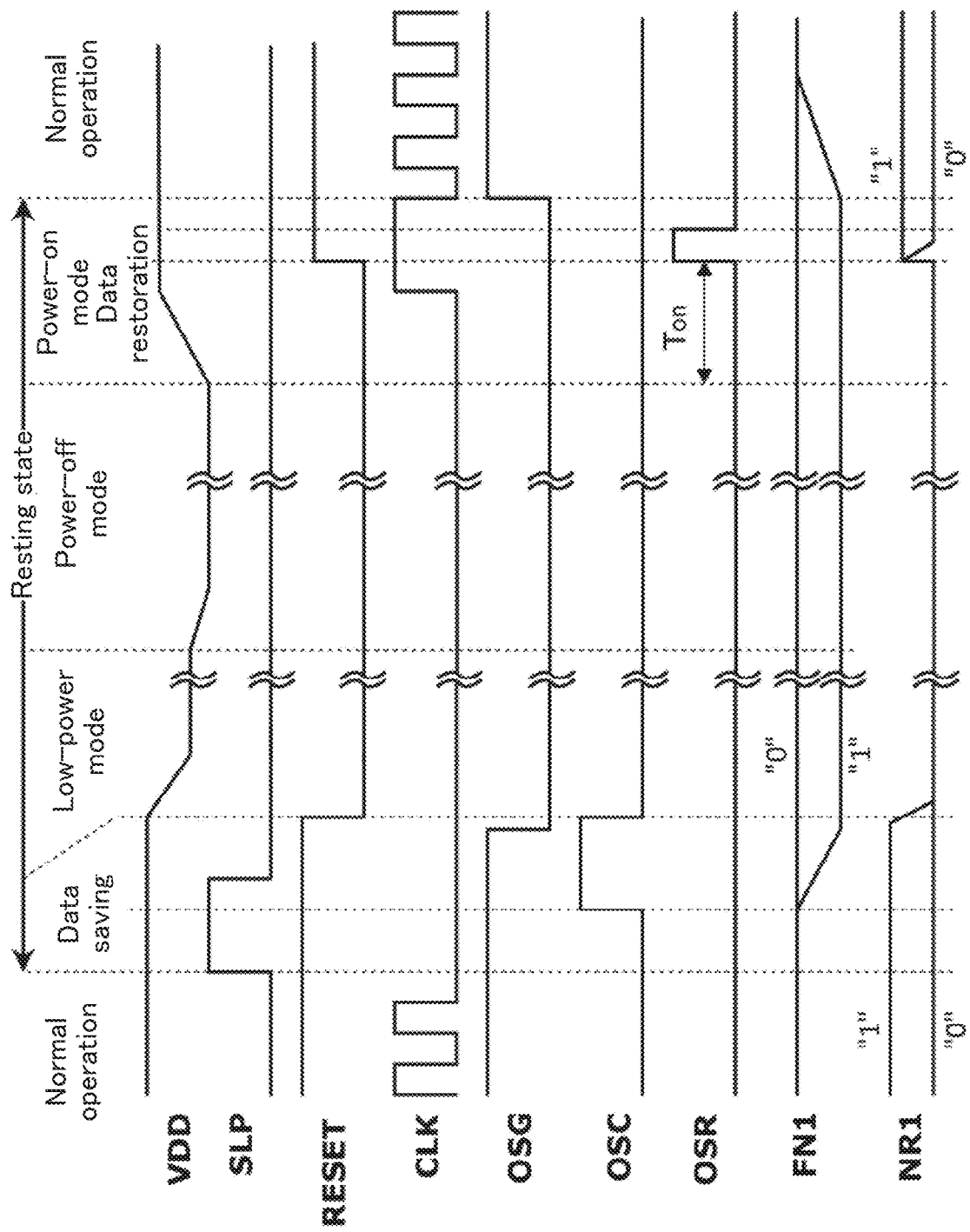
FIG. 32 is a timing chart showing an operation example of a memory circuit.

FIG. 32 is a timing chart showing an operation example of the memory circuit 190, and shows changes in waveforms of control signals (SLP, RESET, CLK, OSG, OSC, and OSR) and changes in the potentials of the power supply potential VDD, the node FN1, and the node NR1.

[Normal Operation]

The power supply potential VDD and the signal CLK are supplied to the memory circuit 190. The flip-flop circuit 110 functions as a sequential circuit. The signal RESET is kept at a high level; thus, NAND1 and NAND2 function as inverter circuits. In the circuit BKC10, the transistor MC1 is in an off state and the transistor MC2 and the transistor MW1 are in an on state, so that the potential of the node FN1 is precharged to a high level.

[Data Saving]

First, supply of the clock signal CLK is stopped. Thus, data rewriting of the node NB1 is stopped. In the example of FIG. 32, the potential level of the node NB1 is at a low level ("0") when the potential of the node NR1 is at a high level ("1"), and the potential level of the node NB1 is at the high level ("1") when the potential of the node NR1 is at the low level ("0"). While the signal OSC is at a high level, data of the node NB1 is saved to the node FN1. Specifically, since the transistor MC1 and the transistor MW1 are in an on state, the node FN1 is electrically connected to the node NB1. When the signal OSG is set at a low level to turn off the transistor MW1, the node FN1 is brought into an electrically floating state and the circuit BKC10 retains data. The potential of the node FN1 is at a high level when the node NR1 is at the low level ("0"), and the potential of the node FN1 is at a low level when the node NR1 is at the high level ("1").

Data saving is terminated by setting the signal OSG at a low level; thus, a voltage scaling operation of the PU 20 can be performed immediately after the signal OSG is set at a low level. In addition, since the node FN1 is precharged to the high level by the transistor MC2 in the normal operation, charge transfer of the node FN1 is not needed in a data saving operation in which the node FN1 is set at the high level. Thus, the circuit BKC10 can complete a saving operation in a short time.

In the data saving operation, the signal CLK is inactive. Although the potential of the signal CLK is at a low level in the example of FIG. 32, the potential of the signal CLK may be at a high level.

[Voltage Scaling in Low-Power Mode]

The PMU 60 performs a voltage scaling operation along with the signal OSC falling. Thus, the memory circuit 190 is transferred to the low-power mode.

[Power Gating in Power-Off Mode]

After a certain period of time from transition to the low-power mode, the PMU 60 performs a power gating operation and the memory circuit 190 is transferred to the power-off mode.

[Power-on Mode]

The PMU 60 returns the memory circuit 190 to the power-on mode in response to an interrupt request. In the example of FIG. 32, when the potential of a power supply line for supplying VDD is stabilized, the signal CLK is set at a high level.

[Data Restoration]

While the signal OSR is at a high level, a data restoration operation is performed. When the signal RESET is set at a high level, the potential of the node NR1 is precharged to the high level ("1"). When the signal OSR is set at a high level, TG5 has high impedance and the transistor MR1 is turned on. The conduction state of the transistor MA1 is determined by the potential of the node FN1. When the node FN1 is at a high level, the transistor MA1 is in a conduction state; thus, the potential of the node NR1 is decreased to the low level ("0"). When the node FN1 is at a low level, the potential of the node NR1 is kept at the high level. In other words, the flip-flop circuit 110 returns to the state before transition to the resting state.

As described above, rising of the signal RESET and the signal OSR enables high-level data to be restored to the node NR1. Thus, the returning operation period of the memory circuit 190 can be shortened.

FIG. 32 shows an example in which the mode is transferred from the power-off mode to the power-on mode. In the case where the mode is transferred from the low-power mode to the power-on mode, a period $T_{on}$ to stabilization of the potential of the power supply line for supplying VDD is shortened. In that case, rising of the signal OSR is preferably made faster than that when the mode is transferred from the power-off mode.

[Normal Operation]

By restarting the supply of the signal CLK, the memory circuit 190 returns to a state in which a normal operation can be performed. When the signal OSG is set at a high level, the node FN1 is precharged to a high level by the circuit PCC10.

<Cache>

An example in which the cache 40 is formed using an SRAM is described.

<Memory Cell Structure Example>

Figure 33:
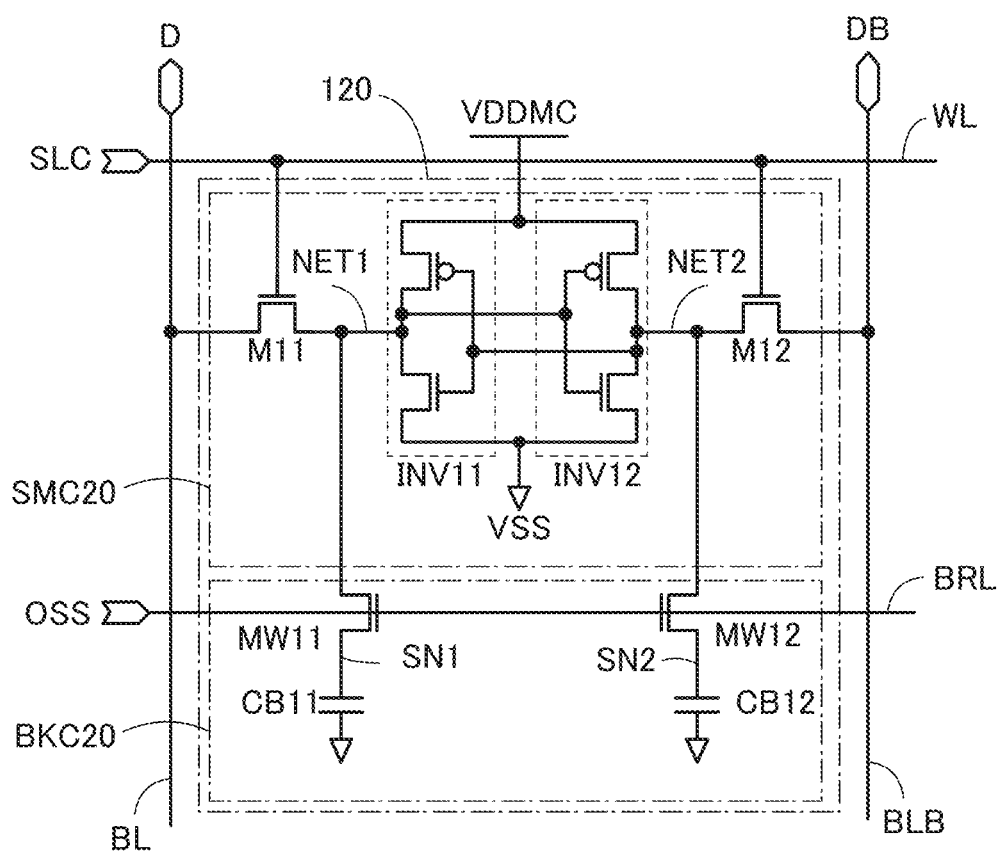
FIG. 33 is a circuit diagram illustrating a cache memory cell structure example.

FIG. 33 illustrates a cache memory cell structure example. A memory cell 120 illustrated in FIG. 33 includes a circuit SMC20 and a circuit BKC20. The circuit SMC20 has a circuit structure similar to that of a standard SRAM memory cell. The circuit SMC20 illustrated in FIG. 33 includes an inverter circuit INV21, an inverter circuit INV22, a transistor M21, and a transistor M22.

The circuit BKC20 functions as a backup circuit of the circuit SMC20. The circuit BKC20 includes a transistor MW11, a transistor MW12, a capacitor CB11, and a capacitor CB12. The transistors MW11 and MW12 are OS transistors. The circuit SMC20 includes two 1T1C retention circuits, and a node SN1 and a node SN2 each retain data. A retention circuit formed using the transistor MW11 and the capacitor CB11 has a function of backing up data of a node NET1. A retention circuit formed using the transistor MW12 and the capacitor CB12 has a function of backing up data of a node NET2.

Power supply potentials VDDMC and VSS are supplied to the memory cell 120. The memory cell 120 is electrically connected to wirings (WL, BL, BLB, and BRL). A signal SLC is input to the wiring WL. A data signal D and a data signal DB are input to the wiring BL and the wiring BLB at the time of data writing. Data is read out by detection of the potentials of the wiring BL and the wiring BLB. A signal OSS is input to the wiring BRL. The signal OSS is input from the PMU 60.

<Operation Example of Memory Cell>

Figure 34:
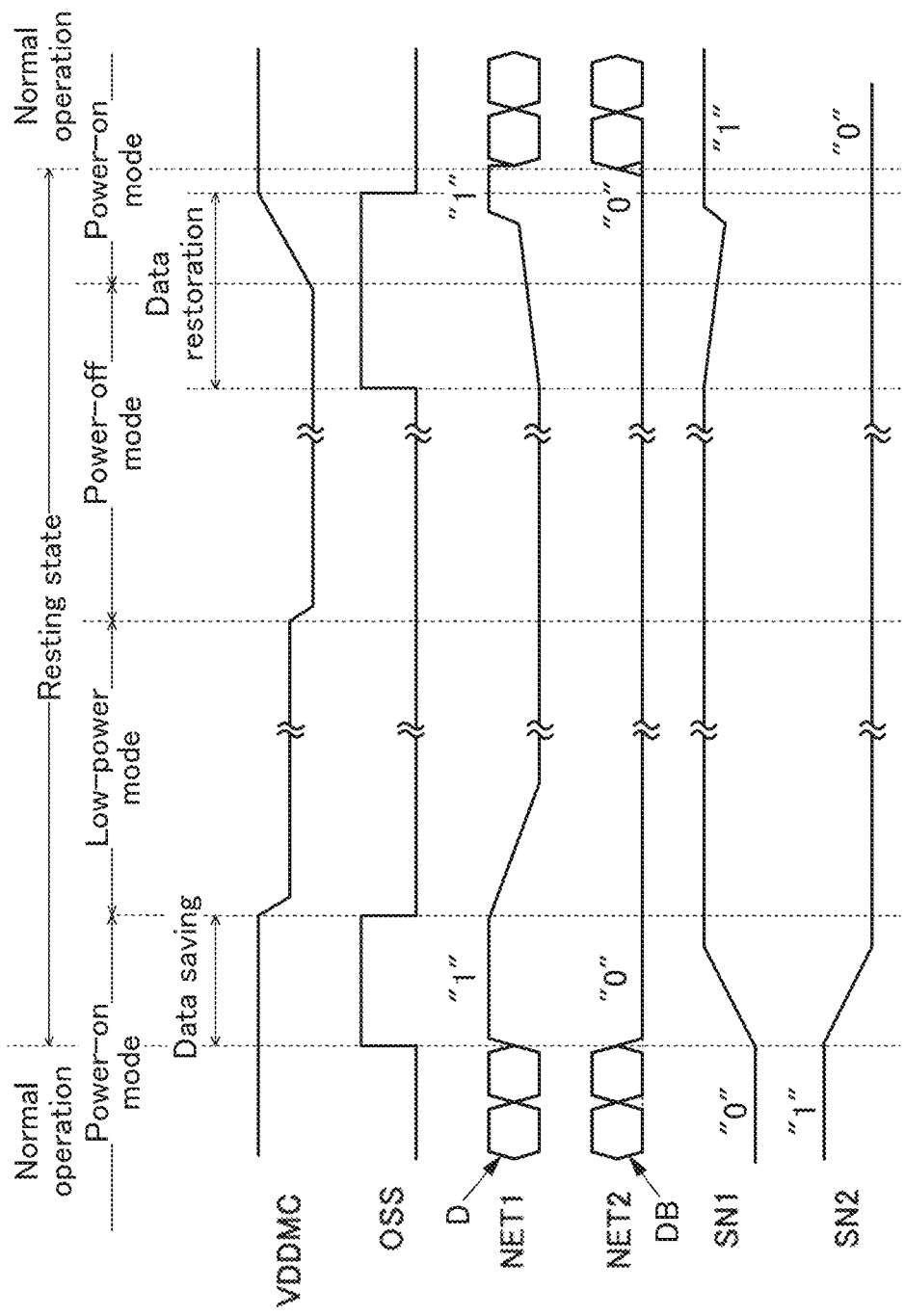
FIG. 34 is a timing chart showing an operation example of a memory cell.

An operation example of the memory cell 120 is described. FIG. 34 is an example of a timing chart for the memory cell 120.

[Normal Operation]

An access request is input to the circuit MemC20, and data is written and read out. In the circuit BKC20, the signal OSS is at a low level; thus, the node SN1 and the node SN2 are electrically floating and data is retained. In the example of FIG. 34, the potential of the node SN1 is at a low level ("0") and the potential of the node SN2 is at a high level ("1").

[Data Saving]

When the signal OSS is at a high level, the transistors MW11 and MW12 are turned on and the nodes SN1 and SN2 have the same potential levels as the nodes NET1 and NET2. In the example of FIG. 34, the potentials of the nodes SN1 and SN2 are set at a high level and a low level, respectively. The signal OSS is set at a low level and the circuit BKC20 retains data, so that a data saving operation is terminated.

[Voltage Scaling in Low-Power Mode]

The PMU 60 performs a voltage scaling operation along with the signal OSS falling. Thus, the cache 40 is transferred to the low-power mode.

[Power Gating in Power-Off Mode]

After a certain period of time from transition to the low-power mode, the PMU 60 performs a power gating operation and the cache 40 is transferred to the power-off mode.

[Data Restoration in Power-on Mode]

The PMU 60 returns the cache 40 to a normal state in response to an interrupt request. The signal OSS is set at a high level to restore data retained in the circuit BKC20 to the circuit SMC20. While the signal OSS is at the high level, the PMU 60 performs a voltage scaling operation and a power gating operation and returns the memory circuit 190 to the power-on mode. In the example of FIG. 32, when the potential of the power supply line for supplying VDD is stabilized, the signal CLK is set at a high level. When the potential of a power supply line for supplying VDDMC is stabilized, the signal OSS is set at a low level to terminate a data restoration operation. The nodes SN1 and SN2 return to the states immediately before the resting states.

[Normal Operation]

When the supply of VDDMC is restarted, the circuit SMC20 returns to a normal mode in which a normal operation can be performed.

As described above, with the use of an OS transistor, a backup circuit capable of retaining data for a long time even when power supply is stopped can be formed. This backup circuit enables power gating of a processor core and a cache. In addition, when power management in which voltage scaling is combined with power gating is performed in a resting state, energy and time overheads due to the return from the resting state to a normal state can be reduced. Thus, power can be reduced efficiently without a decrease in the processing performance of a processing device.

This embodiment can be combined with any of the other embodiments as appropriate.

Embodiment 5

Examples of electronic devices that can include the imaging device of one embodiment of the present invention include display devices, personal computers, image memory devices or image reproducing devices provided with storage media, mobile phones, game machines including portable game machines, portable data terminals, e-book readers, cameras such as video cameras and digital still cameras, goggle-type displays (head mounted displays), navigation systems, audio reproducing devices (car audio players, digital audio players, and the like), copiers, facsimiles, printers, multifunction printers, automated teller machines (ATM), and vending machines. Specific examples of these electronic devices are illustrated in FIG. 35A to FIG. 35F.

Figure 35A:
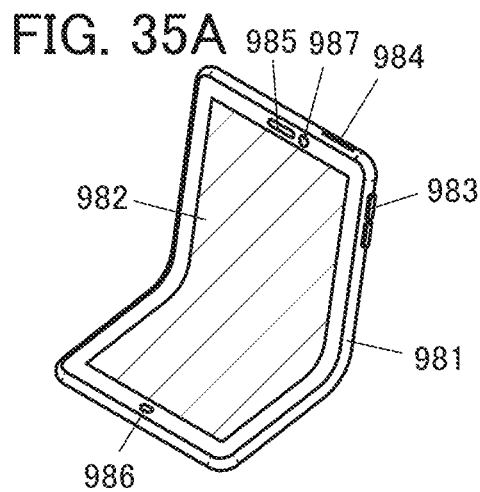
FIG. 35A to FIG. 35F are diagrams illustrating electronic devices.

FIG. 35A is an example of a mobile phone, which includes a housing 981, a display portion 982, an operation button 983, an external connection port 984, a speaker 985, a microphone 986, a camera 987, and the like. The display portion 982 of the mobile phone includes a touch sensor. A variety of operations such as making a call and inputting text can be performed by touch on the display portion 982 with a finger, a stylus, or the like. The imaging device of one embodiment of the present invention and the operation method thereof can be used for the mobile phone.

Figure 35B:
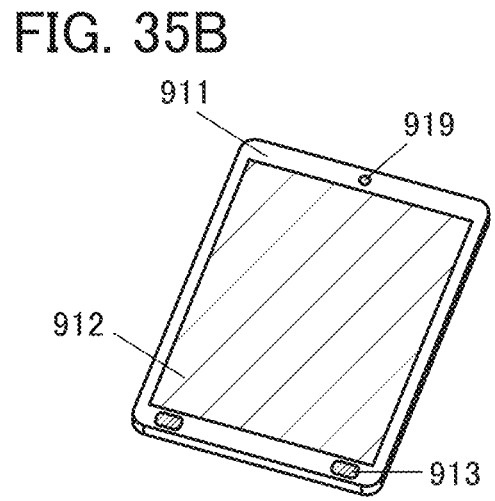

FIG. 35B is a portable data terminal, which includes a housing 911, a display portion 912, a speaker 913, a camera 919, and the like. A touch panel function of the display portion 912 enables input and output of information. Furthermore, a character or the like in an image that is captured by the camera 919 can be recognized and the character can be voice-output from the speaker 913. The imaging device of one embodiment of the present invention and the operation method thereof can be used for the portable data terminal.

Figure 35C:
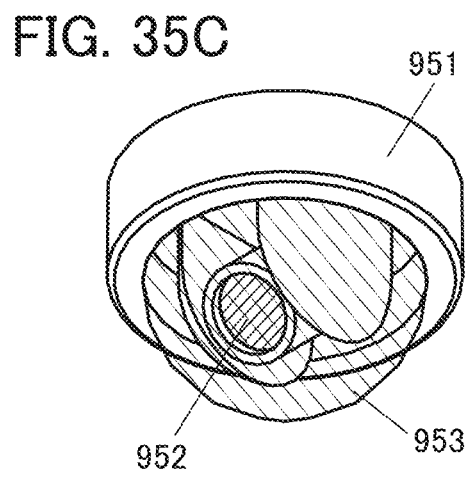

FIG. 35C is a surveillance camera, which includes a support base 951, a camera unit 952, a protection cover 953, and the like. By providing the camera unit 952 provided with a rotating mechanism and the like on a ceiling, an image of all of the surroundings can be taken. The imaging device of one embodiment of the present invention and the operation method thereof can be used for obtaining an image in the camera unit. Note that a surveillance camera is a name in common use and does not limit the use thereof. A device that has a function of a surveillance camera can also be called a camera or a video camera, for example.

Figure 35D:
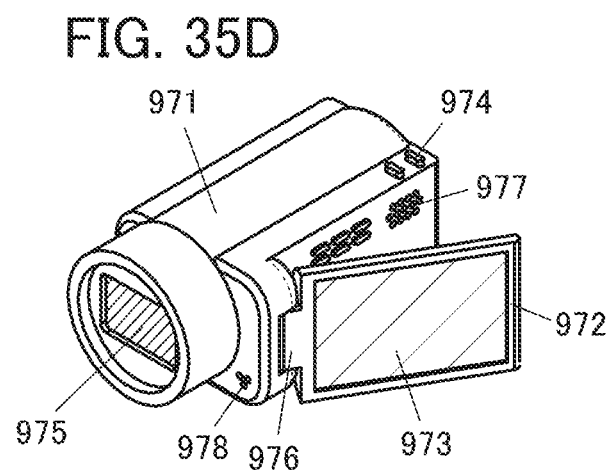

FIG. 35D is a video camera, which includes a first housing 971, a second housing 972, a display portion 973, an operation key 974, a lens 975, a connection portion 976, a speaker 977, a microphone 978, and the like. The operation key 974 and the lens 975 are provided for the first housing 971, and the display portion 973 is provided for the second housing 972. The imaging device of one embodiment of the present invention and the operation method thereof can be used for the video camera.

Figure 35E:
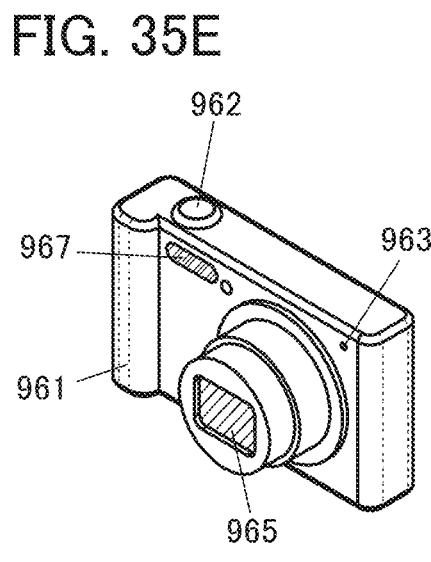

FIG. 35E is a digital camera, which includes a housing 961, a shutter button 962, a microphone 963, a light-emitting portion 967, a lens 965, and the like. The imaging device of one embodiment of the present invention and the operation method thereof can be used for the digital camera.

Figure 35F:
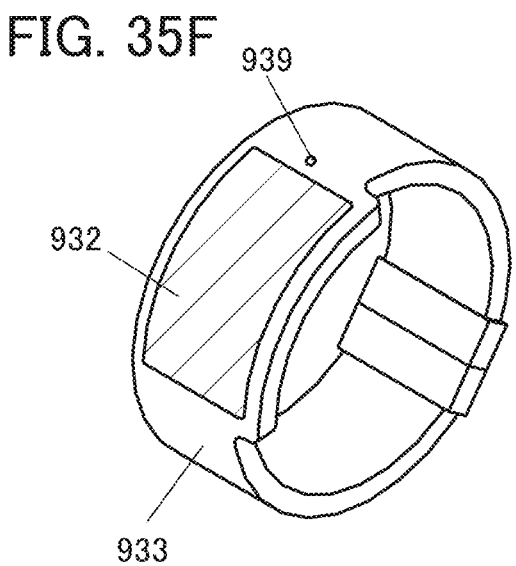

FIG. 35F is a wrist-watch-type information terminal, which includes a display portion 932, a housing and wristband 933, a camera 939, and the like. The display portion 932 is provided with a touch panel for performing the operation of the information terminal. The display portion 932 and the housing and wristband 933 have flexibility and fit a body well. The imaging device of one embodiment of the present invention and the operation method thereof can be used for the information terminal.

This embodiment can be combined with any of the other embodiments as appropriate.

REFERENCE NUMERALS

10: power supply circuit, 12: MW, 20: PU, 21: PU, 30: processor core, 31: memory circuit, 32: circuit, 35: power supply line, 40: cache, 41: memory array, 42: peripheral circuit, 43: control circuit, 45: memory cell, 60: PMU, 61: circuit, 65: clock control circuit, 70: PSW, 71: PSW, 80: terminal, 81: terminal, 82: terminal, 83: terminal, 100: pixel, 101: photoelectric conversion device, 102: transistor, 103: transistor, 104: capacitor, 105: transistor, 106: capacitor, 107: transistor, 108: transistor, 109: transistor, 110: flip-flop circuit, 111: wiring, 112: wiring, 113: wiring, 114: wiring, 115: wiring, 120: memory cell, 121: wiring, 122: wiring, 123: wiring, 124: wiring, 125: wiring, 133: conductive layer, 134: conductive layer, 135: conductive layer, 136: conductive layer, 138: conductive layer, 139: conductive layer, 151: capacitor, 161: transistor, 162: transistor, 163: capacitor, 170: circuit, 180: processor core, 181: control device, 182: program counter, 183: pipeline register, 184: pipeline register, 185: register file, 186: ALU, 187: data bus, 190: memory circuit, 200: pixel block, 201: circuit, 202: capacitor, 203: transistor, 204: transistor, 205: transistor, 206: transistor, 207: resistor, 211: wiring, 212: wiring, 213: wiring, 215: wiring, 216: wiring, 217: wiring, 218: wiring, 219: wiring, 221: wiring, 251: transistor, 252: transistor, 253: transistor, 254: transistor, 300: pixel array, 301: circuit, 302: circuit, 303: circuit, 304: circuit, 305: circuit, 311: wiring, 312: row driver, 313: column driver, 320: memory cell, 321: memory circuit, 321*a*: memory cell, 321*a*A: memory cell, 321*a*B: memory cell, 321*a*C: memory cell, 321*a*D: memory cell, 325: reference memory cell, 330: circuit, 350: circuit, 360: circuit, 370: circuit, 410: package substrate, 411: package substrate, 420: cover glass, 421: lens cover, 430: adhesive, 435: lens, 440: bump, 441: land, 450: image sensor chip, 451: image sensor chip, 460: electrode pad, 461: electrode pad, 470: wire, 471: wire, 490: IC chip, 535: back gate, 545: semiconductor layer, 546: insulating layer, 560: layer, 561: layer, 562: layer, 562*a*: layer, 562*b*: layer, 563: layer, 563*a*: layer, 563*b*: layer, 563*c*: layer, 565*a*: layer, 565*b*: layer, 566*a*: layer, 566*b*: layer, 566*c*: layer, 566*d*: layer, 567*a*: layer, 567*b*: layer, 567*c*: layer, 567*d*: layer, 567*e*: layer, 611: silicon substrate, 612: insulating layer, 613: insulating layer, 614: insulating layer, 615: insulating layer, 616: insulating layer, 617: insulating layer, 618: insulating layer, 619: conductive layer, 621: insulating layer, 622: insulating layer, 623: insulating layer, 624: insulating layer, 625: insulating layer, 626: insulating layer, 627: conductive layer, 628: insulating layer, 629: insulating layer, 631: insulating layer, 632: silicon substrate, 633: insulating layer, 634: insulating layer, 635: insulating layer, 636: conductive layer, 637: insulating layer, 638: insulating layer, 639: conductive layer, 641: insulating layer, 642: insulating layer, 643: insulating layer, 644: insulating layer, 645: insulating layer, 646: conductive layer, 647: insulating layer, 648: insulating layer, 651: insulating layer, 652: insulating layer, 653: insulating layer, 654: insulating layer, 655: conductive layer, 661: insulating layer, 662: insulating layer, 664: insulating layer, 665: insulating layer, 671: light-blocking layer, 672: optical conversion layer, 673: microlens array, 701: gate electrode, 702: gate insulating film, 703: source region, 704: drain region, 705: source electrode, 706: drain electrode, 707: oxide semiconductor layer, 911: housing, 912: display portion, 913: speaker, 919: camera, 932: display portion, 933: housing and wristband, 939: camera, 951: support base, 952: camera unit, 953: protection cover, 961: housing, 962: shutter button, 963: microphone, 965: lens, 967: light-emitting portion, 971: housing, 972: housing, 973: display portion, 974: operation key, 975: lens, 976: connection portion, 977: speaker, 978: microphone, 981: housing, 982: display portion, 983: operation button, 984: external connection port, 985: speaker, 986: microphone, 987: camera

The invention claimed is:

1. An imaging device comprising:
a pixel, a first circuit, and a second circuit,
wherein the first circuit is configured to supply a first potential to the pixel,
wherein the pixel is configured to obtain first data and second data,
wherein the pixel is configured to generate third data that is a difference between the first data and the second data,
wherein the pixel is configured to generate fourth data by adding a potential based on the first potential to the third data, and
wherein the second circuit is configured to generate fifth data corresponding to a difference between the third data output from the pixel and the fourth data output from the pixel.

2. The imaging device according to claim 1,
wherein the pixel comprises a photoelectric conversion device, a first transistor, a second transistor, a third transistor, a fourth transistor, a fifth transistor, a sixth transistor, a first capacitor, and a second capacitor,
wherein one electrode of the photoelectric conversion device is electrically connected to one of a source and a drain of the first transistor,
wherein the other of the source and the drain of the first transistor is electrically connected to one of a source and a drain of the second transistor and one electrode of the first capacitor,
wherein the other electrode of the first capacitor is electrically connected to one of a source and a drain of the third transistor, one electrode of the second capacitor, and a gate of the fourth transistor,
wherein one of a source and a drain of the fourth transistor is electrically connected to one of a source and a drain of the fifth transistor,
wherein the other electrode of the second capacitor is electrically connected to one of a source and a drain of the sixth transistor,
wherein the other of the source and the drain of the fifth transistor is electrically connected to the second circuit, and
wherein the other of the source and the drain of the sixth transistor is electrically connected to the first circuit.

3. The imaging device according to claim 1,
wherein the second circuit is a correlated double sampling circuit.

4. The imaging device according to claim 2,
wherein a channel formation region of each of the first transistor, the second transistor, the third transistor, the fourth transistor, the fifth transistor and the sixth transistor each comprises a metal oxide, and
wherein the metal oxide comprises indium, gallium, and zinc.

5. An imaging device comprising:
a plurality of pixels, a first circuit, and a second circuit,
wherein the first circuit is configured to supply a first potential to the plurality of pixels,
wherein the plurality of pixels are each configured to obtain first data and second data,
wherein the plurality of pixels are each configured to generate third data that is a difference between the first data and the second data,
wherein the plurality of pixels are each configured to generate fourth data by adding a potential based on the first potential to the third data, and
wherein the second circuit is configured to generate fifth data corresponding to a difference between a sum of the third data output from the plurality of pixels and a sum of the fourth data output from the plurality of pixels.

6. The imaging device according to claim 5,
wherein each of the plurality of pixels comprises a photoelectric conversion device, a first transistor, a second transistor, a third transistor, a fourth transistor, a fifth transistor, a sixth transistor, a first capacitor, and a second capacitor,
wherein one electrode of the photoelectric conversion device is electrically connected to one of a source and a drain of the first transistor,
wherein the other of the source and the drain of the first transistor is electrically connected to one of a source and a drain of the second transistor and one electrode of the first capacitor,
wherein the other electrode of the first capacitor is electrically connected to one of a source and a drain of the third transistor, one electrode of the second capacitor, and a gate of the fourth transistor,
wherein one of a source and a drain of the fourth transistor is electrically connected to one of a source and a drain of the fifth transistor,
wherein the other electrode of the second capacitor is electrically connected to one of a source and a drain of the sixth transistor,
wherein the other of the source and the drain of the fifth transistor is electrically connected to the second circuit, and
wherein the other of the source and the drain of the sixth transistor is electrically connected to the first circuit.

7. The imaging device according to claim 5,
wherein the second circuit is a correlated double sampling circuit.

8. The imaging device according to claim 6,
wherein a channel formation region of each of the first transistor, the second transistor, the third transistor, the fourth transistor, the fifth transistor and the sixth transistor each comprises a metal oxide, and
wherein the metal oxide comprises indium, gallium, and zinc.

* * * * *